(12) United States Patent
Mizushima et al.

(10) Patent No.: US 11,777,006 B2
(45) Date of Patent: Oct. 3, 2023

(54) NONVOLATILE MEMORY DEVICE

(71) Applicant: KABUSHIKI KAISHA TOSHIBA, Tokyo (JP)

(72) Inventors: Koichi Mizushima, Kamakura Kanagawa (JP); Takao Marukame, Tokyo (JP); Yoshifumi Nishi, Yokohama Kanagawa (JP); Kumiko Nomura, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 17/446,441

(22) Filed: Aug. 30, 2021

(65) Prior Publication Data
US 2022/0271135 A1  Aug. 25, 2022

(30) Foreign Application Priority Data

Feb. 24, 2021 (JP) .................................. 2021-027667

(51) Int. Cl.
*H01L 29/423* (2006.01)
*H01L 29/788* (2006.01)
(Continued)

(52) U.S. Cl.
CPC ....... *H01L 29/42324* (2013.01); *G06N 3/008* (2013.01); *G06N 3/08* (2013.01);
(Continued)

(58) Field of Classification Search
CPC ........................ H01L 45/085; H01L 45/1206
See application file for complete search history.

(56) References Cited

U.S. PATENT DOCUMENTS 5,172,204 A   12/1992  Hartstein
8,093,575 B2   1/2012  Xia et al.
(Continued)

FOREIGN PATENT DOCUMENTS

JP       2014-7496 A     1/2014
JP     2018-120433 A     8/2018
(Continued)

OTHER PUBLICATIONS

Tkatsuna Umamoto, "A multi-value memory element of the total solids lithium battery application is developed",[online],Nov. 29, 2019, EE, TimesJapan,<URL:https://eetimes.jp/ee/articles/1911/27/news032.html>.

(Continued)

*Primary Examiner* — Xiaoming Liu
(74) *Attorney, Agent, or Firm* — Finnegan, Henderson, Farabow, Garrett & Dunner, LLP

(57) ABSTRACT

In a gate electrode of a nonvolatile memory device of an embodiment, a tunnel insulating film covers a channel region. A first current collector file is disposed on the side opposite to the channel region with respect to the tunnel insulating film. An ion conductor film is disposed between the tunnel insulating film and the first current collector film. A first electrode film is disposed between the tunnel insulating film and the ion conductor film. The first electrode film is in contact with the ion conductor film. A second electrode film is disposed between the ion conductor film and the first current collector film. The second electrode film is in contact with the ion conductor film. A second current collector film is disposed between the tunnel insulating film and the second electrode film.

17 Claims, 30 Drawing Sheets

(51) Int. Cl.
*H01L 21/28* (2006.01)
*G06N 3/008* (2023.01)
*G06N 3/08* (2023.01)
*H01L 29/66* (2006.01)
*H10B 41/30* (2023.01)

(52) U.S. Cl.
CPC .. *H01L 29/40114* (2019.08); *H01L 29/66825* (2013.01); *H01L 29/7883* (2013.01); *H10B 41/30* (2023.02)

(56) References Cited

U.S. PATENT DOCUMENTS

| | | | |
|---|---|---|---|
| 10,083,974 B1 * | 9/2018 | Huang | H01L 27/10802 |
| 10,175,947 B1 | 1/2019 | Marukame et al. | |
| 10,192,161 B1 | 1/2019 | Khan et al. | |
| 10,467,524 B1 | 11/2019 | Todorov et al. | |
| 2012/0280224 A1 | 11/2012 | Doolittle et al. | |
| 2013/0346825 A1 | 12/2013 | Marukame et al. | |
| 2014/0160852 A1 | 6/2014 | Lee et al. | |
| 2015/0028278 A1 * | 1/2015 | Lee | H01L 29/512 257/2 |
| 2018/0211154 A1 | 7/2018 | Mori et al. | |
| 2018/0277552 A1 | 9/2018 | Huang et al. | |
| 2019/0156181 A1 | 5/2019 | Marukame et al. | |
| 2019/0214080 A1 | 7/2019 | Li et al. | |
| 2020/0026496 A1 | 1/2020 | Marukame et al. | |
| 2020/0034695 A1 | 1/2020 | Marukame et al. | |
| 2020/0293861 A1 | 9/2020 | Marukame et al. | |
| 2020/0302274 A1 | 9/2020 | Marukame et al. | |
| 2020/0302275 A1 | 9/2020 | Nomura et al. | |
| 2020/0379733 A1 | 12/2020 | Berdan et al. | |
| 2020/0380347 A1 | 12/2020 | Marukame et al. | |
| 2021/0056383 A1 | 2/2021 | Nishi et al. | |
| 2021/0081771 A1 | 3/2021 | Marukame et al. | |

FOREIGN PATENT DOCUMENTS

| | | |
|---|---|---|
| JP | 2019-53563 A | 4/2019 |
| JP | 2019-95860 A | 6/2019 |
| JP | 2020-13398 A | 1/2020 |
| JP | 2020-17114 A | 1/2020 |
| JP | 2020-149625 A | 9/2020 |
| JP | 2020-197761 A | 12/2020 |
| JP | 2020-197922 A | 12/2020 |
| JP | 2021-33415 A | 3/2021 |
| JP | 2021-47530 A | 3/2021 |
| KR | 10-2005-0069189 A | 7/2005 |

OTHER PUBLICATIONS

Elliot J. Fuller et al., "Li-Ion Synaptic Transistor for Low Power Analog Computing," Advanced Materials, vol. 29, Issue 4, Jan. 25, 2017.

Eisuke Tokumitsu et al., "Nonvolatile ferroelectric-gate field-effect transistors using SrBi2Ta2O9/Pt/SrTa2O6/SiON/Si structures," Applied Physics Letters, vol. 75, No. 4, pp. 575-577 (1999).

Elliot J. Fuller et al., "Li-Ion Synaptic Transistor for Low Power Analog Computing," Advanced Materials, vol. 29, No. 4, 1604310, 8 pages (2016).

Chang-Hyun Kim et al., "synaptic organic transistors with a vacuum-deposited charge-trapping nanosheet," Scientific Reports, vol. 6:33355, 8 pages (2016).

Changbai Long et al., "High Oxide Ion Conductivity in Layer-structured Bi4Ti3O12-based Ferroelectric Ceramics," J. Mater. Chem. C, vol. 7, pp. 8825-8835 (2019).

* cited by examiner

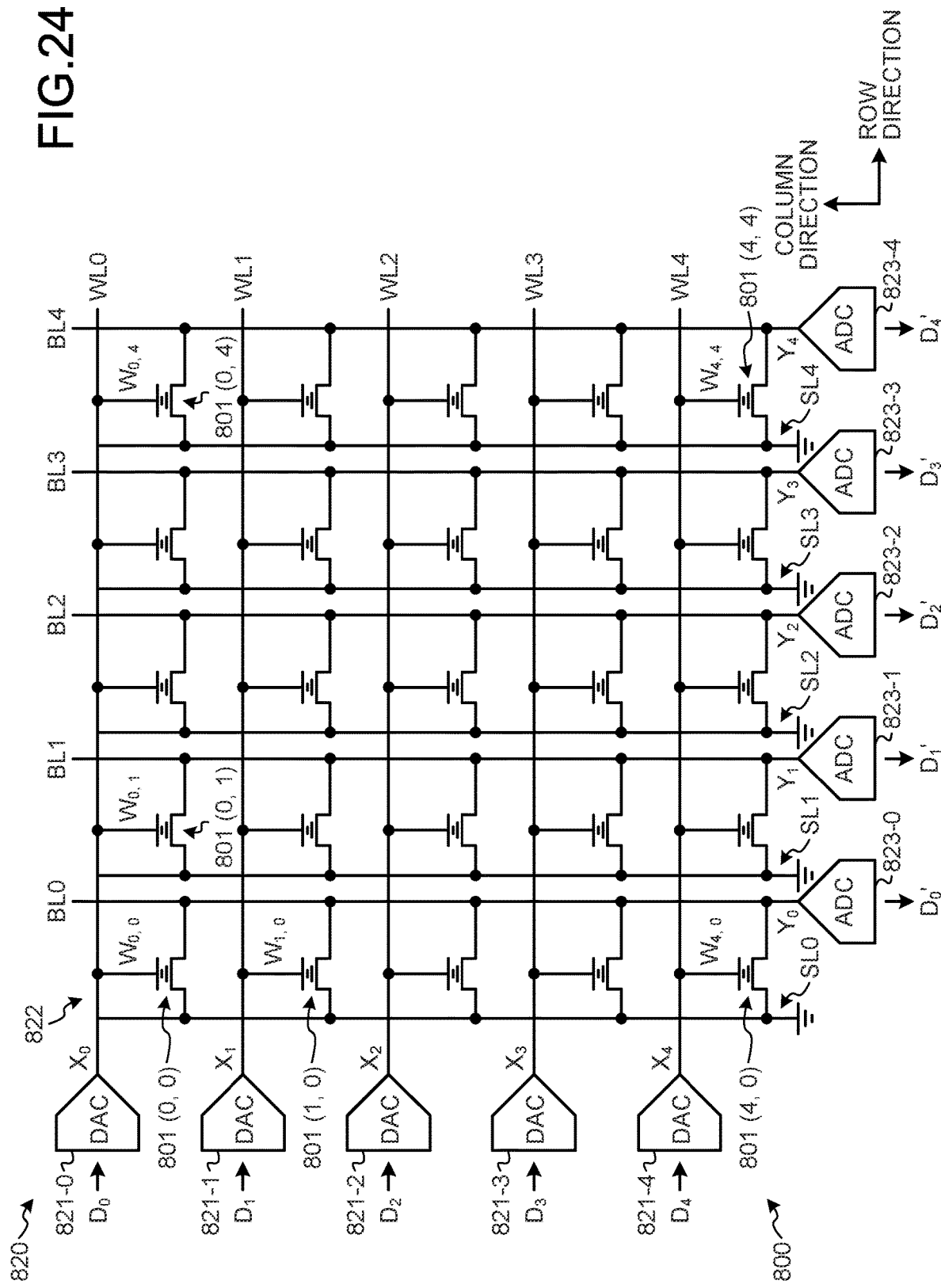

NONVOLATILE MEMORY DEVICE

CROSS-REFERENCE TO RELATED APPLICATIONS

This application is based upon and claims the benefit of priority from Japanese Patent Application No. 2021-027667, filed on Feb. 24, 2021; the entire contents of which are incorporated herein by reference.

FIELD

Embodiments described herein relate generally to a nonvolatile memory device.

BACKGROUND

Deep learning technology using neural network has been known. Deep learning technology using specialized hardware has also been studied. In addition, a neuromorphic neural network that imitates the human brain, i.e., a brain-type neural network, has been known. The brain-type neural network is a neural network that imitates the human brain, which operates at low energy consumption and is error tolerant.

BRIEF DESCRIPTION OF THE DRAWINGS

FIG. 24 is a circuit diagram illustrating a nonvolatile memory device according to an eighth embodiment.

DETAILED DESCRIPTION

Figure 1:
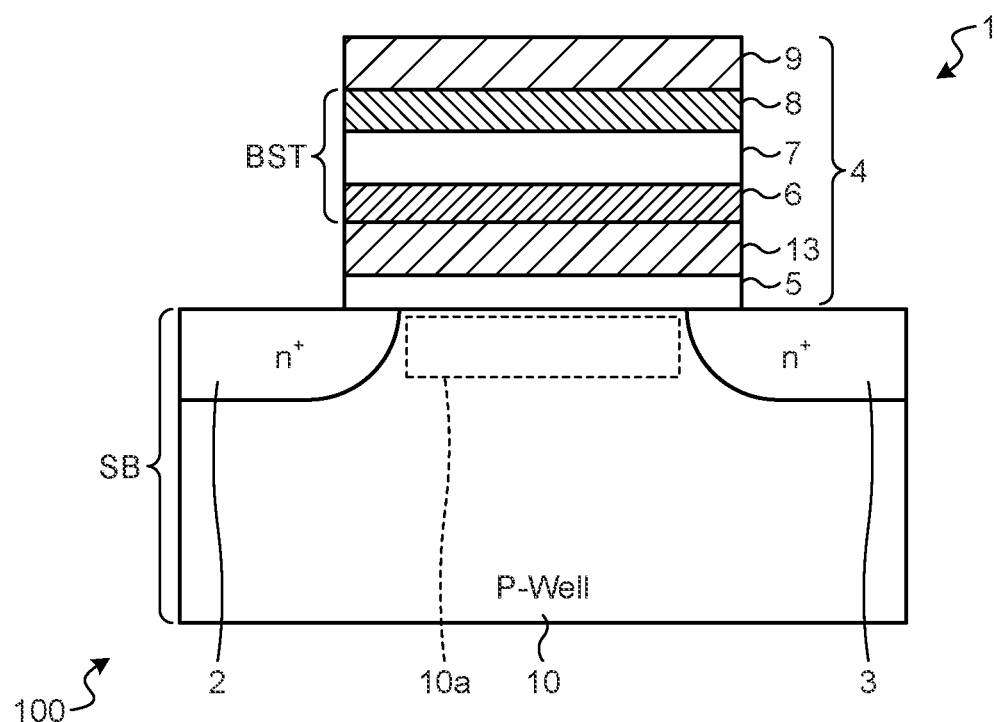
FIG. 1 is a diagram illustrating a transistor according to a first embodiment.

In general, according to one embodiment, there is provided a nonvolatile memory device including a plurality of transistors. Each of the plurality of transistors is of a field effect type and has a gate electrode and a channel region. The gate electrode includes a tunnel insulating film, a first current collector film, an ion conductor film, a first electrode film, a second electrode film, and a second current collector film. The tunnel insulating film covers the channel region. The first current collector film is disposed on a side opposite to the channel region with respect to the tunnel insulating film. The ion conductor film is disposed between the tunnel insulating film and the first current collector film. The first electrode film is disposed between the tunnel insulating film and the ion conductor film and in contact with the ion conductor film. The second electrode film is disposed between the ion conductor film and the first current collector film and in contact with the ion conductor film. The second current collector film is disposed between the tunnel insulating film and the second. electrode film.

Exemplary embodiments of a nonvolatile memory device will be explained below in detail with reference to the accompanying drawings. The present invention is not limited to the following embodiments.

First Embodiment

The nonvolatile memory device according to the present embodiment can store analog information in a nonvolatile manner and can be applied to a neural network.

Deep learning technology using neural network has been known. Deep learning technology using specialized hardware has also been studied. In addition, a neuromorphic neural network that imitates the human brain, i.e., a brain-type neural network, has been known. The brain-type neural network is a neural network that imitates the human brain, which operates at low energy consumption and is error tolerant.

Each unit included in the neural network performs a product-sum operation (multiply-accumulate operation). In other words, each unit multiplies each of a plurality of input signals received from a unit at the preceding stage by a coefficient, and adds the plurality of input signals after multiplying by the coefficient. Further, each unit gives the value thus calculated to the activation function. Each unit then outputs an of value of the activation function.

The neural network device implemented in hardware preferably includes many such units. Therefore, when the neural network is implemented in hardware, arithmetic processing in individual units is desirably implemented in a simple configuration. In particular, the memory for storing the coefficients is desirable to be a long-term storage and highly accurate storage device.

In the brain-type neural network field, a configuration has been proposed in which various nonvolatile memory devices capable of storing analog information in a nonvolatile manner, such as ReRAM, are used as a synaptic memory. Examples of nonvolatile memory devices include ReRAM, FeRAM, and PCRAM. These nonvolatile memory devices have a plurality of transistors, but have problems to be solved such as large variations in characteristics among the plurality of transistors, low storage accuracy, and large power consumption.

Therefore, in the present embodiment, each transistor in the nonvolatile memory device is formed of a field effect type, and its gate electrode includes a layer configuration of a thin-film secondary battery, thereby aiming at high accuracy and low power consumption of the nonvolatile memory device.

Specifically, the nonvolatile memory device has a plurality of transistors, each of which is formed of a field effect type. The gate electrode of the transistor includes a layer configuration (battery structure) of a thin-film secondary battery corresponding to an all-solid-state battery. The gate electrode, which is stacked by a plurality of films, includes a second current collector film, a first electrode film, an ion conductor film, and a second electrode film between a tunnel insulating film and a first current collector film in the stacking direction. The tunnel insulating film is disposed on a substrate. The first electrode film is disposed between the tunnel insulating film and the ion conductor film in the stacking direction and in contact with the ion conductor film. The second electrode film is disposed between the ion conductor film and the first current collector film in the stacking direction and in contact. with the ion conductor film. The second current collector film is disposed between the tunnel insulating film and the second electrode film in the stacking direction. In the transistor, ions move between the first electrode film and the second electrode film via the ion conductor film in response to the transfer or charges from the substrate to the first electrode film via the tunnel insulating film and the second current collector film. The electromotive force of the thin-film secondary battery changes according to the amount of the moving ions. Thus, the transistor, which is capable of storing continuous analog information by the battery electromotive force, can express a synaptic weight by the analog information, and thus can express the synaptic weight with high accuracy. The transistor, which does not include a double capacitor type structure in the gate electrode, can write information with a small voltage and current, and thus can easily reduce power consumption. Therefore, the nonvolatile memory device can achieve high accuracy and low power consumption.

The transistor can store continuous analog information by the battery electromotive force, and thus can reduce variation in characteristics and implement a sufficient storage time. The readout of the analog information from the transistor is performed by detecting the on-resistance corresponding to the drain current, thereby enabling to provide a nonvolatile memory device having good matching with many neural network circuits using ReRAM.

A nonvolatile memory device 100 has a transistor 1 capable of storing, for example, analog information and a control circuit (not illustrated) for controlling the transistor 1. The transistor 1 may be constituted as illustrated in FIG. 1. FIG. 1 is a diagram illustrating the transistor 1.

The transistor 1 is of a field effect type and has a source electrode 2, a drain electrode 3, and a gate electrode 4. For example, the source electrode 2 and the drain electrode 3 are disposed near the surface in the substrate SB, and the gate electrode 4 is disposed on the substrate SB. Although an interlayer insulating film is disposed around the gate electrode 4 above the substrate SB, the interlayer insulating film is omitted in FIG. 1 for the sake of simplicity.

The source electrode 2 and the gate electrode 4 are formed as semiconductor regions of a first conductivity type, and can be formed as semiconductor regions disposed near the surface of the substrate SB. The source electrode 2 and the gate electrode 4 are separated from each other via a well region 10 in the substrate SB. The well region 10 is formed as a semiconductor region of a second conductivity type. The second conductivity type is the opposite conductivity type of the first conductivity type. The source electrode 2 and the drain electrode 3 contain a first conductivity type impurity, and the well region 10 contains a second conductivity type impurity. The concentration of the first conductivity type impurity in the source electrode 2 and the drain electrode 3 is higher than the concentration of the second conductivity type impurity in the well region 10. If the first conductivity type is n-type, the first conductivity type impurity may be a donor such as phosphorus or arsenic. If the second conductivity type is p-type, the second conductivity type impurity may be an acceptor such as boron.

In the well region 10, the region between the source electrode 2 and the gate electrode 4 in the direction along the surface of the substrate SB constitutes a channel region 10*a*. The channel region 10*a* is a region where a channel is to be formed when a voltage is applied to the gate electrode 4 and/or the well region 10.

The gate electrode 4 is disposed on the substrate SB at a position between the source electrode 2 and the drain electrode 3 in the planar direction, i.e., at a position mainly covering the channel region 10*a*. The gate electrode 4 may have a processing dimension of about 100 nm in the planar direction. The gate electrode 4 is formed as a stacked film in which. a plurality of films is stacked For example, the gate electrode 4 has a tunnel insulating film 5, a current collector film 13, an electrode film 6, an ion conductor film 7, an electrode film 8, and a current collector film 9 stacked in order from the substrate SB side.

The tunnel insulating film 5 is disposed closest to the substrate SB side in the gate electrode 4 and covers the channel region 10*a*. Note that in the present description, it is assumed that the term "covering" includes not only the case of covering entirely but also the case of covering partially. The tunnel insulating film 5 is disposed between the substrate SB and the electrode film 6 in the stacking direction. The tunnel insulating film 5 can be formed of an insulating film such as a silicon oxide film. When the tunnel insulating film 5 is formed of silicon oxide, the thickness of the tunnel insulating film may be about 8 nm. When the tunnel insulating film 5 is formed of another insulating material, the thickness of the tunnel insulating film may be about 8 nm in terms of the thickness of the silicon oxide film. Thus, non-volatility of electrons to be accumulated in the electrode film 6 can be secured.

The current collector film 9 disposed on the side opposite to the substrate SB with respect to a battery structure BST. The current collector film 9 can function as a control electrode to which a gate voltage is supplied. The current collector film 9 can be formed of a material mainly composed of a conductive material. The current collector film 9 may be formed of an Au film or a stacked film of Au/Ti.

The current collector film 13 is disposed on the substrate SB side with respect to the battery structure BST. The current collector film 13 can be formed of a material mainly composed of a conductive material. The current collector film 9 can be formed of a metal such as Pt, Au, or Li, or a non-metal conductive material such as carbon. The current collector film 9 may be formed of an Au film or a stacked film of Au/Ti.

Among the plurality of films stacked in the gate electrode 4, the electrode film 6, the ion conductor film 7, and the electrode film 8 function as a positive electrode, a solid electrolyte, and a negative electrode of an all-solid-state secondary battery, respectively. In other words, the electrode film (first electrode film) 6 functions as a positive electrode to the ion conductor film 7. The electrode film (second electrode film) 8 functions as a negative electrode to the ion conductor film 7. A battery structure of a positive electrode, a solid electrolyte and a negative electrode is constituted of a film in which the electrode film 6, the ion conductor film 7 and the electrode film 8 are stacked. The battery structure can be, for example, the structure of a lithium battery.

The electrode film 6 is disposed between the tunnel insulating film 5 and the current collector film 9 in the stacking direction, and between the tunnel insulating film 5 and the ion conductor film 7 in the stacking direction. The electrode film 6 is in contact with the surface of the ion conductor film 7 on the substrate SB side. The electrode film 6 is formed of a material containing ions to be conducted in the ion conductor film 7, and can be formed of $Li_{1-x}CoO_2$, for example, if the ions to be conducted in the ion conductor film 7 are lithium ions Li+. The electrode film 6 may have a thickness of about 1 nm. x is a composition parameter.

The electrode film 8 is disposed between the tunnel insulating film 5 and the current collector film 9 in the stacking direction, and is disposed between the ion conductor film 7 and the current collector film 9 in the stacking direction. The electrode film 8 is in contact with the surface of the ion conductor film 7 opposite to the substrate SB. The electrode film 8 is formed of a material containing ions to be conducted in the ion conductor film 7, and can be formed of $Li_xTiO_2$, for example, if the ions to be conducted in the ion conductor film 7 are lithium ions Li+. The electrode film 8 may have a thickness of about 1 nm. x is a composition parameter, which is the same as the composition parameter x of the electrode film 6. In other words, when Li+ moves from the electrode film 6 to the electrode film 8, the value of x increases accordingly. When Li+ moves from the electrode film 8 to the electrode film 6, the value of x decreases accordingly.

The ion conductor film 7 is disposed between the tunnel insulating film 5 and the current collector film 9 in the stacking direction, and is disposed between the electrode film 6 and the electrode film 8. The ion conductor film 7 is formed of a solid electrolyte capable of conducting ions to be conducted, and can be formed of $Li_3PO_4$ if the ions to be conducted are lithium ions Li+. The ion conductor film 7 may have a thickness of about 20 nm. The ion conductor film 7 is a conductor for ions to be conducted and an insulator for electrons. Thus, when electrons are held from the substrate SB to the electrode film 6 via the tunnel insulating film 5, the electrode film 6 can hold the electrons in a nonvolatile manner.

The transistor 1 can reduce the amount of ion movement between the electrode film 6 and the electrode film 8 per unit gate voltage by reducing the film thickness of the electrode film 6 and the film thickness of the electrode film 8 of the battery structure (the electrode film 6, the ion conductor film 7, and the electrode film 8) included in the gate electrode 4. For example, as illustrated in FIG. 1, the electrode film 6 is thinner than the ion conductor film 7, and the electrode film 8 is thinner than the ion conductor film 7. Thus, the change of the battery electromotive force can be reduced, and the analog information to be written can be made highly accurate.

Figure 2:
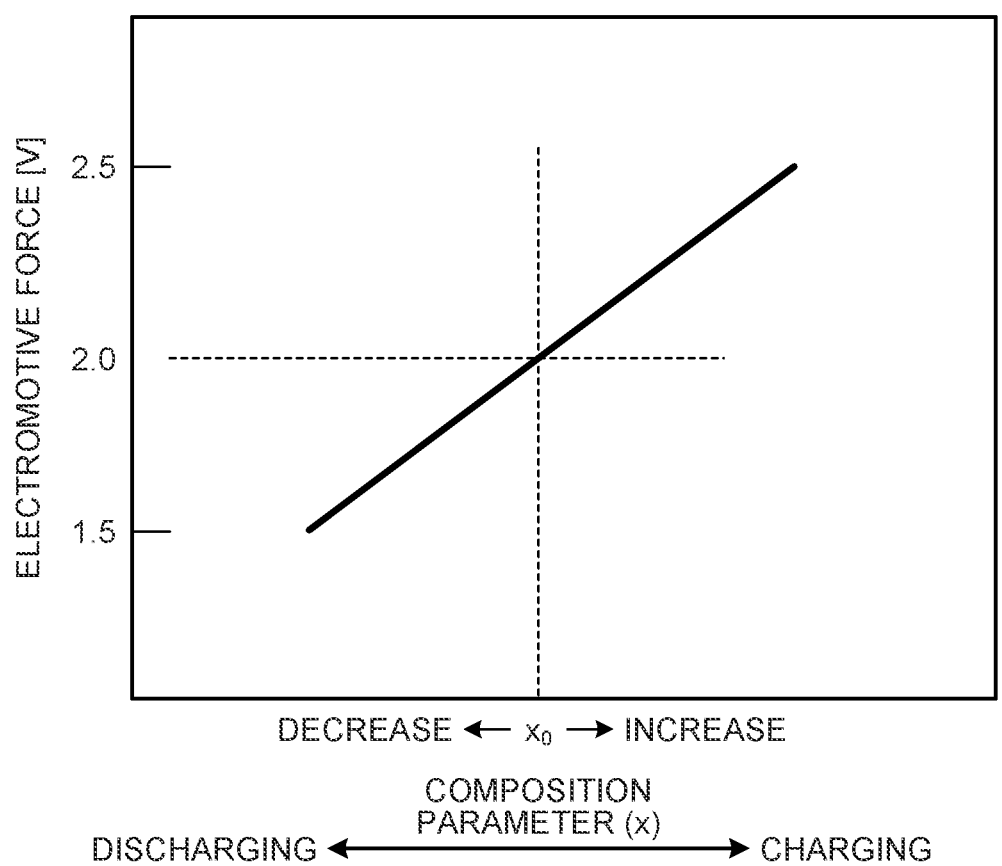
FIG. 2 is a diagram illustrating storage characteristics of analog information.

For example, in the case of the electrode film 6 having a thickness of 1 nm (volume 100 nm×100 nm×1 nm=$1\times10^{-17}$ cm$^3$) and formed of $Li_{1-x}CoO_2$, since the molar volume of $Li_{1-x}CoO_2$ is 6.5 cm$^3$, the number of moles of the electrode film 6 is $1.54\times10^{-18}$ moles. If the memory content is rewritten by a current pulse having a current value of 1.5 pA and a pulse width of 200 µs, the composition change Δx of the electrode film 6 caused by charge injection of 1.5 pA×200 µs=0.3 fC and the electromotive force change ΔV assuming the characteristics of FIG. 2 are 0.002 and 0.004 V, respectively, which are extremely small. In order to change the battery voltage by about 0.01 to 0.1 V in 1 pulse (1.5 pA, 200 µs), the effective film thickness of the electrode film 6 (to the effective film thickness of the electrode film 8) can be reduced to 0.04 to 0.4 nm.

In such a case, in the gate electrode 4 of the transistor 1, since the current collector film 13 has conductivity, the interface of the current collector film 13 with the electrode film 6 can be an equipotential surface, and a contact potential difference can be formed at the interface of the current collector film 13 with the electrode film 6. The contact potential difference can be formed such that the potential of the electrode film 6 is lower than the potential of the current collector film 13 with respect to electrons. Thus, the spatial deviation of the ion current and the tunneling current between the ion conductor film 7 and the electrode film 6 can be reduced, and when the electrons are drawn into the current collector film 13, the electrons can be efficiently guided to the electrode film 6.

Note that in order to improve the adhesion between the current collector film 13 formed of, for example, a metal and the electrode film 6 formed of, for example, an oxide or a compound, the current collector film 13 may be, for example, an Au/Cr multilayer film or an Au/Ti multilayer film instead of Au.

FIG. 2 illustrates a schematic relationship between the composition parameter x and the electromotive force of the battery structure (the electrode film 6, the ion conductor film 7, and the electrode film 8) of the secondary battery illustrated in FIG. 1. When lithium ions Li+ move from the electrode film 6 to the ion conductor film 7 to the electrode film 8 by charging, the composition parameter x increases and the electromotive force increases. On the other hand, when lithium ions Li+ move from the electrode film 8 to the ion conductor film 7 to the electrode film 6 by discharging, the composition parameter x decreases and the electromotive force decreases.

As illustrated in FIG. 2, transistor 1 can store continuous analog information as the level of the battery electromotive force. The transistor utilizes the fact that the electromotive force of the battery structure formed by a film in which the electrode film 6, the ion conductor film 7, and the electrode film 8 are stacked is changed by charging and discharging.

Figure 3A:
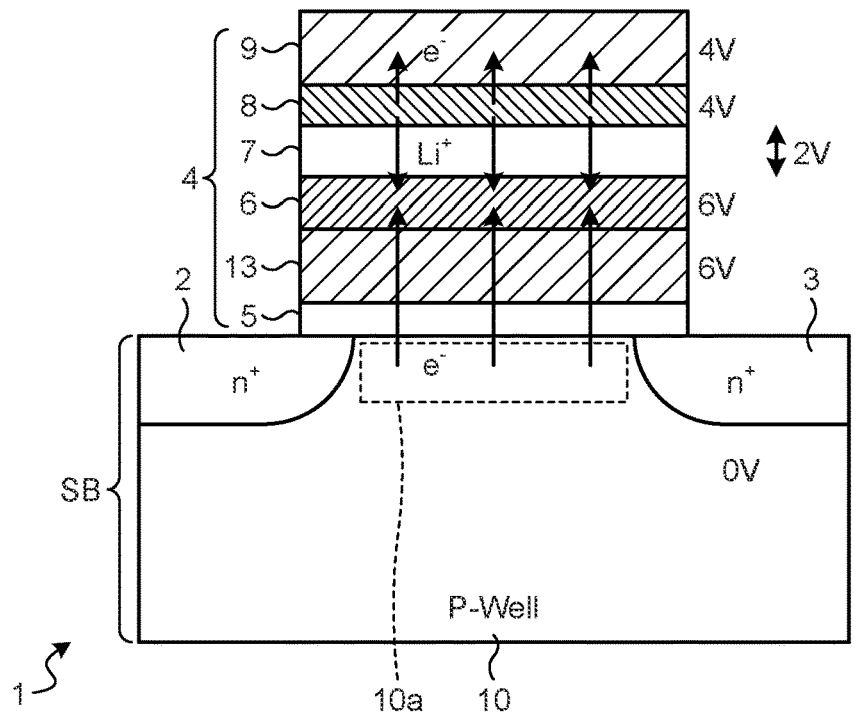
FIG. 3A is a diagram illustrating writing (discharging) to a transistor.

For example, the transistor 1 performs a writing, operation accompanied by a discharging operation of the battery structure as illustrated in FIG. 3A. FIG. 3A illustrates a case where a current flows in a direction from the gate electrode 4 toward the semiconductor substrate SB to discharge the battery structure (the electrode film 6, the ion conductor film 7, and the electrode film 8). In FIG. 3A, the processing dimension of the gate electrode 4 in the planar direction may be about 100 nm. When a hot electron current of 1.5 pA flows through the tunnel insulating film 5, if the electromotive force of the battery is 2 V, the potential of the current collector film 9 and the electrode film 8 is 4 V and the potential of the electrode film 6 and the current collector film 13 is 6 V with respect to the semiconductor substrate SB.

Figure 5A:
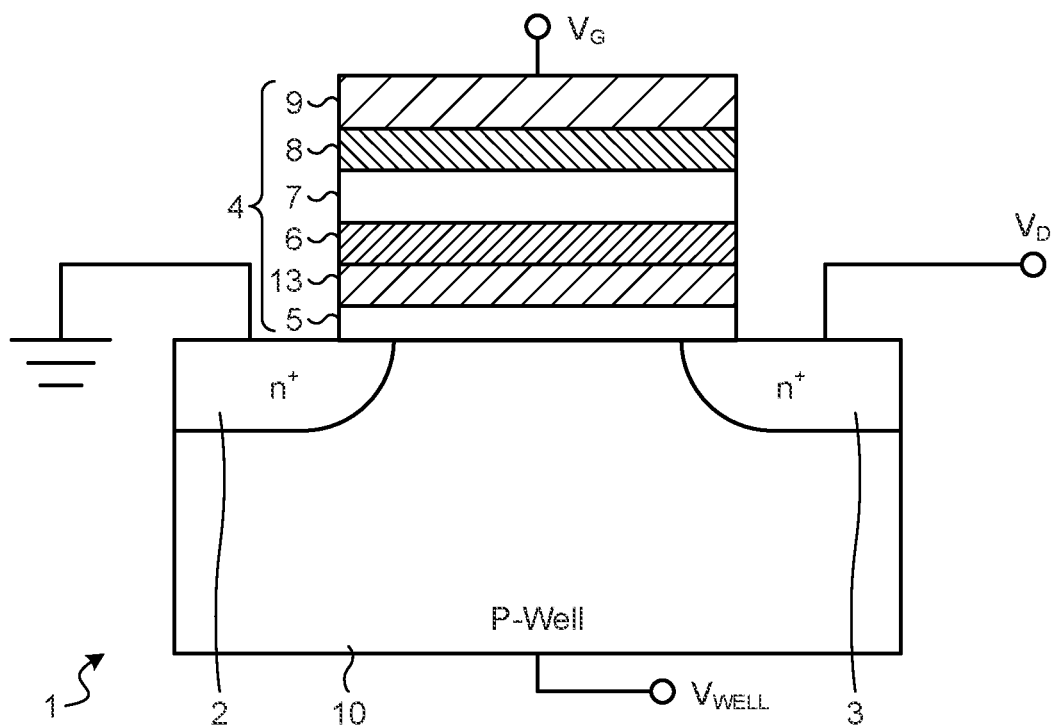
FIG. 5A is a diagram illustrating a circuit connection to a transistor.
Figure 5B:
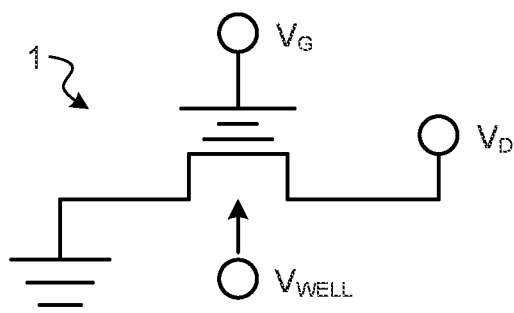
FIG. 5B is a diagram illustrating the circuit symbol of the transistor.

In such a case, the transistor 1 may be connected to a circuit as illustrated in FIG. 5A. The transistor 1 has the source electrode 2 connected to a ground potential, the drain electrode 3 to which a predetermined voltage $V_D$ is applied, the current collector film 9 of the gate electrode 4 to which a gate voltage $V_G$ is applied, and the well region 10 to which a bias voltage $V_{WELL}$ is applied. The ground potential, the predetermined voltage $V_D$, the gate voltage $V_G$, and the bias voltage $V_{WELL}$ may be generated and supplied by the control circuit, respectively. The circuit symbol of the transistor 1 is represented by incorporating the symbol of the battery in the gate portion of the symbol of the transistor illustrated in FIG. 5B. In such a case, the circuit connections illustrated in FIG. an are represented by the symbols in FIG. 5B.

In the discharging operation illustrated in FIG. 3A, the predetermined voltage $V_D$ is applied between the source electrode 2 and the drain electrode 3 in a state where $V_{WELL}=0$ V is applied to the well region 10 and $V_G=4$ V is applied to the current collector film 9, to supply electrons to the channel region 10a. In such a case, since the films other than the tunnel insulating film 5 in the gate electrode 4 are substantially conductors, an electric field sufficient for tunneling electrons can be efficiently applied to both ends of the tunnel insulating film 5 in the stacking direction. In other words, in the transistor 1, for example, when a gate voltage of 4 V is applied to the gate electrode 4, ions (e.g., Li+) move from the electrode film 8 to the electrode film 6 through the ion conductor film 7 to discharge the battery structure, and electrons tunneled through the tunnel insulating film 5 from the channel region 10a are accumulated in the electrode film 6 via the current collector film 13, whereby analog information is written. In such a case, the composition parameter x decreases, and the electromotive force of the battery structure decreases. Although 4 V is illustrated as the gate voltage in FIG. 3A, the gate voltage can be continuously varied, for example, around 4 V depending on the analog information to be written.

The film thickness of the electrode film 6 and the film thickness of the electrode film 8 of the battery structure can. be reduced. For example, the electrode film 6 can be made thinner than the ion conductor film 7, and the electrode film 8 can be made thinner than the ion conductor film 7. Thus, the amount of ion movement between the electrode film 6 and the electrode film 8 per unit gate voltage can be reduced, and the change of the battery electromotive force can be reduced. In other words, the analog information to be written can be made highly accurate.

Note that in the discharging operation illustrated in FIG. 3A, the electrode film 8 as the positive electrode may be referred to as a cathode, and the electrode film 6 as the negative electrode may be referred to as an anode, from the standpoint that the electrode into which electrons flow is referred to as an anode and the electrode from which electrons are emitted is referred to as a cathode. Alternatively, in the discharging operation illustrated in FIG. 3A, the electrode film 8 as the positive electrode may be referred to as a cathode and the electrode film 6 as the negative electrode may be referred to as an anode, from the standpoint that the electrode into which electrons flow during discharge is fixedly referred to as an anode and the electrode from which electrons are emitted is fixedly referred. to as a cathode.

Figure 4A:
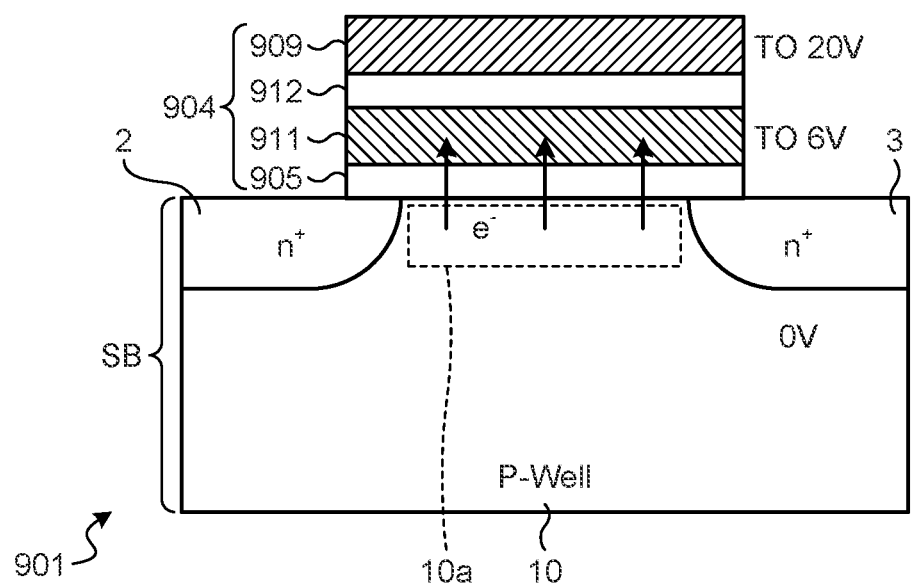
FIG. 4A is a diagram illustrating writing to a double capacitor type transistor.

On the other hand, a double capacitor type transistor 901 used in a flash memory performs a writing operation as illustrated in FIG. 4A. In. FIG. 4A, the processing dimension of a gate electrode 904 in the planar direction is the same as that in FIG. 3A, and may be, for example, about 100 nm. The gate electrode 904 has a tunnel insulating film 905, a charge storage film 911, an interlayer insulating film 912, and a control electrode film 909 stacked in order from the side close to the substrate SB. The charge storage film 911 may he constituted of a conductor such as a metal or a conductive semiconductor, or may be constituted of a three-layer structure of a silicon oxide film, a silicon nitride film, and. a silicon oxide film. In the double capacitor type transistor 901, as illustrated in FIG. 4A, when a hot electron current of the same level is supplied, the gate voltage $V_G$ is about 20 V, if the interlayer insulating film. 912 has a thickness of 16 nm, for example. In other words, in the writing operation illustrated in FIG. 4A, the predetermined voltage $V_D$ is applied between the source electrode 2 and the drain. electrode 3 in a state where $V_{WELL}=0$ V is applied to the well region. 10 and $V_G=20$ V is applied to the control electrode film 909, to supply electrons to the channel region 10a. In such a case, the interlayer insulating film 912 exists in the gate electrode 904 in addition to the tunnel insulating film 5, and the gate voltage $V_G$ is divided into both ends of the interlayer insulating film 912 and both ends of the tunnel insulating film 5 in the stacking direction. Therefore, in order to apply an electric field sufficient for tunneling electrons to both ends of the tunnel insulating film 5 in the stacking direction, a high voltage is applied. to the control electrode film 909. In other words, in the double capacitor type transistor 901, for example, a gate voltage $V_G$ of 20 V is applied to the gate electrode 4, and electrons tunneled through the tunnel insulating film 905 from the channel region 10a are accumulated in the charge storage film 911, whereby information is written.

The gate voltage $V_G$ (e.g., about 4 V) at the time of discharging the transistor 1 of the present embodiment is lower than the gate voltage $V_G$ (e.g., about 20 V) at the time of writing the double capacitor type transistor 901. The lower gate voltage is because, in the transistor 1, the ion. conductor film 7 of a solid electrolyte is used. in place of the interlayer insulating film 912 in order to confine electrons in a portion of the gate electrode 4 close to the channel region 10a. As mentioned above, the solid electrolyte acts as an insulator for electrons but as a conductor for ion currents. Further, a battery electromotive force (e.g., about 2 V) exists and thereby lowers the gate voltage $V_G$. Thus, in comparison with the double capacitor type transistor 901, the transistor 1 of the present embodiment can accumulate charge from the channel region 10a to the electrode film 6 via the tunnel insulating film 5 at a lower voltage.

Figure 3B:
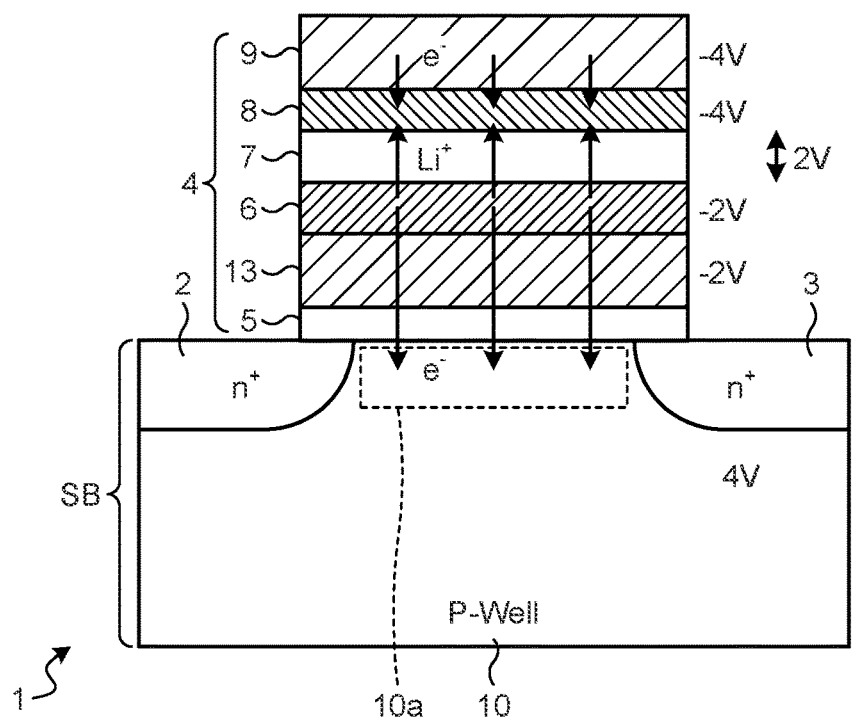
FIG. 3B is a diagram illustrating erasing (charging) for the transistor.

The transistor 1 performs an erasing operation accompanied by a charging operation as illustrated. in. FIG. 3B. FIG. 3B illustrates a case where a current flows in a direction from the semiconductor substrate SB toward the gate electrode 4 to charge the battery structure (the electrode film 6, the ion conductor film 7, and. the electrode film 8). In FIG. 3B, the processing dimension of the gate electrode 4 in the planar direction may be about 100 nm. When a hot electron current of 1.5 pA flows through the tunnel insulating film 5, if the electromotive force of the battery is 2 V, the potential difference between the current collector film 9 and the electrode film 8 is (−4 V) −4 V =−8 V and the potential difference between. the electrode film 6 and the current collector film. 13 is (−2 V) −4 V=−6 V with respect to the semiconductor substrate SB. In such a case, the circuit connection as illustrated in FIG. 5A may be performed.

In the charging operation illustrated in FIG. 3B, the predetermined voltage $V_D$ is applied between the source electrode 2 and the drain electrode 3 in a state where $V_{WELL}$=4 V is applied to the well region 10 and $V_G$=−4 V is applied to the current. collector film 9, to enable to discharge electrons from the channel region 10a. In such a case, since the films other than the tunnel insulating film 5 in the gate electrode 4 are substantially conductors, an electric field sufficient for tunneling electrons can be efficiently applied to both ends of the tunnel insulating film 5 in the stacking direction. In other words, in the transistor 1, for example, a gate voltage $V_G$=−4 V is applied to the gate electrode 4, and $V_{WELL}$=4 V is applied to the substrate SB. It can be relatively considered that an erasing voltage of 4 V−(−4 V)=8 V is applied between the gate electrode 4 and the substrate SB. Thus, ions (e.g., Li+) move from the electrode film 6 to the electrode film 8 via the ion conductor film 7 to charge the battery structure, and electrons tunneled through the tunnel insulating film 5 from the electrode film 6 via the current collector film 13 are discharged to the channel region 10a, whereby analog information is at least partially erased. In such a case, the composition parameter x increases and the electromotive force increases. Although −4 V is illustrated as the sate voltage in FIG. 3B, the gate voltage can be continuously varied around −4 V depending on the analog information to be erased.

Note that in the charging operation illustrated in FIG. 3B, the electrode film 8 as the positive electrode may be referred to as an anode, and the electrode film 6 as the negative electrode may be referred to as a cathode, from the standpoint that the electrode into which electrons flow is referred to as an anode and the electrode from which electrons are emitted is referred to as a cathode. Alternatively, in the charging operation illustrated in FIG. 3B, the electrode film 8 as the positive electrode may be referred to as a cathode and the electrode film 6 as the negative electrode may be referred to as an anode, from the standpoint that the electrode into which electrons flow during discharge is fixedly referred to as an anode and the electrode from which electrons are emitted is fixedly referred to as a cathode.

Figure 4B:
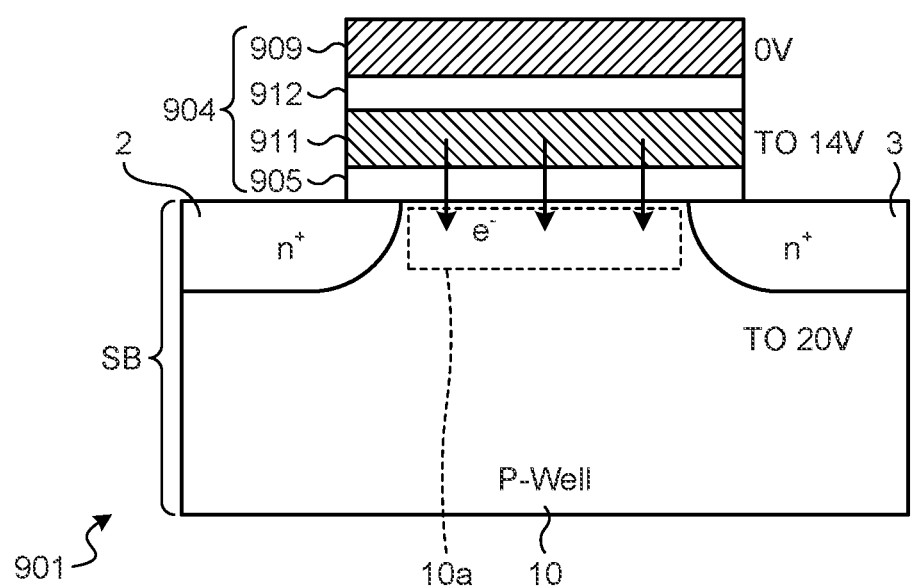
FIG. 4B is a diagram illustrating erasing for the double capacitor type transistor.

On the other hand, the double capacitor type transistor 901 used in the flash memory performs an. erasing operation as illustrated in FIG. 4B. In FIG. 4B, the processing dimension of the gate electrode 904 in the planar direction is the same as that in FIG. 3B and may be, for example, about 100 nm. In the double capacitor type transistor 901, as illustrated in FIG. 4B, when a hot electron current of the same level is supplied, the erasing voltage is about 20 V, if the interlayer insulating film 912 has a thickness of 16 nm, for example. In other words, in the erasing operation illustrated in FIG. 4B, the predetermined. voltage $V_D$ is applied between. the source electrode 2 and the drain electrode 3 in a state where $V_{WELL}$=20 V is applied to the well region 10 and $V_G$=0 V is applied to the control electrode film 909, to enable to discharge electrons from. the channel region. 10a. In such a case, the interlayer insulating film 912 exists in the gate electrode 904 in addition to the tunnel insulating film 905, and the gate voltage $V_G$, is divided into both. ends of the interlayer insulating film 912 and both ends of the tunnel insulating film 905 in the stacking direction. Therefore, in order to apply an electric field sufficient for tunneling electrons to both ends of the tunnel insulating film 905 in the stacking direction, a high voltage is applied to the substrate SB. In other words, in the double capacitor type transistor 901, for example, an erasing voltage of 20 V is applied to the substrate SB, and electrons tunneled through the tunnel insulating film 905 from the charge storage film 911 are discharged to the channel region 10a, whereby information is erased all at once.

The erasing voltage (e.g., about 8 V) at the time of charging the transistor 1 of the present embodiment is lower than the erasing voltage (e.g., about 20 V) at the time of writing the double capacitor type transistor 901. The lower erasing voltage is because, in the transistor 1, the ion conductor film 7 of a solid electrolyte is used in place of the interlayer insulating film 912 in order to confine electrons in the vicinity of the channel region 10a. As mentioned above, the solid electrolyte acts as an insulator for electrons but as a conductor for ion. currents. Further, a battery (electromotive force is about 2 V) exists and thereby lowers the gate voltage. Thus, in comparison with. the double capacitor type transistor 901, the transistor 1 of the present embodiment can draw out charge from the electrode film 6 through the current collector film 13 to the channel region 10a via the tunnel insulating film 5 at a lower voltage.

Figure 6:
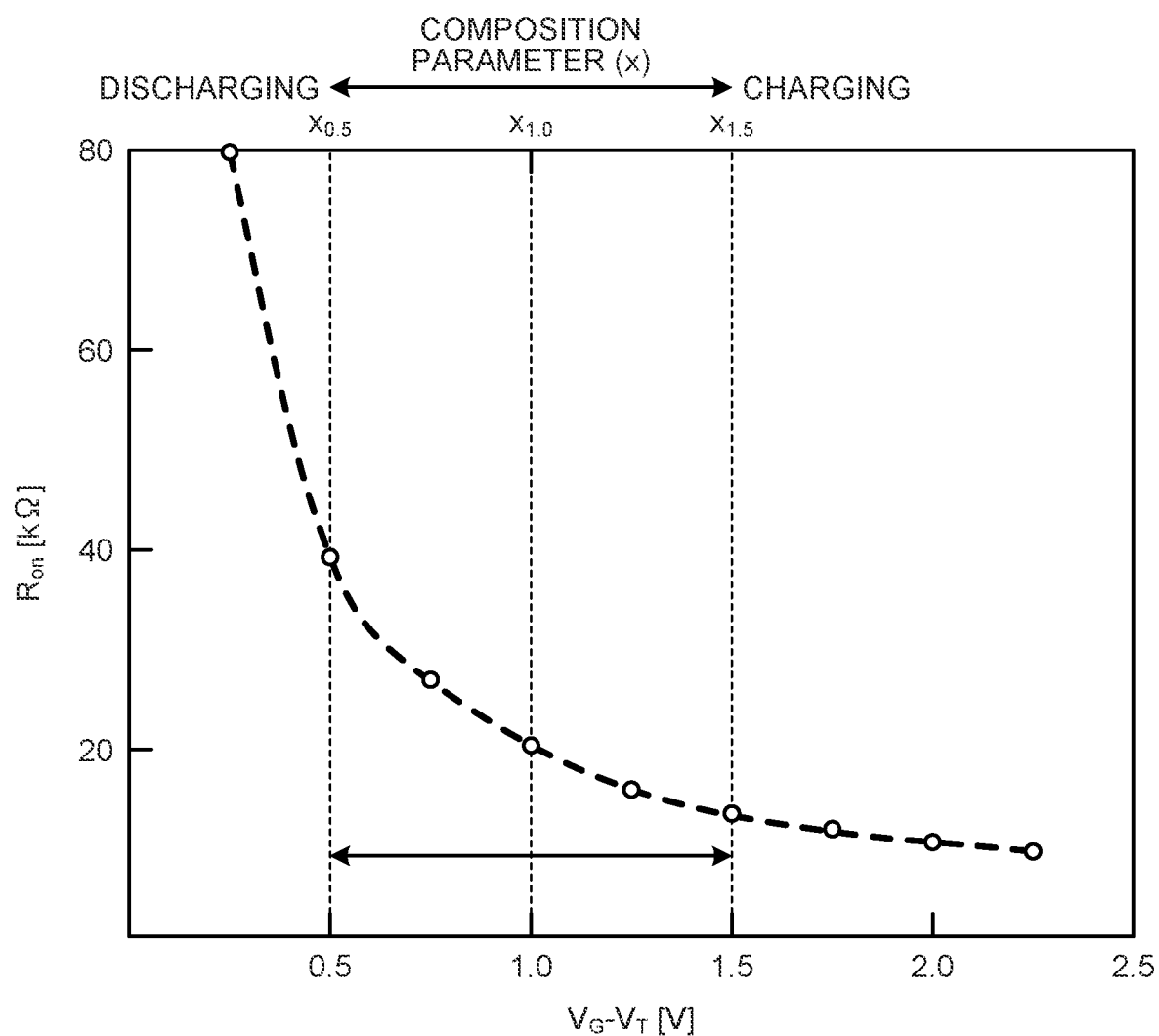
FIG. 6 is a diagram illustrating reading characteristics of analog information.

The transistor 1 performs a reading operation as illustrated in FIG. 6. The reading operation can be performed by observing the on-resistance of the transistor 1. The on-resistance of the transistor 1 can be observed by, for example, detecting a cell current read out by applying a predetermined voltage between the source electrode 2 and the drain electrode 3 in a state where the gate voltage $V_G$ applied to the current collector film 9, by a control circuit (not illustrated).

In such a case, the circuit may be connected as illustrated in FIG. 5A, and the gate voltage $V_G$ may be lower than that at the time of writing, but may be a voltage value (e.g., about 1.5 V) for turning on the transistor 1. The predetermined voltage $V_D$ may be a charging voltage for charging the data lines to detect the cell current. The control circuit can detect the level of the cell current through a change in the potential of the data line from the charging potential due to the cell current. The control circuit can determine the on-resistance of the transistor 1 according to the level of the detected cell current.

For example, if the on-resistance of the transistor 1 is set to $R_{on}$, the gate voltage applied to the current collector film 9 is set to $V_G$, and the threshold voltage of the transistor 1 is set to $V_T$, the change in the on-resistance $R_{on}$ with respect to $V_G$-$V_T$ is illustrated by a dashed-dotted line in FIG. 6. This change is expressed approximately in the linear region of the operation of the transistor 1 by $$1/R_{on}=(W/L)\mu C'_{ox}(V_G-V_T) \quad \text{(Equation 1)}.$$

The on-resistance $R_{on}$ can be estimated according to Equation 1. In Equation 1, W represents the gate width (e.g., 100 nm). L represents the gate length (e.g., 100 nm). μ represents the electron mobility (e.g., 100 cm²/Vs) in the channel region. $C'_{ox}$ represents the gate capacitance per unit area (e.g., $5\times10^{-3}$ F/m²). $V_G$ represents the gate voltage=battery electromotive force (e.g., 1.5 to 2.5 V). $V_T$ represents the threshold voltage (e.g., 1 V) of the transistor 1.

FIG. 6 illustrates the relationship between the on-resistance $R_{on}$ and the gate voltage $V_G$ when the battery structure is charged and discharged in the range of $V_T$=1 V and $V_G$-$V_T$=0.5 to 1.5 V. $V_G$-$V_T$=0.5 V corresponds to charge level 0% of the battery structure, $V_G$-$V_T$=1.0 V corresponds to charge level 50% of the battery structure, and $V_G$-$V_T$=1.5 V corresponds to charge level 100% of the battery structure.

For example, it is assumed that the composition parameter $x=x_{1.0}$, $V_G$-$V_T$=1.0 V and the battery structure is 50% charged. In such a case, the control circuit detects a cell current read out by applying a predetermined voltage between the source electrode 2 and the drain electrode 3 in a state where the gate voltage $V_G$ is applied to the current collector film 9, and can determine the on-resistance $R_{on}$≈21 kΩ. The control circuit can restore the value corresponding to the charging rate of 50% according to the on-resistance $R_{on}$≈21 kΩ.

When ions are moved from the electrode film 8 to the electrode film 6 via the ion conductor film 7 to be discharged and the composition parameter is $x=x_{0.5}$ ($<x_{1.0}$), then $V_G$-$V_T$=0.5 V and the charge level of the battery structure is 0%. In such a case, the control circuit detects a cell current read out by applying a predetermined voltage between the source electrode 2 and the drain electrode 3 in a state where the gate voltage $V_G$ is applied to the current collector film 9, and can determine the on-resistance $R_{on}$≈39 kΩ. The control circuit can restore the value corresponding to the charging rate of 0% according to the on-resistance $R_{on}$≈39 kΩ.

When ions are moved from the electrode film 6 to the electrode film 8 via the ion conductor film 7 to be charged and the composition parameter is $x=x_{1.5}$ ($>x_{1.0}$), then $V_G$-$V_T$=1.5 V and the charge level of the battery structure is 100%. In such a case, the control circuit detects a cell current read out by applying a predetermined voltage between the source electrode 2 and the drain electrode 3 in a state where the gate voltage $V_G$ is applied to the current collector film 9, and can determine the on-resistance $R_{on}$≈13 kΩ. The control circuit can restore the value corresponding to the charging rate of 100% according to the on-resistance $R_{on}$≈13 kΩ.

Note that the method of writing and erasing accompanied by charging and discharging is not limited to the method of FIGS. 3A and 3B, and the voltage $V_G$ applied to the gate electrode 4 can be further reduced by accelerating electrons between the source electrode 2 and the drain electrode 3 by adjusting a predetermined voltage $V_D$. The reading method is not limited to the method of FIG. 6, and may be performed by using any of various characteristics obtained by operating the transistor 1 in a nonlinear region. In the above example, the transistor 1 is assumed to be an N-type transistor, but a P-type transistor can be used for the transistor 1.

Although FIGS. 1 to 3B and FIGS. 5A to 6 illustrate a case where $SiO_2$ having a thickness of 8 nm is used as the tunnel insulating film 5, the thickness of the tunnel insulating film 5 can be appropriately selected within a range of 1 to 100 nm in consideration of the writing voltage, the number of writing, and the storage time, for example. An oxide film of, for example, MgO, $HfO_x$, or $AlO_x$ can be used for the tunnel insulating film 5 within a thickness range of 1 to 100 nm.

Although a film using a solid electrolyte $Li_3PO_4$ having a thickness of 20 nm is illustrated as the ion conductor film 7, the solid electrolyte $Li_3PO_4$ can be used within a thickness range of 10 to 1000 nm in consideration of film formability and film quality, for example. The ion conductor film 7 can contain any solid electrolyte. As the ion conductor film 7, in addition to the solid electrolyte $Li_3PO_4$, a perovskite-type $La_{0.51}Li_{0.34}TiO_{2.94}$, a NASICON-type $Li_{1.3}Al_{0.3}Ti_{1.7}(PO_4)_3$, a garnet-type solid electrolyte $Li_7La_3Zr_2O_{12}$, and an amorphous solid electrolyte $Li_{2.9}PO_{3.3}N_{0.46}$ (LIPON), for example, can be used as the oxide solid electrolyte, and $Li_{10}GeP_2S_{12}$ and $Li_{3.25}Ge_{0.25}P_{0.75}S_4$, for example, can be used as the sulfide solid electrolyte, within a thickness range of 10 to 1000 nm.

Although a film using a positive electrode material $Li_{1-x}CoO_2$ of a lithium battery is it as the electrode film 6, the electrode film 6 can comprise at least one of an electron-ion mixed conductor, an alkali metal, and an alkaline earth metal. In addition to the illustrated materials, many materials such as $Li_{1-x}NiO_2$, $Li_{1-x}CrO_2$, $Li_{1-x}MnO_2$, $Li_{1-x}Mn_2O_4$, $Li_xV_2O_5$, $Li_xTiS_2$, and $Li_{1-x}FePO_4$ can be used for the electrode film 6.

Although a film using a negative electrode material $Li_xTiO_2$ of a lithium battery is illustrated as the electrode film 8, the electrode film 8 can comprise at least one of an electron-ion mixed conductor, an alkali metal, and an alkaline earth metal. In addition to the illustrated materials, metal materials such as Li, $Li_xAl$, $Li_xNiO$, $Li_xV_2O_5$, $Li_xTiS_2$, $Li_xFePO_4$, and $Li_{4-x}Ti_5Ol_2$ can be used for the electrode film 8.

When the structure of the magnesium battery is employed as the battery structure (the electrode film 6, the ion conductor film 7, and the electrode film 8), the solid electrolyte $MgSc_2Se_4$ can be used as the ion conductor film 7. As the electrode film 6, a positive electrode material $Mg_{1-x}FeSiO_4$ of the magnesium battery can be used. As the electrode film 8, a negative electrode material Mg of the magnesium battery can be used. As the current collector film 9, an Au/Cr or Au/Ti multilayer film, for example, may be used instead of Au, for example, in order to improve the adhesion between the metal electrode and the positive/negative electrodes of the oxide/compound.

A specific process example will then be described with reference to FIGS. 7A to 9D. FIGS. 7A to 9D illustrate an example of a method of manufacturing the transistor 1.

Figure 7A:
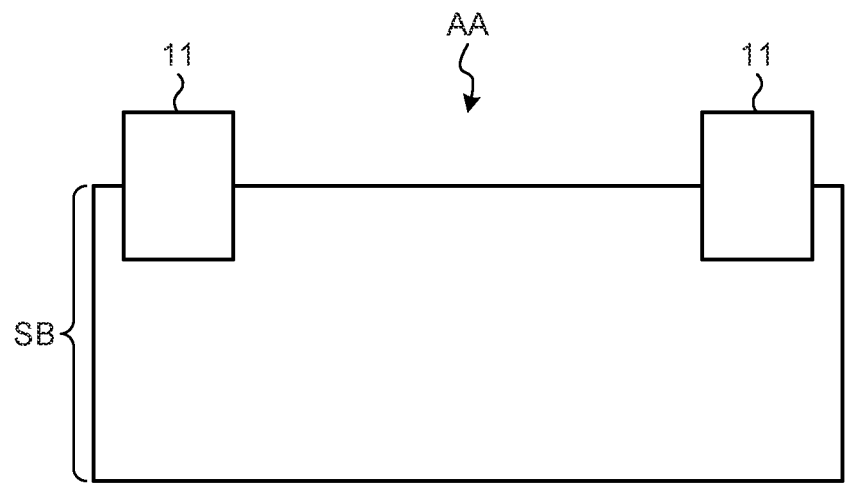
FIG. 7A is a diagram illustrating a method of manufacturing a nonvolatile memory device.

An element isolation structure 11 is first formed on the substrate SB. The element isolation structure 11 can be formed in an STI (Shallow Trench. Isolation) type structure. The substrate SB can be formed of a semiconductor such as silicon. In the case of the STI type, a trench is formed in the substrate SB by RIE, for example, and an insulating film such as a silicon oxide film is buried in the trench by a CVD method, for example, whereby the element isolation structure 11 can be formed. Thus, an element formation region AA in which the transistor 1 is to be formed is secured between the element isolation structures 11 in the substrate SB (FIG. 7A).

Figure 7B:
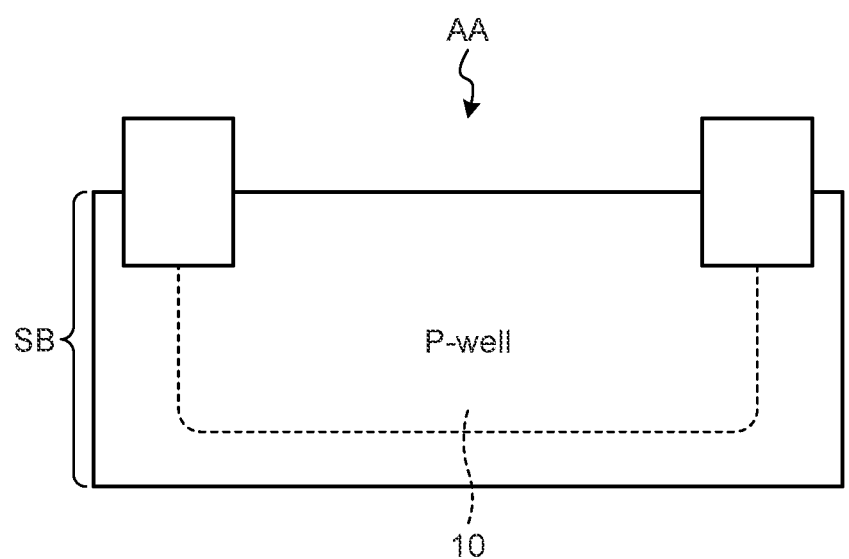
FIG. 7B is a diagram illustrating a method of manufacturing a nonvolatile memory device.

A second conductivity type impurity is then introduced into the entire element formation region AA by, for example, an ion implantation method to form a well region 10. If the second conductivity type is p-type, the second conductivity type impurity may be an acceptor such as boron, and the well region 10 may be a P-type well region (FIG. 7B). Note that the well region 10 may be common to other transistors 1 and some other transistors formed adjacently on the same substrate. In this case, a first conductivity type impurity is introduced into all regions having the well region 10 in common.

Figure 7C:
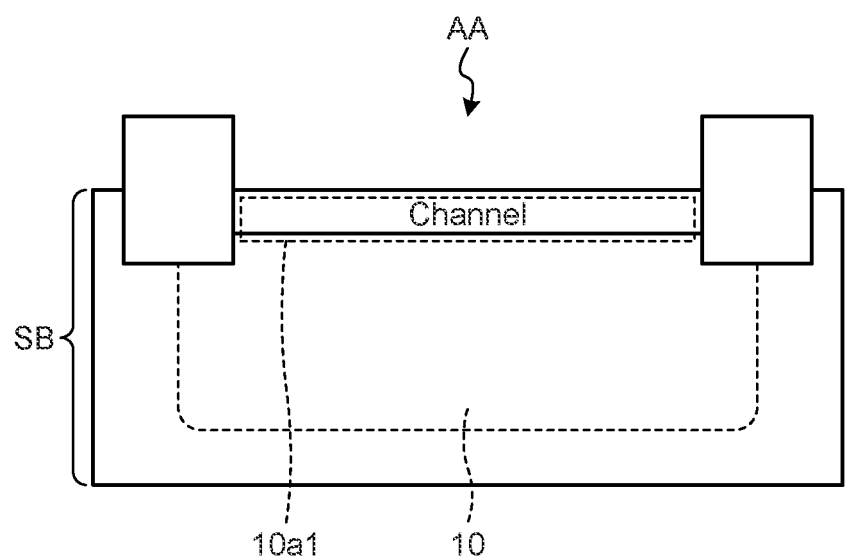
FIG. 7C is a diagram illustrating a method of manufacturing a nonvolatile memory device.

If necessary, an impurity for a channel is introduced (e.g., ion implantation) into a channel region 10a1 near the surface of the element formation region AA (FIG. 7C). The impurity may not necessarily be introduced. Annealing is then performed by any technique such as RTA (Rapid Thermal Anneal), for example, to activate impurities in the well region 10 and the channel region 10a1. The impurity for a channel is a first conductivity type impurity, and is introduced at a lower concentration than the first. conductivity type impurity introduced into the source electrodes 2 and 3 to be formed in a later process. If the first conductivity type is -type, the first conductivity type impurity may be a donor such as phosphorus or arsenic.

Figure 8A:
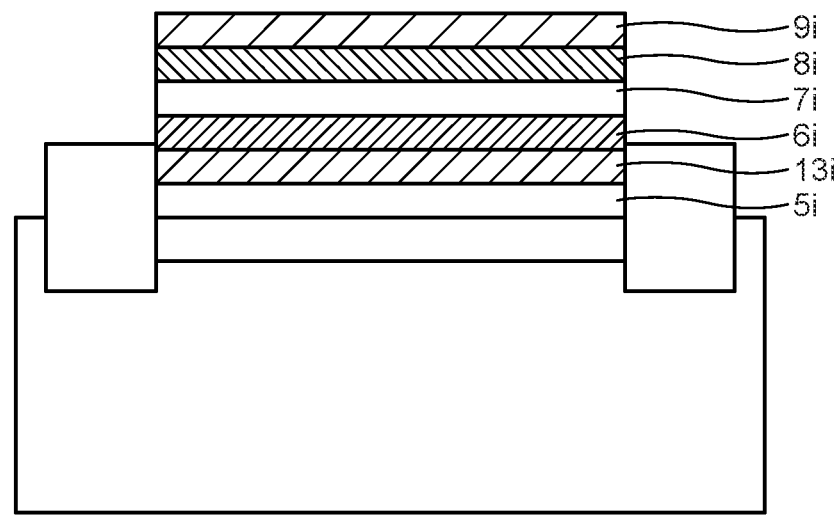
FIG. 8A is a diagram illustrating a method of manufacturing a nonvolatile memory device.

A tunnel insulating film 5$i$, a current collector film 13$i$, an electrode film 5$i$, an ion conductor film 7$i$, an electrode film 8$i$, and a current collector film 9$i$ are sequentially formed and stacked in the element formation region AA. (FIG. 8A). These films may each be a single layer film. or a multilayer film. Standard semiconductor process techniques such as $CV_D$ and sputtering can be used for film deposition. The tunnel insulating film 5may be formed of a material mainly composed of silicon oxide, or may be formed of a material mainly composed. of another oxide. The current collector film 13$i$ may be formed of a material mainly composed or a conductive material such as metal or carbon. The electrode film 6$i$ may be formed of a material (e.g., $Li_{1-x}CoO_2$) containing ions to be conducted. The ion conductor film 7$i$ may be formed of a material mainly. composed of a solid electrolyte (e.g., $Li_3PO_4$) capable of conducting ions to be conducted. Tile electrode film 8$i$ may be formed of a material (e.g., $Li_xTiO_2$) containing ions to be conducted. The current collector film 9$i$ may be formed of a material mainly composed of a conductive material such as metal.

Figure 8B:
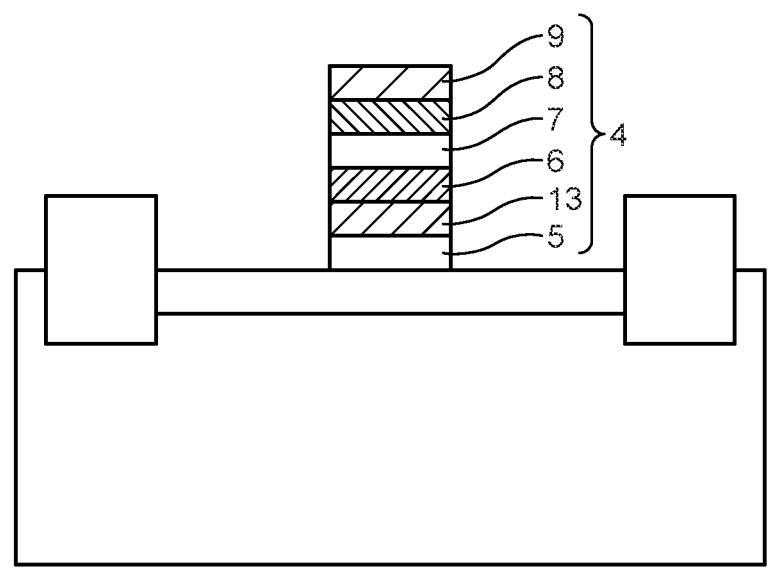
FIG. 8B is a diagram illustrating a method of manufacturing a nonvolatile memory device.

A resist pattern (not illustrated) is formed on the current collector film 9$i$ to selectively cover a region where the gate electrode 4 is to be formed by, for example, lithography. Using the resist pattern as a mask allows the gate electrode 4 to be formed by, for example, etching or milling (FIG. 8B). The gate electrode 4 has the tunnel insulating film 5, the current collector film 13, the electrode film 6, the ion conductor film 7, the electrode film 8, and the current collector film 9 stacked in order from the substrate SB side. The stacked structure of the electrode film 6, the ion conductor film 7, and the electrode film 8 forms a battery structure. If a resist pattern remains on the current collector film 9, the resist pattern is removed with a chemical solution such as an acid.

Figure 8C:
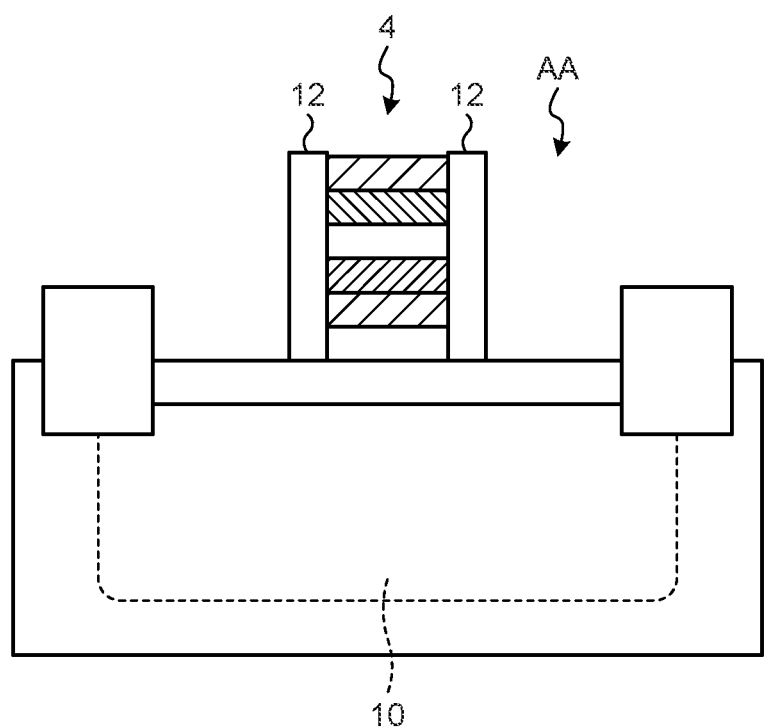
FIG. 8C is a diagram illustrating a method of manufacturing a nonvolatile memory device.

After the gate electrode 4 is formed, a gate sidewall film 12 may be formed of chemically stable oxide or nitride in order to protect the side face of the gate electrode 4 (FIG. 8C). The gate sidewall film 12 can be formed by a standard MOSFET process. For example, after the gate electrode 4 is formed, an insulating film such as an oxide film or a nitride film is formed on the entire surface of the element formation region AA, and anisotropic etching performed in a direction perpendicular to the surface of the substrate SB. Thus, the insulating film on the side face of the gate electrode 4 can be left as the gate sidewall film 12.

The source electrode 2 and the drain electrode 3 are then formed at positions adjacent to the gate electrode 4 and the gate sidewall film 12 in the well region 10.

Figure 9A:
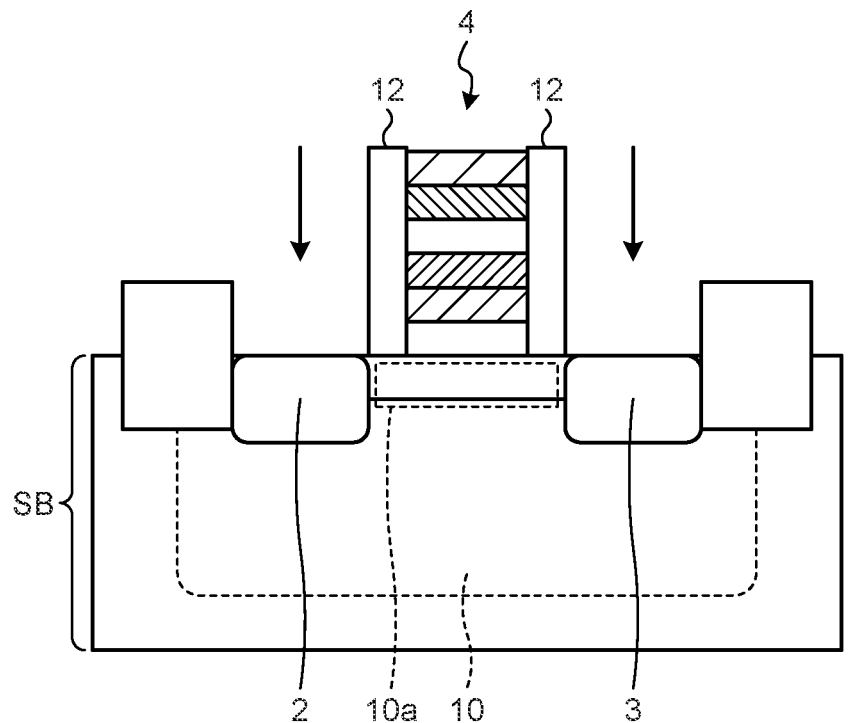
FIG. 9A is a diagram illustrating a method of manufacturing a nonvolatile memory device.

For example, the source electrode 2 and the drain electrode 3 can be formed by introducing a first conductivity type impurity into the well region 10 using the gate electrode 4 and the gate sidewall film 12 as a mask by, for example, an on implantation method (FIG. 9A). If the first conductivity type is n-type, the first conductivity type impurity may be a donor such as phosphorus or arsenic. Annealing is then performed to activate impurities in the source electrode 2 and the drain. electrode 3. The activation may be performed by any techniques such as RTA (Rapid. Thermal Anneal), for example, or by various methods such as microwave annealing to minimize the thermal load.

Figure 9B:
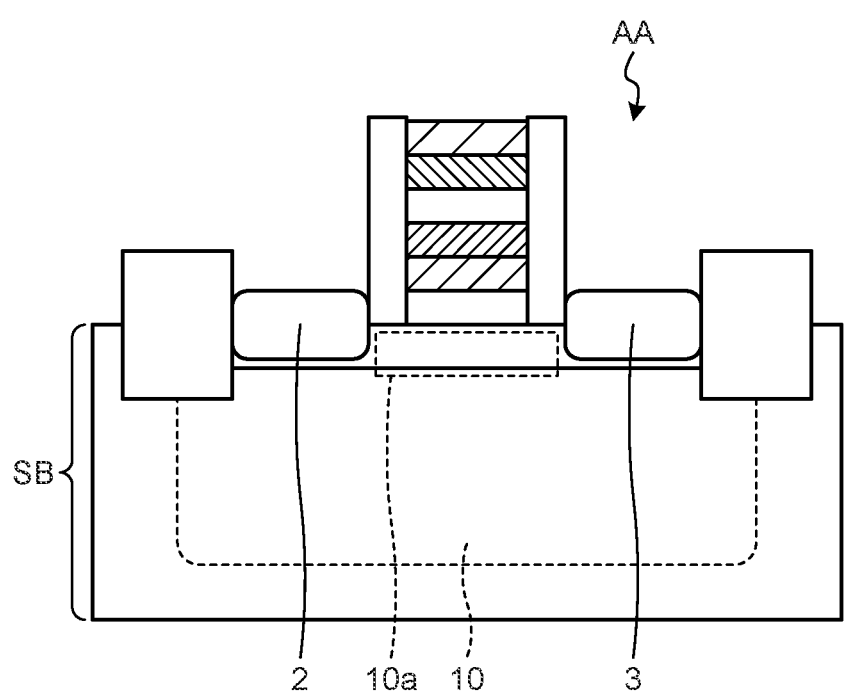
FIG. 9B is a diagram illustrating a method of manufacturing a nonvolatile memory device.

Alternatively, the source electrode 2 and the drain electrode 3 may be formed follows. A region to be a source electrode and a drain. electrode in the element formation region AA may be dug down by, for example, etching or milling, and a source electrode material and a drain. electrode material having high conductivity may be embedded by, for example, selective epitaxial growth (FIG. 9B).

Figure 9C:
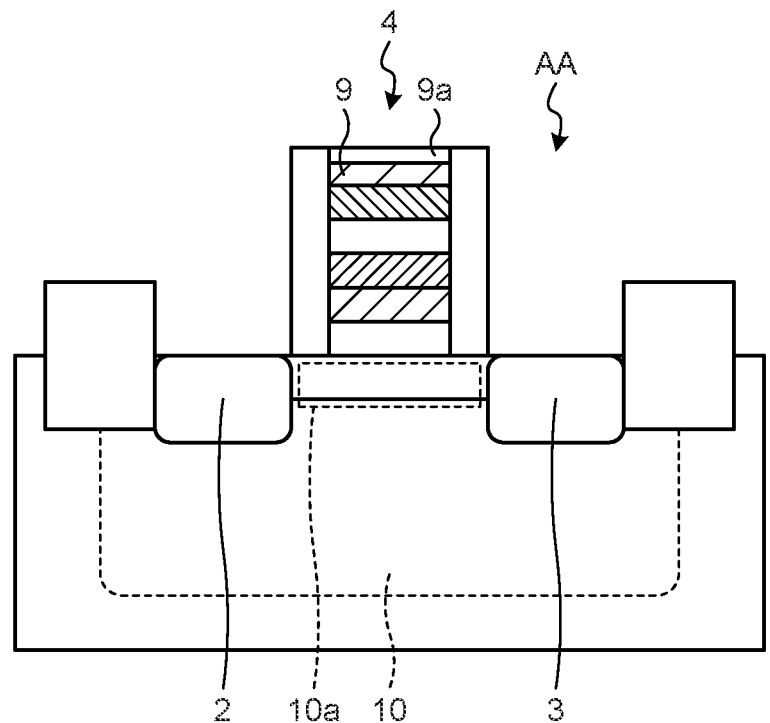
FIG. 9C is a diagram illustrating a method of manufacturing a nonvolatile memory device.
Figure 9D:
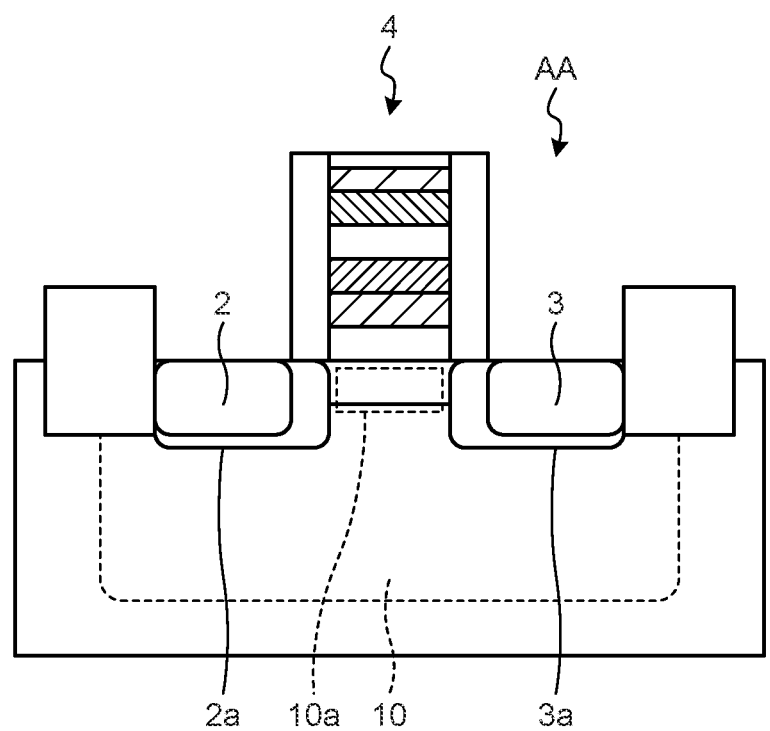
FIG. 9D is a diagram illustrating a method of manufacturing a nonvolatile memory device.

Alternatively, the source electrode 2 and the drain electrode 3 may be formed by a method such as a salicide process. When the substrate SB is formed of silicon, a metal film covering the well region 10 and the gate electrode 4 is formed in the element formation region AA, and annealing is performed to form. the source electrode 2 and the drain electrode 3 as a metal silicide layer in the well region 10 (FIG. 9C). The residual metal is then removed by chemical solution such as an acid. In such a case, if the uppermost current collector film 9 of the gate electrode 4 is formed of a silicon thin film to which conductivity is imparted, a metal silicide layer 9$a$ is formed on the uppermost portion of the current collector film 9, and the current collector film 9 can be protected from a chemical solution such as an acid. After the metal silicide layer is formed, in order to reduce the contact resistance between the metal silicide layers (the source electrode 2 and the drain electrode 3) and the silicon region (the well region 10), a first conductivity type impurity (e.g., donors such as arsenic, phosphorus, and sulfur) may be introduced by, for example, an ion implantation method to form segregated layers 2$a$ and 3$a$ at the interfaces between the metal silicide layers and the silicon region (FIG. 9D). In this case, the activation of ions can be performed at a temperature lower than the normal activation. The segregated layers 2$a$ and 3$a$ are disposed on the bottom face of the source electrode 2 and the drain electrode 3 on the back face side of the substrate SB and on the side face on the gate electrode 4 side.

Note that although the method of manufacturing the transistor 1 has been described on the assumption that the transistor 1 becomes an N-type transistor, the transistor 1 can also be made as a P-type transistor by replacing an acceptor with a donor, replacing a donor with an acceptor, and replacing the deposition order of the electrode film 6i and the electrode film 8.

As described above, in the present embodiment, each transistor 1 in the nonvolatile memory device 100 is formed of a field effect type, and the gate electrode 4 includes the layer configuration (the electrode film 6, the ion conductor film 7, and the electrode film 8) of the thin-film secondary battery. Thus, the transistor 1 can store continuous analog information by the battery electromotive force, and can express information with high accuracy. For example, when the nonvolatile memory device 100 is applied to the brain-type neural network, the synaptic weight can be expressed with high accuracy by storing analog information by the transistor 1. The transistor 1, which does not include a double capacitor structure in the gate electrode, can write information with a small voltage and current, and thus can easily reduce power consumption. Therefore, the nonvolatile memory device 100 can achieve high accuracy and low power consumption.

Note that the nonvolatile memory device 100 may be applied to a general-purpose memory device other than the brain-type neural network. The nonvolatile memory device 100 may have a memory cell array in which a plurality of transistors 1 is two-dimensionally arranged as a plurality of memory cells, and a peripheral circuit for controlling. the memory cell array.

Figure 10:
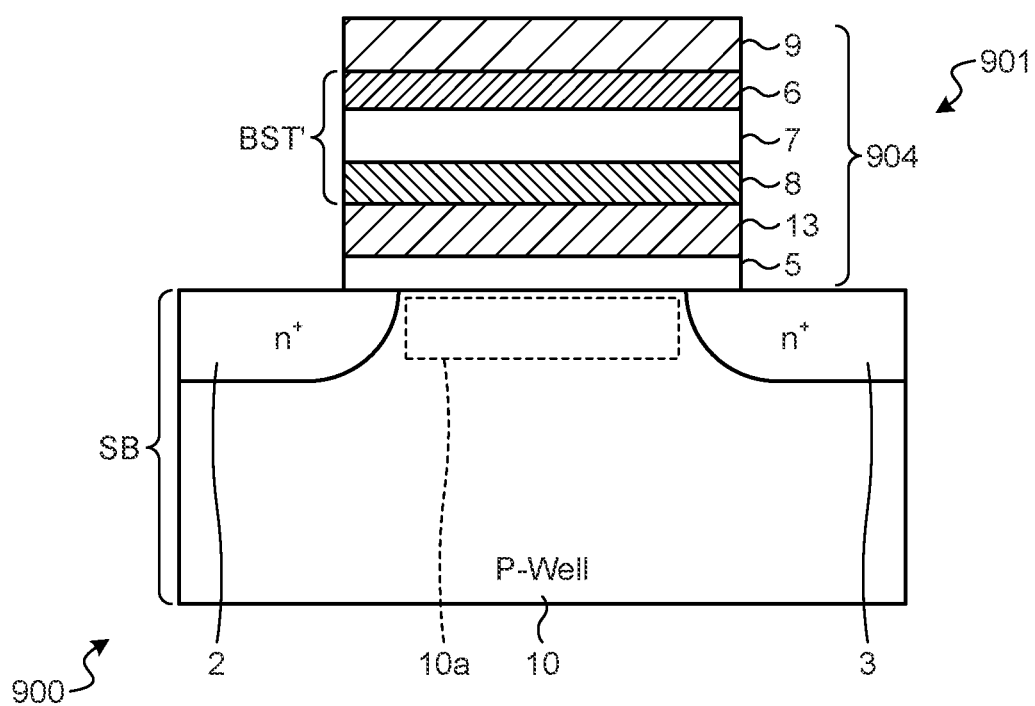
FIG. 10 is a diagram illustrating a transistor according to a modification of the first embodiment.

Alternatively, in the nonvolatile memory device 900, as illustrated in FIG. 10, the stacking order of the electrode films 6 and 8 may be switched in the gate electrode 904 of each transistor 901. FIG. 10 is a diagram illustrating the transistor 901 in a modification of the first embodiment. The gate electrode 904 has the tunnel insulating film 5, the current. collector film 13, the electrode film 8, the ion conductor film 7, the electrode film 6, and the current collector film 9 stacked in order from the substrate SB side. It is similar to the first embodiment in that the electrode film 8 functions as the negative electrode of the all-solid-state secondary battery and the electrode film 6 functions as the positive electrode of the all-solid-state secondary battery. In other words, the electrode film (first electrode film) 8 functions as a negative electrode to the ion conductor film 7. The electrode film (second electrode film) 6 functions as a positive electrode to the ion conductor film 7. In the gate electrode 904, a battery structure BST is constituted of a stacked structure of a negative electrode, a solid electrolyte and a positive electrode in order from the substrate SB side.

In this case, the correspondence between the charging operation and discharging operation of the battery structure BST' and the writing operation and erasing operation of the transistor 901 is reversed from the first embodiment.

When a gate voltage (e.g., 4 V) for writing operation is applied to the current collector film 9, ions (e.g., Li+) move from the electrode film 6 to the electrode film 8 via the ion conductor film 7 to charge the battery structure, and electrons tunneled through the tunnel insulating film 5 from the channel region 10a are accumulated in the electrode film 8 via the current collector film 13, whereby analog information is written. In such a case, the composition parameter x increases and the electromotive force of the battery structure increases.

When a well voltage (e.g., 4 V) for erasing is applied. to the well region 10 and a gate voltage (e.g., −4 V) for erasing is applied to the current collector film 9, ions (e.g., Li+) move from the electrode film 8 to the electrode film 6 via the ion conductor film 7 to discharge the battery structure, and electrons tunneled through the tunnel insulating film 5 from the electrode film 8 via the current collector film 13 are discharged to the channel region 10a, whereby analog information is at least partially erased. In such a case, the composition parameter x decreases and the electromotive force decreases.

The reading operation can be performed in consideration of the fact that the change in the on-resistance of the transistor 1 tends to be reversed horizontally from that in FIG. 6. For example, it is assumed that the composition parameter $x=x_{1.0}$, $V_G-V_T=1.0V$, and the battery structure is 50% charged. In such a case, when ions are moved from the electrode film 8 to the electrode film 6 via the ion conductor film. 7 to be discharged and the composition parameter is $x=x_{0.5}$ ($<x_{1.0}$), then $V_G-V_T=1.5$ V and the charge level of the battery structure is 0%. When ions are moved from the electrode film 6 to the electrode film 8 via the ion conductor film 7 to be charged and the composition parameter is $x=x_{1.5}$ ($>x_{1.0}$), then $V_G-V_T=0.5$ and the charge level of the battery structure is 100%.

Such a structure also allows the transistor 1 to store continuous analog information by the battery electromotive force, and to express information with high accuracy.

Second Embodiment

A nonvolatile memory device according to the second embodiment will then be described. In the following, the description will be focused on parts different from. the first embodiment.

The second embodiment illustrates a configuration in. which an electrode film 206 serves as both an electrode film and a current collector film in a gate electrode 204 of each transistor 201.

Figure 11:
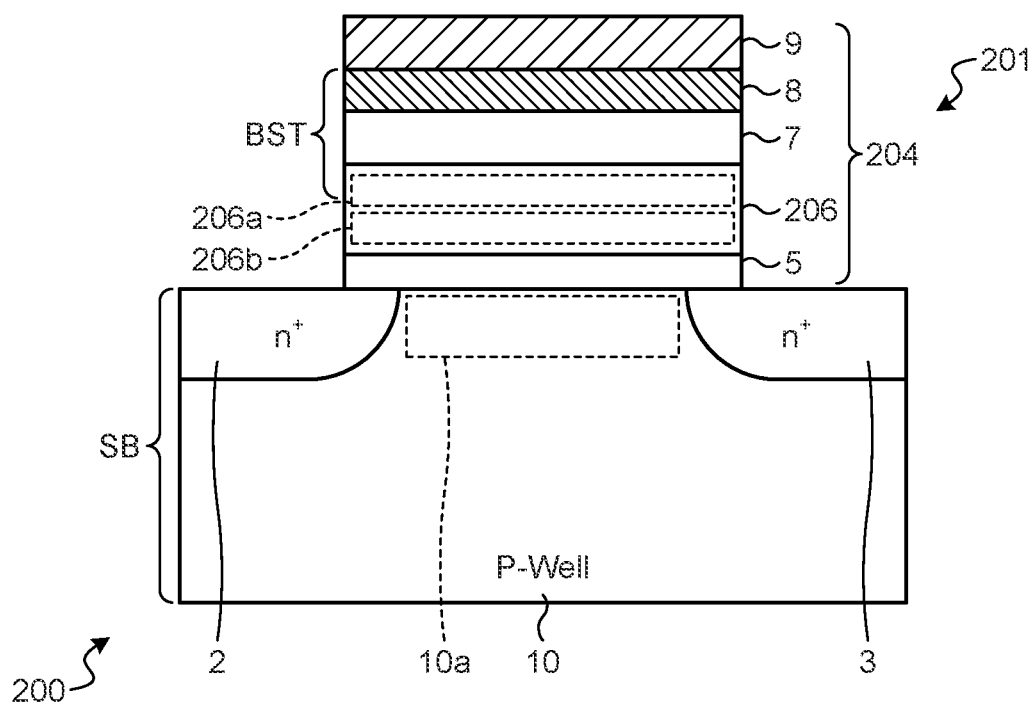
FIG. 11 is a diagram illustrating a transistor according to a second embodiment.

Specifically, as illustrated in FIG. 11, the gate electrode 204 of each transistor 1 of the nonvolatile memory device 200 has the electrode film 206 instead of the electrode film 6 and the current collector film 13 (see FIG. 1). In the electrode film 206, a region 206a in contact with the ion conductor film 7 functions as a positive electrode in the battery structure BST, and a region 206b in contact with the tunnel insulating film 5 functions as a current collector for the battery structure BST. The electrode film 206 can be formed of, for example, a material mainly composed of Li.

In such a case, in the gate electrode 204 of the transistor 201, since the region 206b has conductivity, the interface of the region 206b with the region 206a can be an equipotential surface, and a contact potential difference can be formed at the interface of the region 206b with the region 206a. The contact potential difference may be formed such that the potential of region 206a is lower than the potential of region 206b with respect to electrons. Thus, the spatial deviation of the ion current and the tunneling current between the ion conductor film 7 and the region 206a can be reduced, and when electrons are drawn into the region 206b, the electrons can be efficiently guided to the region 206a.

As described above, in the second embodiment, the electrode film 206 serves as both an electrode film and a current collector film in the gate electrode 204 of each transistor 1 of the nonvolatile memory device 200. Such a configuration also allows the transistor 1 to store continuous analog information by the battery electromotive force, and to express information with high accuracy.

Third Embodiment

A nonvolatile memory device according to a third embodiment will then be described. In the following, the description will be focused on parts different from the first embodiment and the second embodiment.

In the third embodiment, each transistor 301 in the nonvolatile memory device 300 is constituted of a thin-film transistor structure. In the transistor 301, the source electrode 2, the drain electrode 3, and the well region 10 (see FIG. 1) are disposed on a. substrate SB1 as a thinned source electrode 302, a drain electrode 303, and a semiconductor film 310.

In such a case, the method of manufacturing the transistor 301 differs from the first embodiment in the following points, as illustrated in FIGS. 12A to 15D. FIGS. 12A, 12C, 13A, 13C, 14A, 14C, 15A and 15C are plan views illustrating a method of manufacturing the transistor 301. FIGS. 12B, 12D, 13B, 13D, 14B, 14D, 15B and 15D are cross-sectional views illustrating a method of manufacturing the transistor 301. FIGS. 12B, 12D, 13B, 13D, 14B, 14D, 15B and 15D are cross-sectional views taken respectively along line A-A of FIG. 12A, line B-B of FIG. 12C, line C-C of FIG. 13A, line D-D of FIG. 13C, line E-E of FIG. 14A, line F-F of FIG. 14C, line G-G of FIG. 15A and line H-H of FIG. 15C.

Figure 12A:
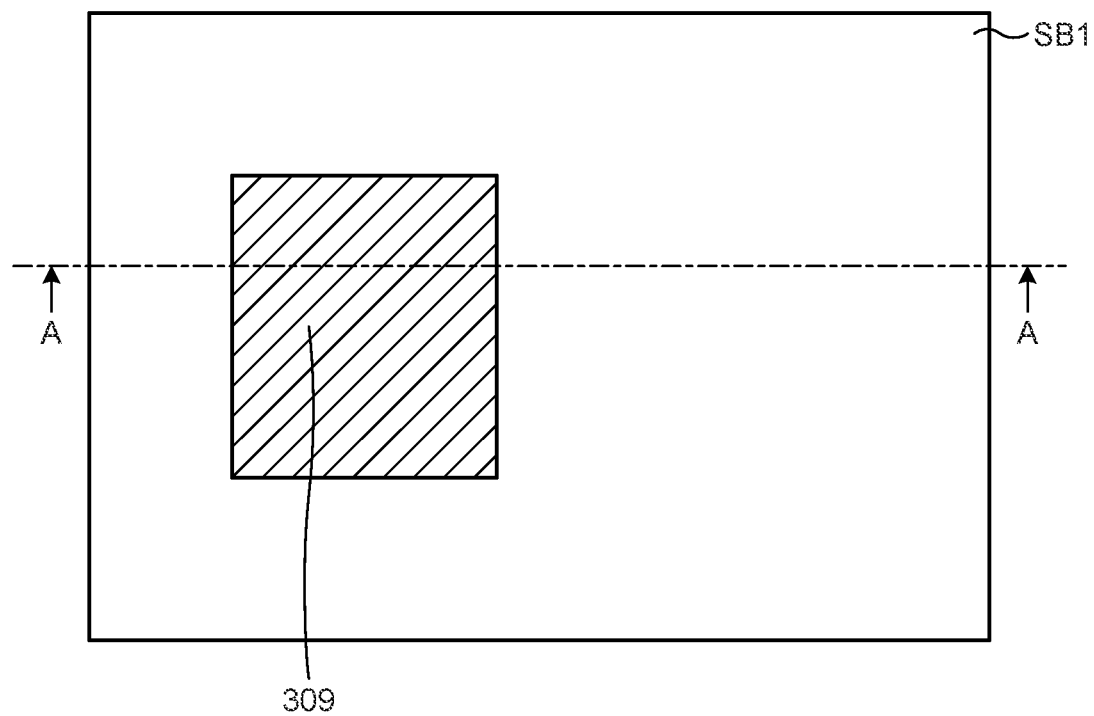
FIG. 12A is a diagram illustrating a method of manufacturing a nonvolatile memory device according to a third embodiment.
Figure 12B:
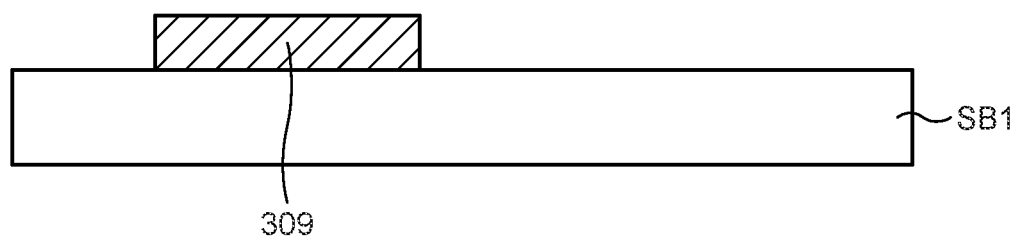
FIG. 12B is a diagram illustrating a method of manufacturing a nonvolatile memory device.

A current collector film 309$i$ (not illustrated) is formed on the substrate SB1. The current collector film 309$i$ can be formed of a material mainly composed of a metal such as Au. The current collector film 309$i$ is patterned by lithography, for example, into a substantially rectangular current collector film 309 in plan view (FIGS. 12A and 12B). It is assumed here that the surface of the substrate SB1 is low in conductivity, and after the element is formed, does not interfere electrically with other elements.

Figure 12C:
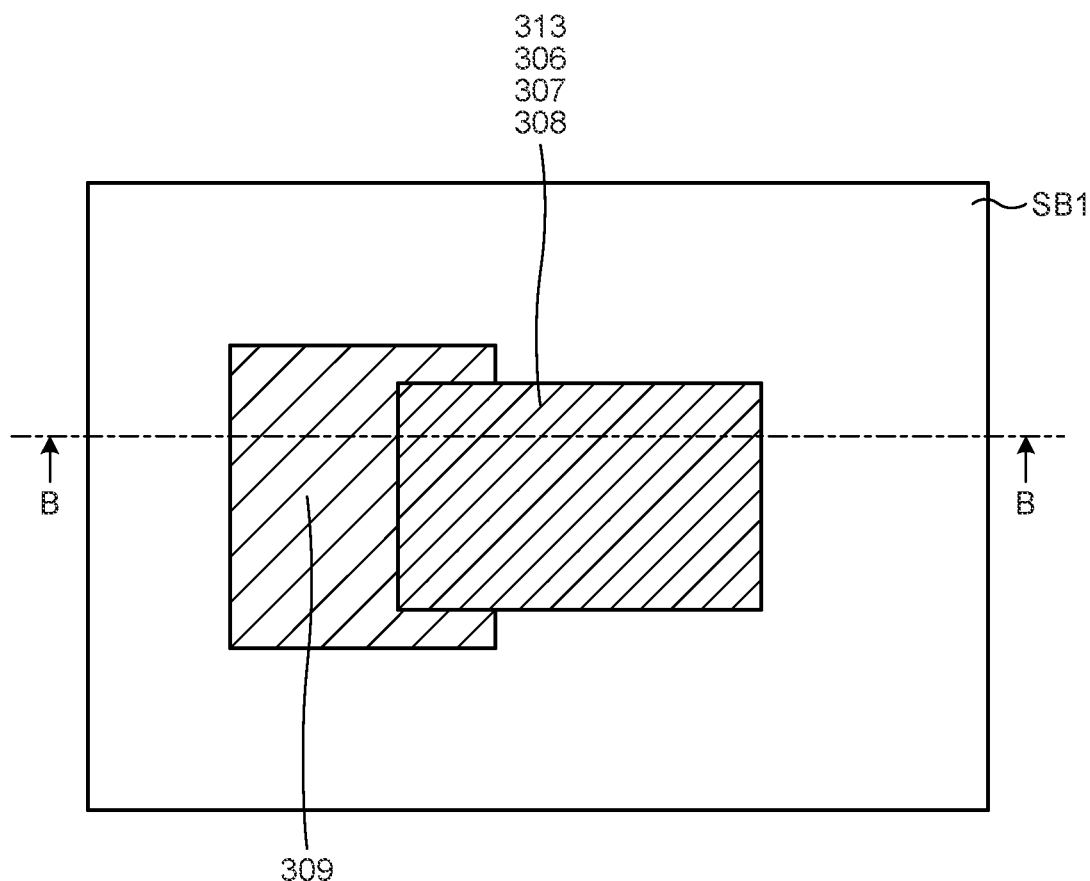
FIG. 12C is a diagram illustrating a method of manufacturing a nonvolatile memory device.
Figure 12D:
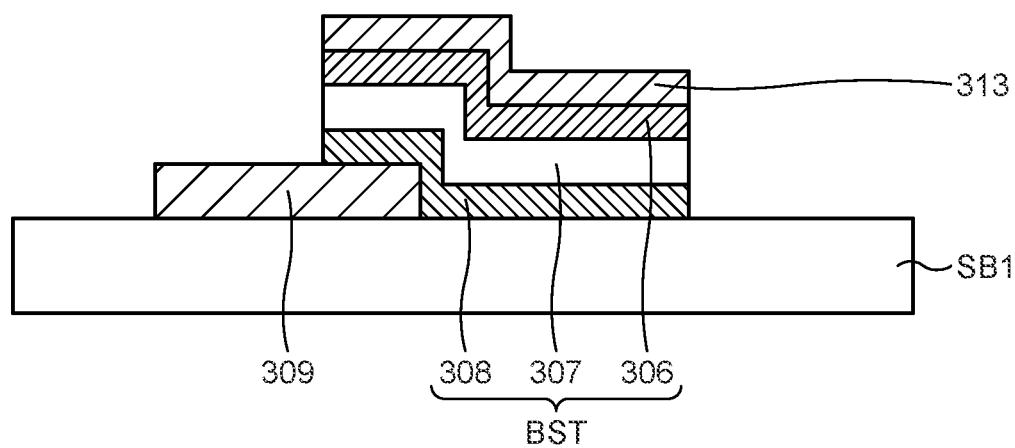
FIG. 12D is a diagram illustrating a method of manufacturing a nonvolatile memory device.

An electrode film 308$i$, an ion conductor film 307$i$, an electrode film 306$i$, and a current collector film 313$i$ (not illustrated) are then sequentially formed and stacked by, for example, a CVD method or a sputtering method. The electrode film 308$i$ may be formed of a material (e.g., $Li_xTiO_2$) containing ions to be conducted. The ion conductor film 307$i$ may be formed of a material mainly composed of a solid electrolyte (e.g., $Li_3PO_4$) capable of conducting ions to be conducted. The electrode film 306$i$ may be formed of a material (e.g., $Li_{1-x}CoO_2$) containing ions to be conducted. The current collector film 313$i$ can be formed of a material mainly composed of a metal such as Au or a conductive material such as carbon. The stacked film of the electrode film 308$i$, the ion conductor film 307$i$, the electrode film 306$i$ and the current collector film 313is patterned into a stacked film of an electrode film 308, an ion conductor film 307, an electrode film 306, and a current collector film 313 by lithography (FIGS. 12C and 12D).

The stacked film of the electrode film 308, the ion conductor film 307 and the electrode film 306 constitutes a battery structure BST. The stacked film of the electrode film 308, the ion conductor film 307, the electrode film 306 and the current collector film 313 is patterned into a rectangular shape in plan view, for example, so that there is a portion overlapping the current collector film 309 when viewed from a direction perpendicular to the surface of the substrate SB1. The current collector film 309 and the electrode film 308 are brought into contact with each other and electrically connected at the overlapping portions.

Figure 13A:
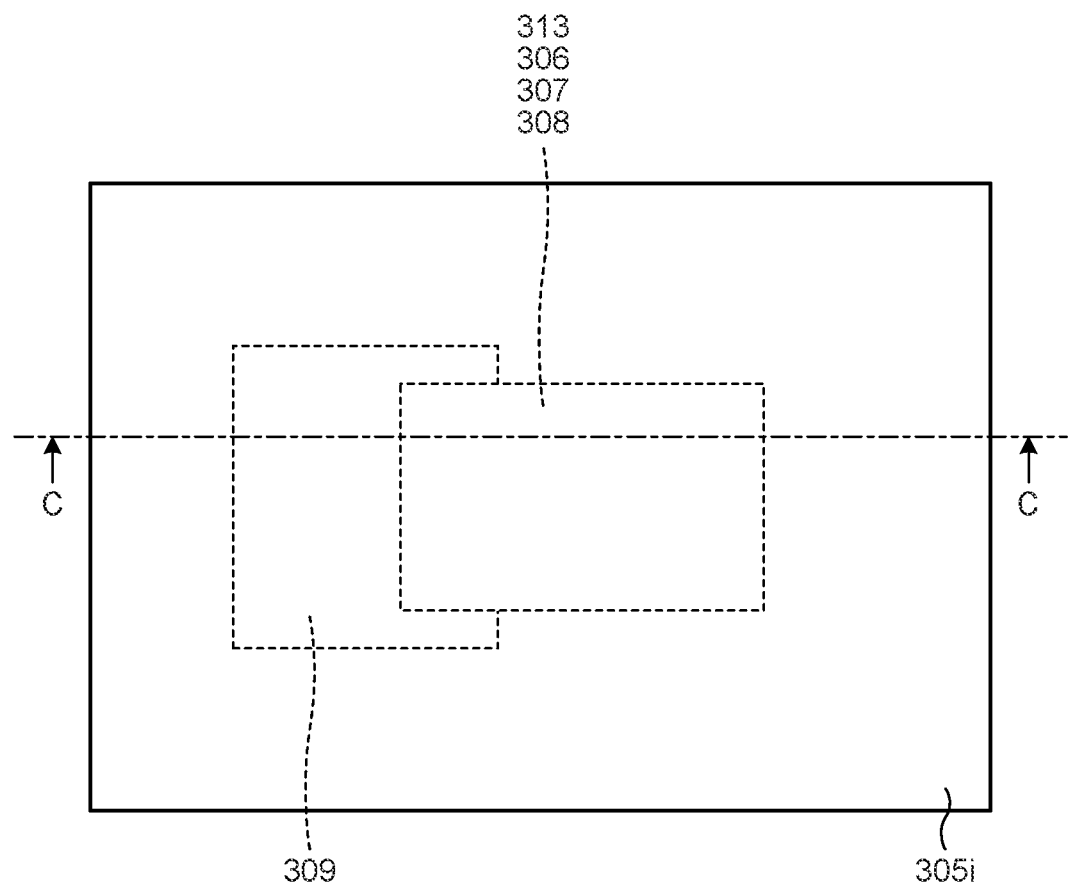
FIG. 13A is a diagram illustrating a method of manufacturing a nonvolatile memory device.
Figure 13B:
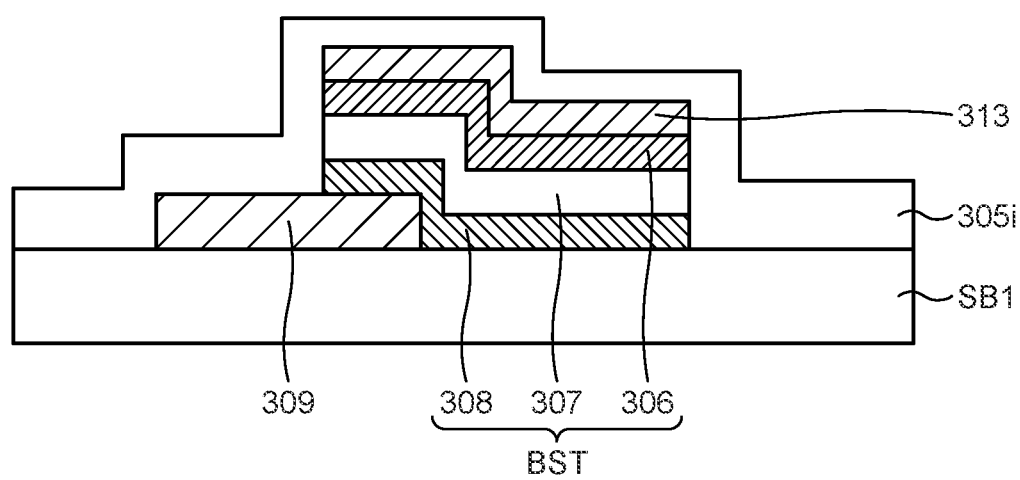
FIG. 13B is a diagram illustrating a method of manufacturing a nonvolatile memory device.

A tunnel insulating film 305$i$ is then formed by, for example, a CVD method (FIGS. 13A and 13B). The tunnel insulating film 305$i$ may be formed of a material mainly composed of silicon oxide, or may be formed of a material mainly composed of another oxide. The tunnel insulating film 305$i$ covers the exposed surface of the current collector film 309, the surface of the current collector film 313, and the surface of the substrate SB1.

Figure 13C:
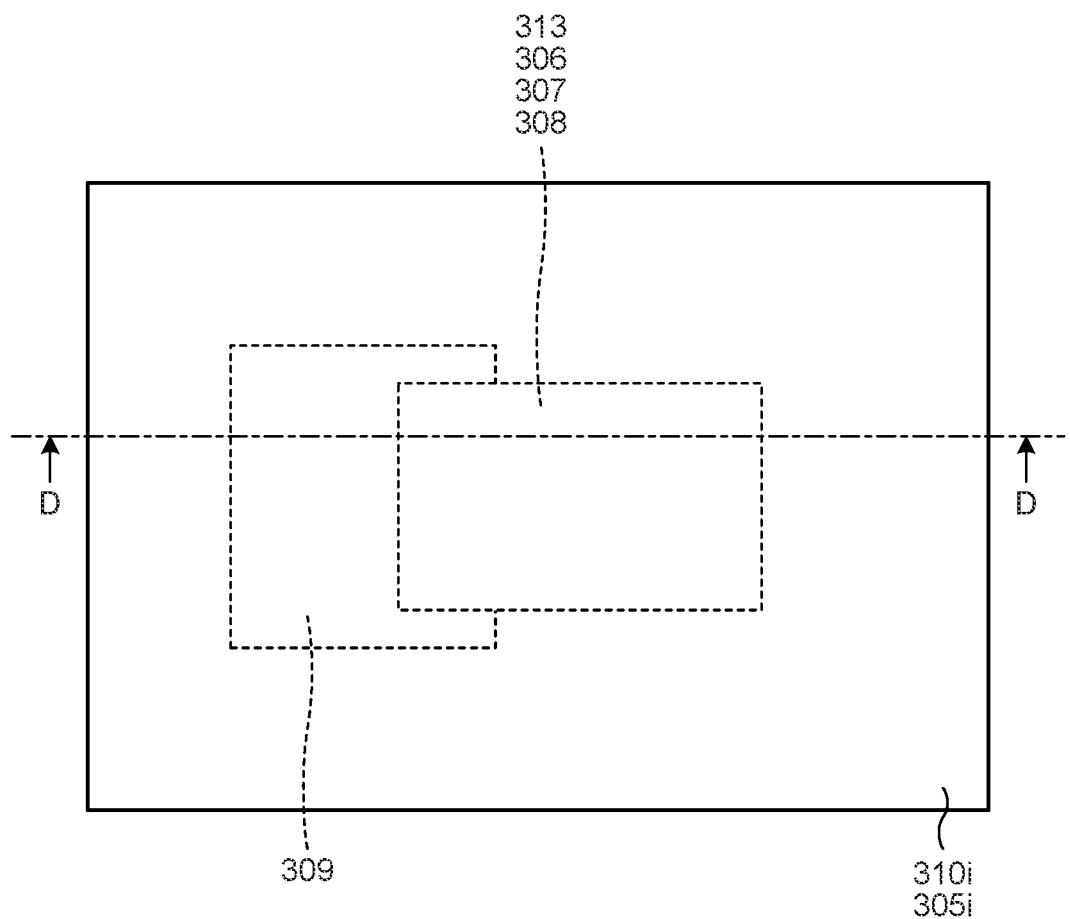
FIG. 13C is a diagram illustrating a method of manufacturing a nonvolatile memory device.
Figure 13D:
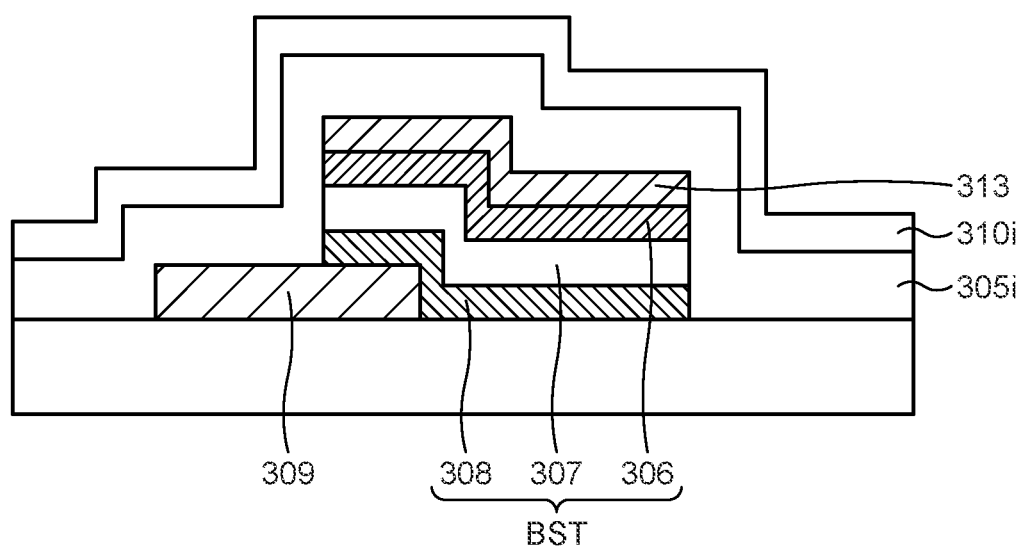
FIG. 13D is a diagram illustrating a method of manufacturing a nonvolatile memory device.
Figure 14A:
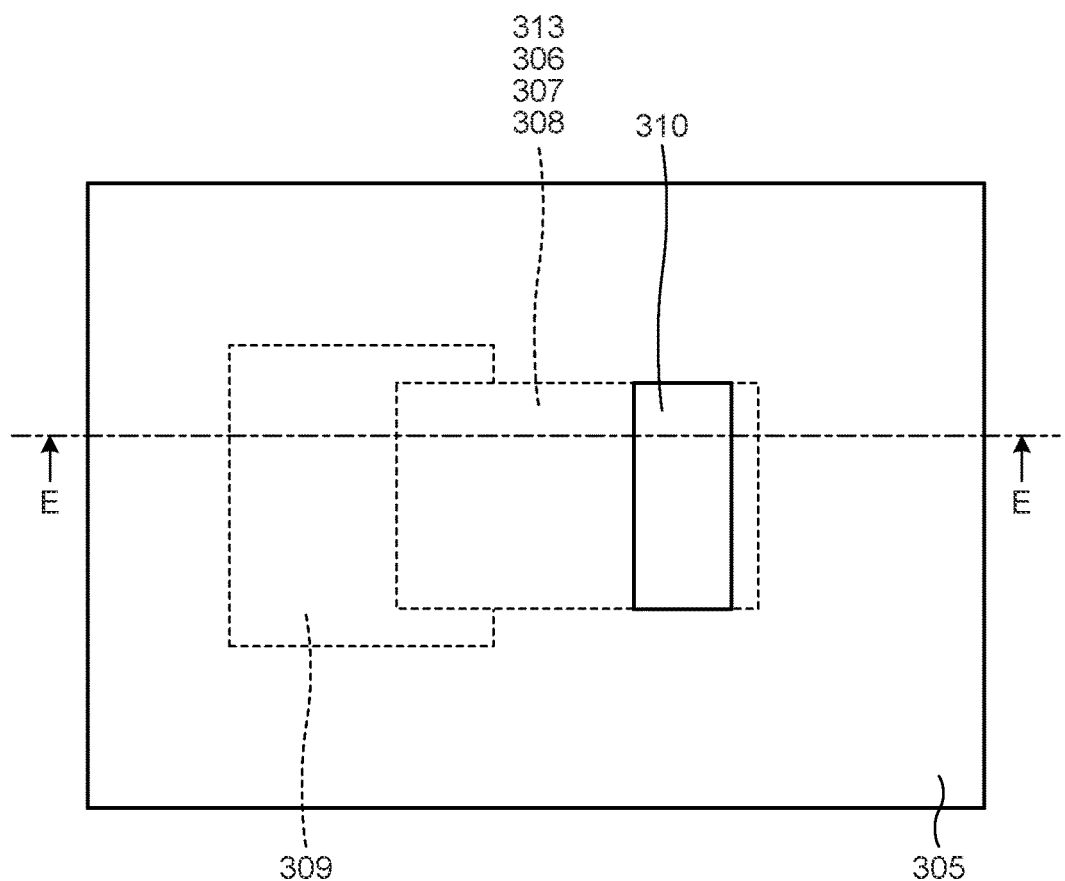
FIG. 14A is a diagram illustrating a method of manufacturing a nonvolatile memory device.
Figure 14B:
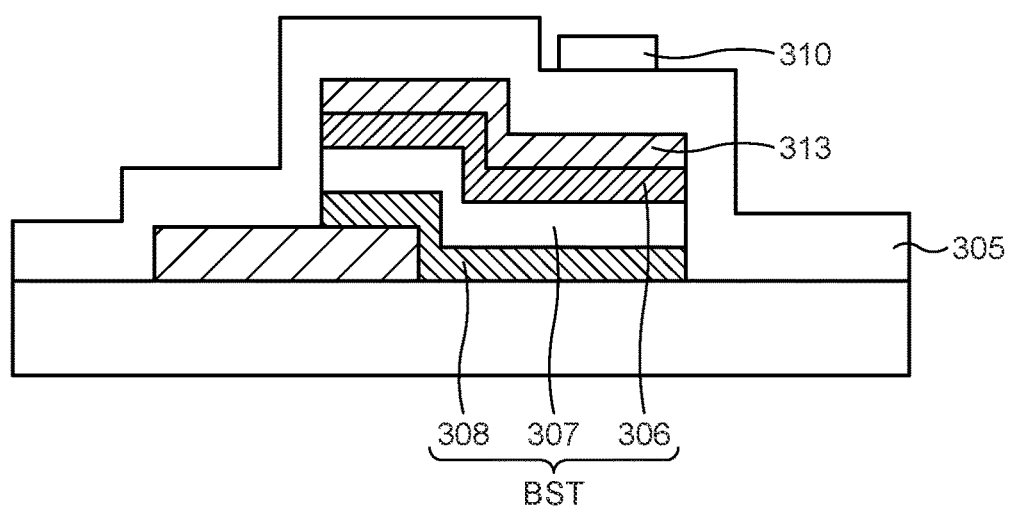
FIG. 14B is a diagram illustrating a method of manufacturing a nonvolatile memory device.
Figure 14C:
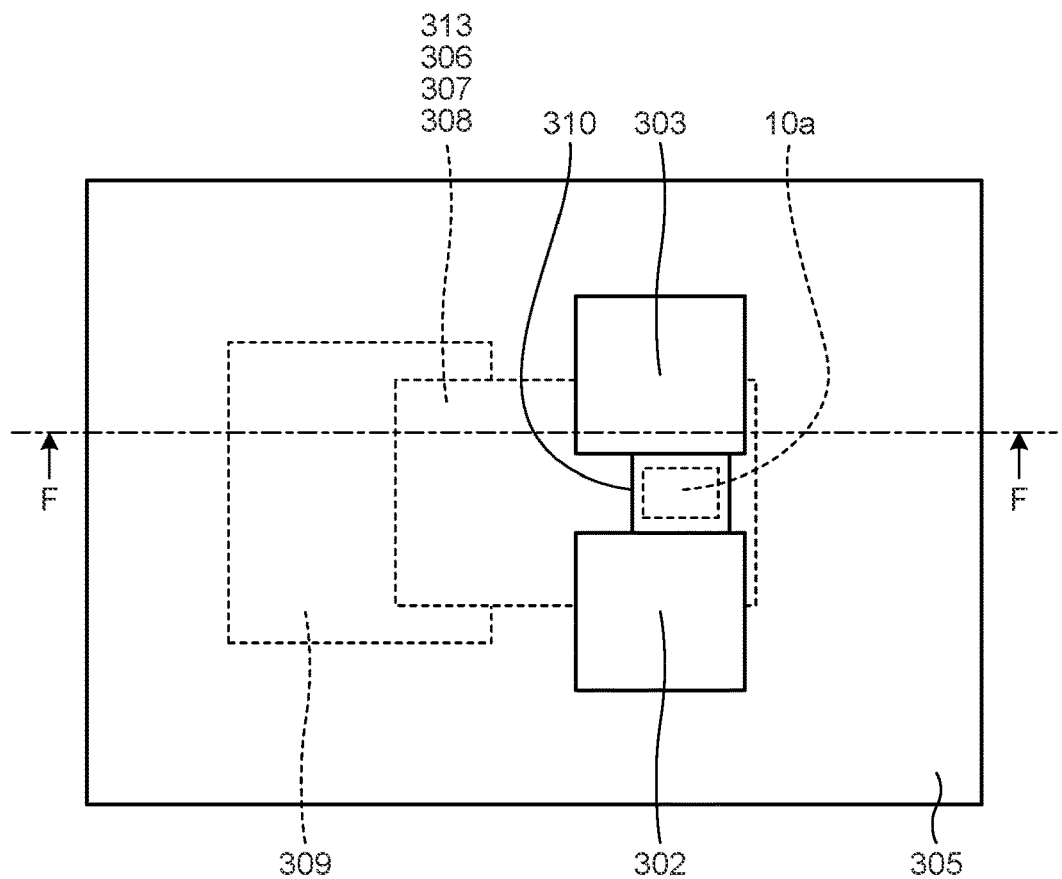
FIG. 14C is a diagram illustrating a method of manufacturing a nonvolatile memory device.
Figure 14D:
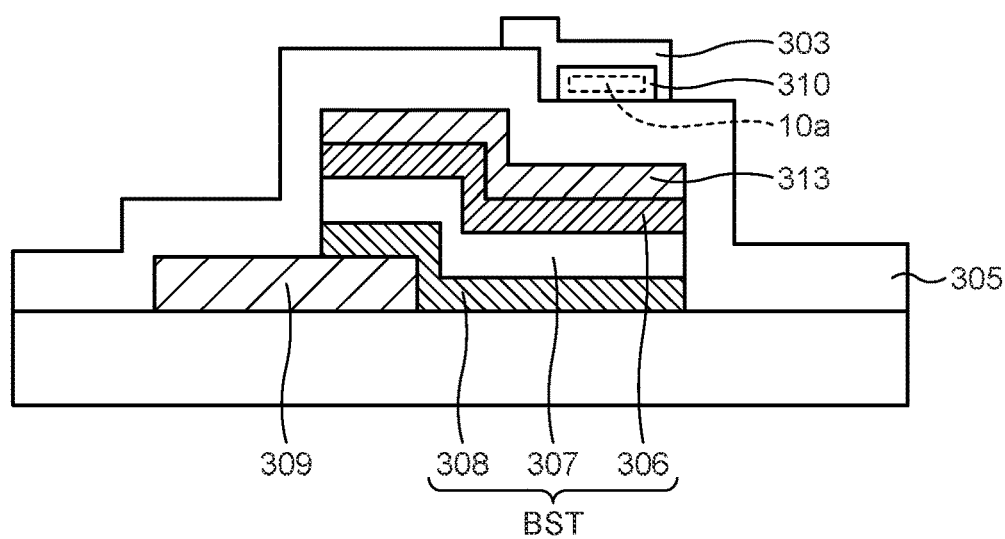
FIG. 14D is a diagram illustrating a method of manufacturing a nonvolatile memory device.
Figure 15A:
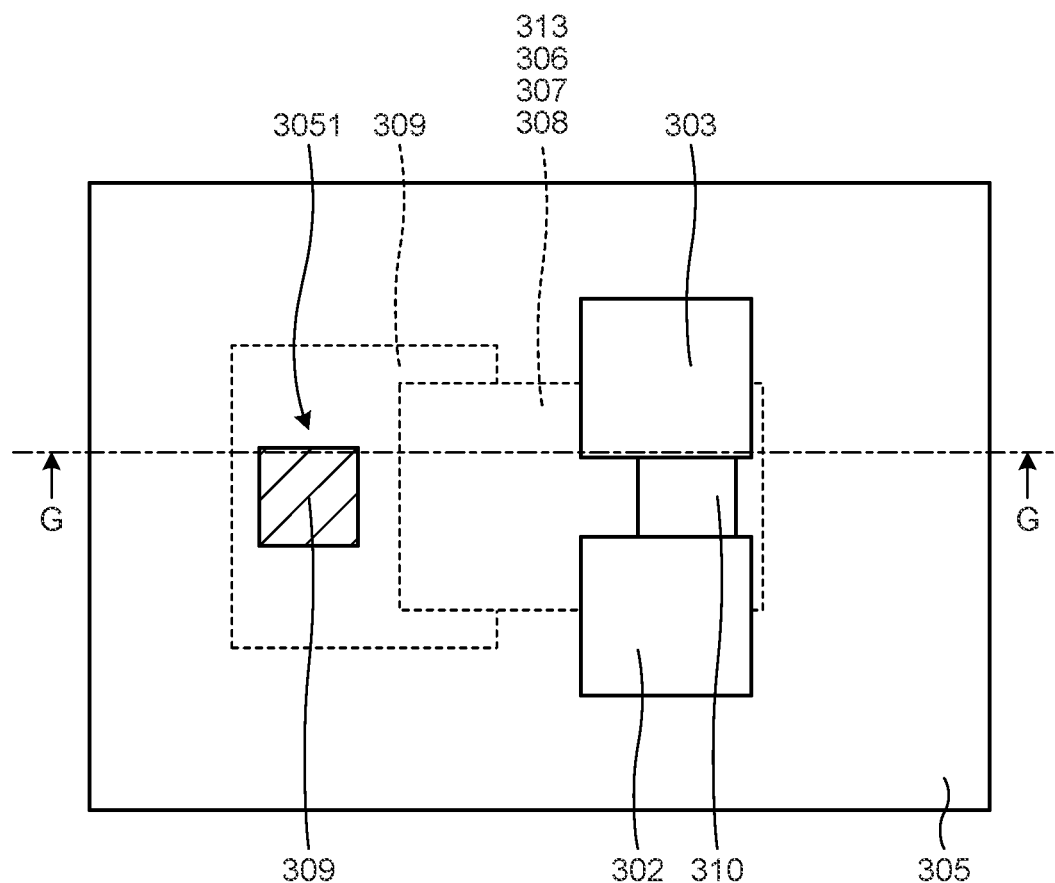
FIG. 15A is a diagram illustrating a method of manufacturing a nonvolatile memory device.
Figure 15B:
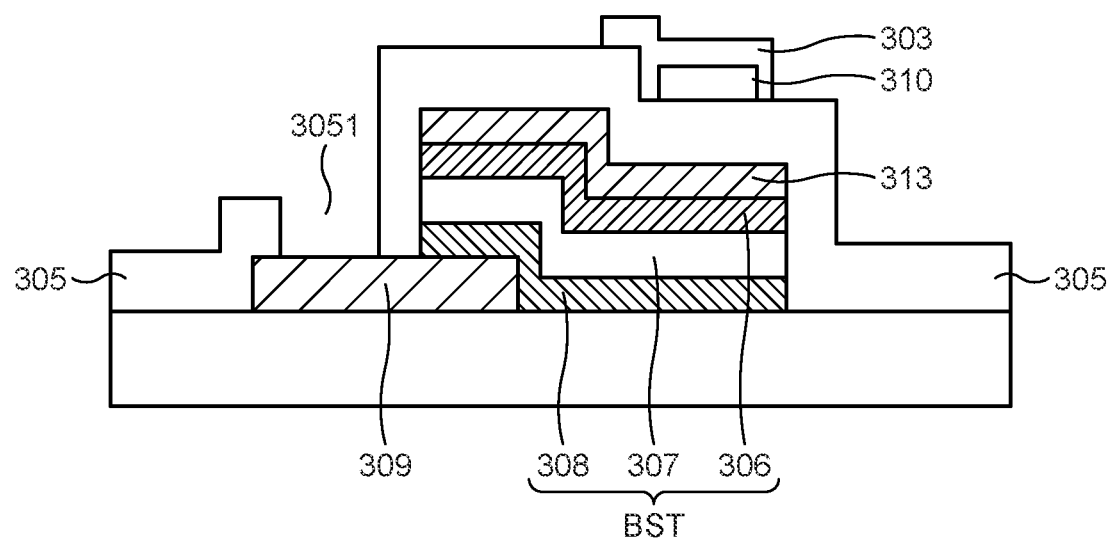
FIG. 15B is a diagram illustrating a method of manufacturing a nonvolatile memory device.
Figure 15C:
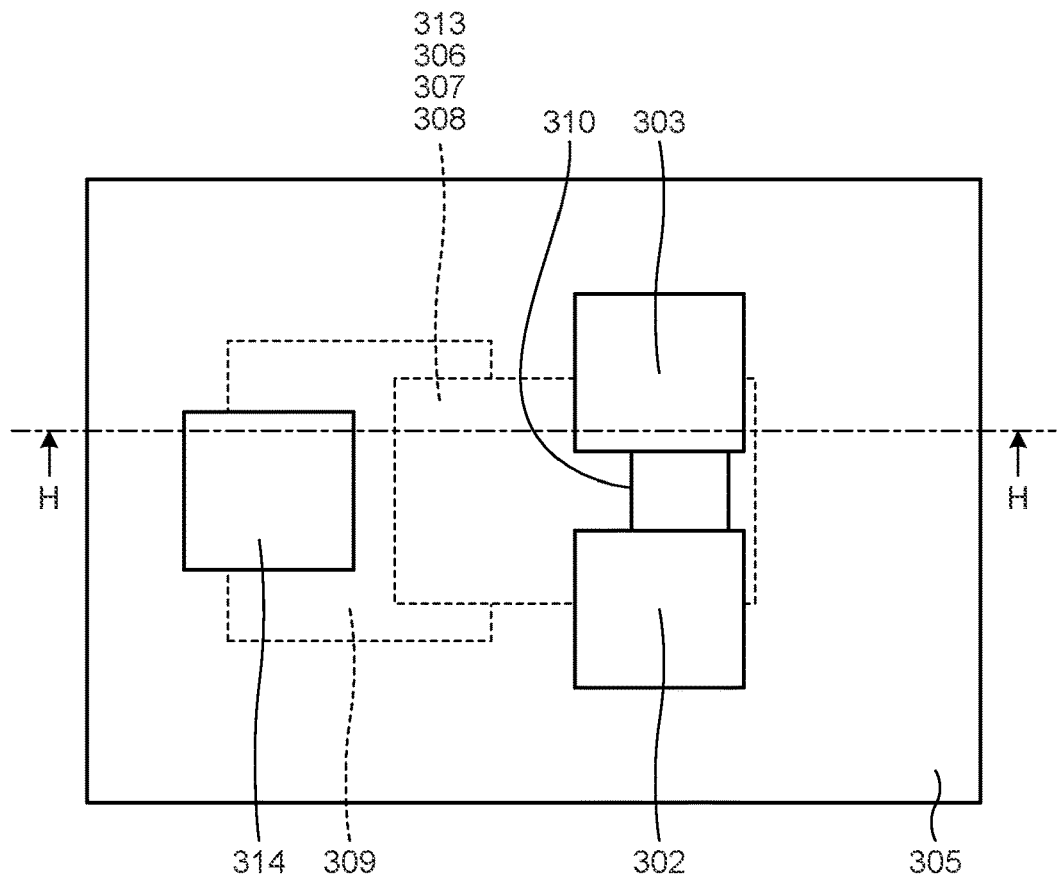
FIG. 15C is a diagram illustrating a method of manufacturing a nonvolatile memory device.
Figure 15D:
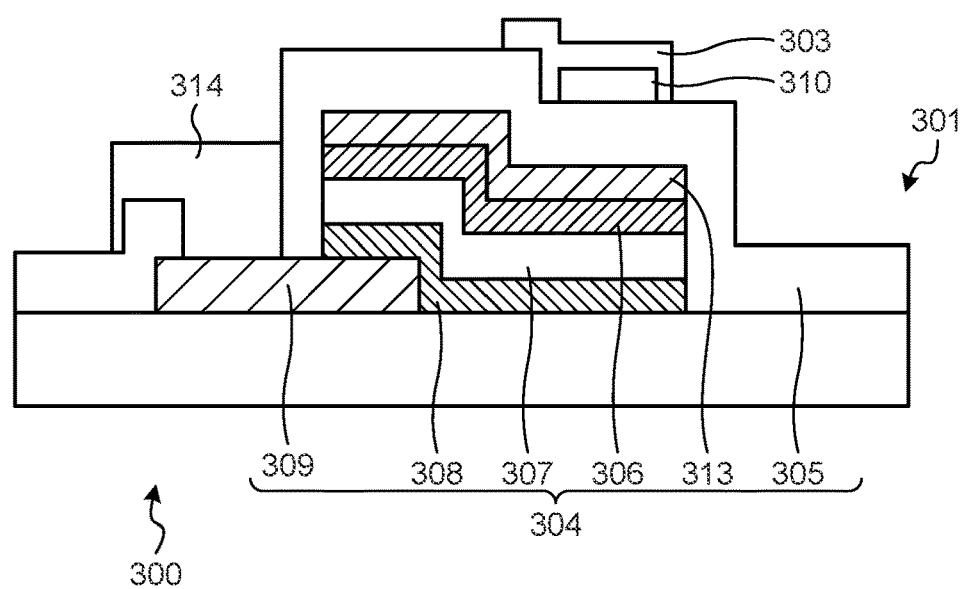
FIG. 15D is a diagram illustrating a method of manufacturing a nonvolatile memory device.

Further, a semiconductor film 310$i$ is formed by, for example, a CVD method to cover the stacked films of the current collector film 309, the battery structure BST, the current collector film 313, and the tunnel insulating film 305$i$ (FIGS. 13C and 13D). The semiconductor film 310$i$ is a semiconductor film to be a channel region 10$a$. The semiconductor film 310 is processed into a predetermined shape (e.g., substantially rectangular in plan view) by a method such as lithography and etching (FIGS. 14A and 14B). The semiconductor film 310 is processed into a shape that partially covers the battery structure (the electrode film 308, the ion conductor film 307, and the electrode film 306) via, for example, the tunnel insulating film 305 and the current collector film 313. Further, a semiconductor film to be a source electrode and a drain electrode is formed. The semiconductor film is processed into a source electrode 302 and a drain electrode 303 by a method such as lithography and etching. The source electrode 302 and the drain electrode 303 are each processed into a shape (e.g., substantially rectangular in plan view) that partially cover the semiconductor film 310. The source electrode 302 and the drain electrode 303 are patterned in such a position that the source electrode and the drain electrode are in contact with both longitudinal ends of the semiconductor film 310 and sandwich the battery structure via the tunnel insulating film 305 (FIGS. 14C and 14D). A region in the semiconductor film 310 between the source electrode 302 and the drain electrode 303 serves as a channel region 10$a$. On the other hand, with respect to the current collector film 309, the tunnel insulating film in a portion not overlapping the battery structure (the electrode film 308, the ion conductor film 307, and the electrode film 306) is partially removed to form a contact hole 3051 (FIGS. ISA and 15E), and a part of the surface of the current collector film 309 is exposed. A conductive material is embedded in the contact hole 3051 to generate a gate contact electrode 314 (FIGS. 15C and 15D). Thus, a transistor 301 having a gate electrode 304 in which the current collector film 309, the electrode film 308, the ion conductor film 307, the electrode film 306, the current collector film 313 and the tunnel insulating film 305 are stacked is constituted of a thin-film transistor structure.

As described above, in the third embodiment, each transistor 301 in the nonvolatile memory device 300 is constituted of a thin-film transistor structure. The gate electrode 304 of each transistor 301 includes a battery structure (the electrode film 308, the ion conductor film 307, and the electrode film 306). Such a configuration also allows the transistor 301 to store continuous analog information by the battery electromotive force, and to express information with high accuracy. The transistor 301 can write information with a small voltage and current, and thus can easily reduce power consumption.

Fourth Embodiment

A nonvolatile memory device according to a fourth embodiment will then be described. In the following, the description will be focused on parts different from the first to third embodiments.

In the fourth embodiment, the battery structure BST is multi-layered in a gate electrode 404 of each transistor 401 of a nonvolatile memory device 400, thereby aiming at high accuracy of storage voltage control.

Figure 16:
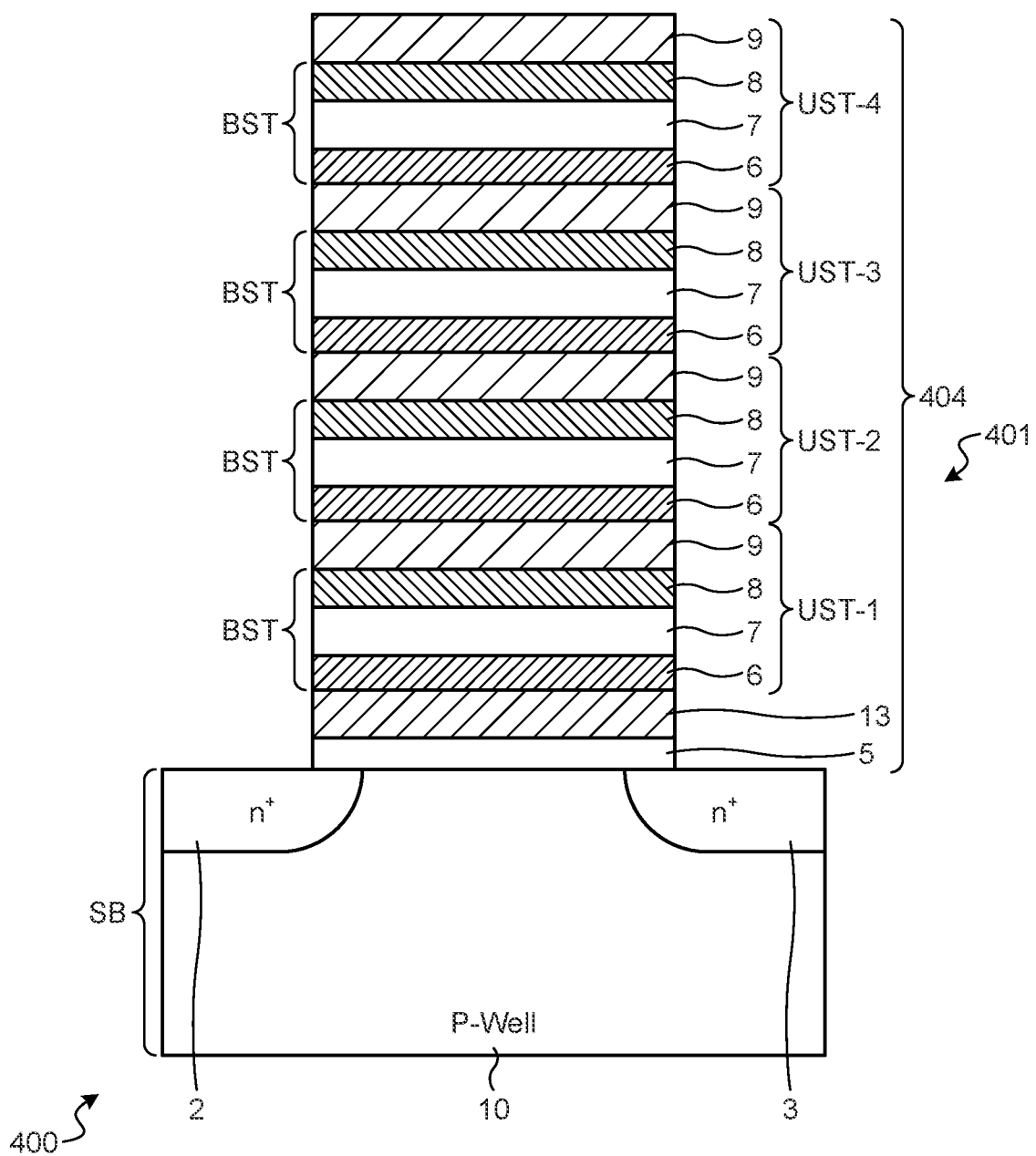
FIG. 16 is a diagram illustrating a transistor according to a fourth embodiment.

In each transistor 401 of the nonvolatile memory device 400, as illustrated in. FIG. 16, unit structures UST-1 to UST-4 are periodically and. repeatedly stacked on the tunnel insulating film 5 and the current collector film 13 to constitute a gate electrode 404. In FIG. 16, a configuration in which the number of stacking. cycles of the unit structure UST is 4 is illustrated, but the number may be 2, 3, or 5 or more. Each unit structure UST has the electrode film 6, the ion conductor film 7, the electrode film 8, and the current collector film 9 stacked in order from the substrate SB side. In other words, each unit structure UST has the battery structure BST and the current collector film 9 stacked in order from the substrate SB side. The current collector film 13 is disposed between the lowest unit structure UST (In FIG. 16, the unit structure UST-1) of the gate electrode 404 and the tunnel insulating film 5.

In the gate electrode 404, since a plurality of battery structures BST are equivalently connected in series between the tunnel insulating film 5 and the uppermost current collector film 9, a large electromotive force can be obtained as a whole even when the electromotive force of each battery structure BST is small. In the gate electrode 404, since the storage voltage can be adjusted for each electromotive force in each cycle, the voltage can be written with high accuracy. Employing a multi-period structure allows the variation per period to be averaged, and. the influence of the variation in the electromotive force of the battery structure BST to be reduced as a whole.

In the gate electrode 404, since the current collector films 9 of the unit structures UST-1 to UST-3 have conductivity, the interfaces of the upper sides of the unit structures UST with the electrode films 6 can be equipotential surfaces, and contact potential differences can be formed at the interfaces of the upper sides of the unit structures UST with the electrode films 6. The contact potential difference can be formed such that the potential of the electrode film 6 is lower than the potential of the current collector film 9 with respect to electrons. Thus, the spatial deviation of the ion current and the tunneling current between the ion conductor film 7 and the electrode film 6 can be reduced, and when electrons are drawn into the current collector film 9, the electrons can. be efficiently guided to the electrode films 6 existing the upper sides of the unit structures UST.

Similarly, since the current collector film 13 has conductivity, the interface of the current collector film 13 with the electrode film 6 of the unit structure UST-1 can be an equipotential surface, and a contact. potential difference can be formed at the interface of the current collector film 13 with the electrode film 6 of the unit structure UST-1. The contact potential difference can. be formed such that the potential of the electrode film 6 is lower than the potential of the current collector film 13 with respect to electrons. Thus, the spatial deviation. of the ion current and the tunneling current between the ion conductor film 7 and the electrode film 6 can be reduced, and when electrons are drawn into the current collector film 13, the electrons can be efficiently guided to the electrode film 6 of the unit structure UST-1.

As described above, in the fourth embodiment, the battery structure BST is multi-layered in the gate electrode 404 of each transistor 401 of the nonvolatile memory device 400. Thus, as a whole, the influence of the variation in electromotive force of the battery structure BST can be reduced, and the storage voltage control of each. transistor 401 can be made highly accurate.

Fifth Embodiment

A nonvolatile memory device according to a fifth embodiment will then be described. In the following, the description will be focused on parts different from the first to fourth embodiments.

The fifth embodiment illustrates, as a configuration example of a nonvolatile memory device 500, a configuration. in which Schottky barrier diodes SD-1 to SD-4 are disposed on the side opposite to the gate electrodes 404 with respect to channel regions 510a of transistors 501-1 and 501-2.

Figure 17:
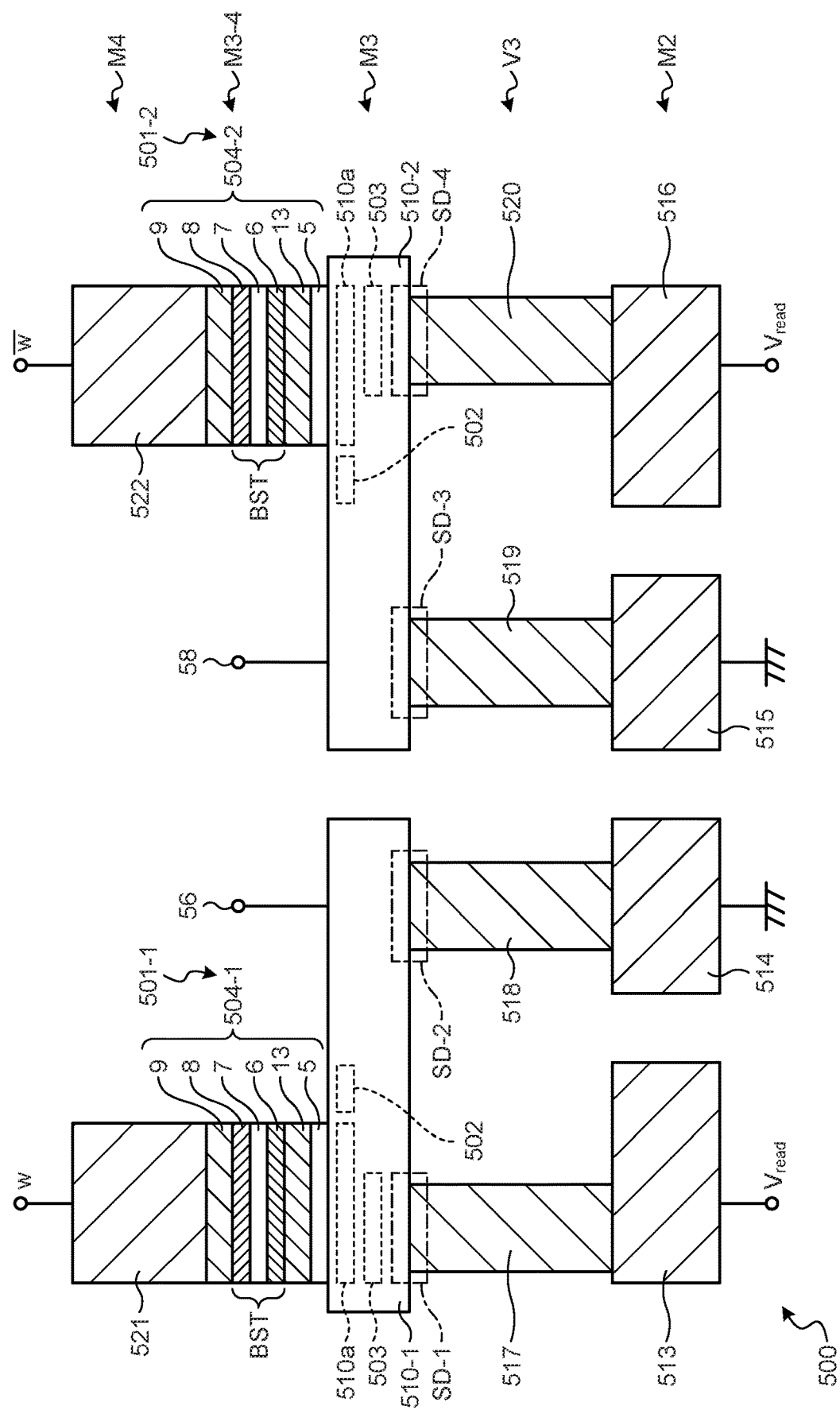
FIG. 17 is a cross-sectional view illustrating a nonvolatile memory device according to a fifth embodiment.

As illustrated FIG. 17, the nonvolatile memory device 500 has a wiring layer M2, a plug layer V3, a wiring layer M3, a gate electrode layer M3-4, and a wiring layer M4 sequentially stacked above a substrate (not illustrated). The wiring layer M2 includes conductive films 513 to 516. The plug layer V3 includes conductive plugs 517 to 520. The wiring layer M3 includes semiconductor films 510-1 and 510-2. The gate electrode layer M3-4 includes gate electrodes 404-1 and. 504-2. The wiring layer M4 has semiconductor films 521 and. 522. FIG. 17 is a cross-sectional view illustrating the nonvolatile memory device 500. In FIG. 17, an interlayer insulating film. is omitted. for simplification of illustration.

The conductive films 513 to 516 are electrically insulated from each other via an interlayer insulating film. The conductive films 513 to 516 are each formed of a conductive material such as metal, and can be formed of, for example, a stacked film of a Ti film and an Al film. The conductive films 513, 514, 515 and 516 each have an upper face connected to the lower end of the conductive plugs 517, 518, 519 and 520 and are each electrically connected to the conductive plugs 517, 518, 519 and 520. The conductive films 513 and 516 are supplied with a predetermined voltage Vread, and the conductive films 514 and 515 are supplied with a ground potential.

The conductive plugs 517 to 520 are electrically insulated from each other via an interlayer insulating film. The conductive plugs 517 to 520 are each formed of a conductive material such as metal, and can be formed of, for example, a film mainly composed of W. The conductive plugs 517 and 518 each have an upper end connected to the semiconductor film 510-1 and are electrically. connected. to the semiconductor film 510-1. The conductive plugs 519 and 520 each have an upper end connected to the semiconductor film 510-2 and are electrically connected to the semiconductor film 510-2.

A region near the junction interface between. the upper end. of the conductive plug 517 and the semiconductor film 510-1 constitutes a Schottky barrier diode SD-1. The Schottky barrier diode SD-1 is disposed on the side opposite to the gate electrode 504-1 with respect to the channel region 510a of the transistor 501-1. It is assumed that the Schottky barrier diode SD-1 has a forward direction from the conductive plug 517 toward the semiconductor film 510-1.

A region near the junction interface between the upper end of the conductive plug 518 and the semiconductor film 510-1 constitutes a Schottky barrier diode SD-2. The Schottky barrier diode SD-2 is disposed. on. the side opposite to the gate electrode 504-1 with respect to the channel region 510a of the transistor 501-1. It is assumed that the Schottky barrier diode SD-2 has a forward direction from the conductive plug 518 toward the semiconductor film 510-1.

A region near the junction interface between the upper end of the conductive plug 519 and the semiconductor film 510-2 constitutes a Schottky barrier diode SD-3. The Schottky barrier diode SD-3 is disposed on the side opposite to the gate electrode 504-2 with respect to the channel region 510a of the transistor 501-2. It is assumed that the Schottky barrier diode SD-3 has a forward direction from the conductive plug 519 toward the semiconductor film 510-2.

A region near the junction interface between the upper end of the conductive plug 520 and the semiconductor film 510-2 constitutes a Schottky barrier diode SD-4. The Schottky barrier diode SD-4 is disposed on the side opposite to the gate electrode 504-2 with respect to the channel region 510a of the transistor 501-2. it is assumed that the Schottky barrier diode SD-4 has a forward direction from the conductive plug 520 toward the semiconductor film 510-2.

The semiconductor films 510-1 and 510-2 are electrically insulated from each other via an interlayer insulating film. The semiconductor films 510-1 and 510-2 are each formed of a semiconductor to which conductivity is imparted. The semiconductor films 510-1 and 510-2 are each formed of, for example, a semiconductor (e.g., silicon), and have regions except for source regions 502 and drain regions 503, where contain second conductivity type impurities. If the second conductivity type is p-type, the second conductivity type impurity may be an acceptor such as boron.

The semiconductor film 510-1 extends in the planar direction and connects a plurality of conductive plugs 517 and 518 in parallel. The semiconductor film 510-1 has an upper face connected to the gate electrode 404-1. The semiconductor film 510-1 has the channel region. 510a at a position adjacent to the gate electrode 404-1, and has the source region 502 and the drain region 503 adjacent to the channel region 510a. A configuration including the gate electrode 404-1, the channel region 510a, the source region 502, and the drain region 503 constitutes the transistor 501-1, The source region 502 and the drain region 503 contain first conductivity type impurities at a concentration higher than that of second conductivity type impurities in the region of the semiconductor film except for the source region 502 and the drain region 503. If the first conductivity type is n-type, the first conductivity type impurity may be a donor such as phosphorus or arsenic.

The semiconductor film 510-2 extends in the planar direction and connects a plurality of conductive plugs 519 and 520 in parallel. The semiconductor film 510-2 has an upper face connected to the gate electrode 404-2. The semiconductor film 510-2 has the channel region 510a at a position adjacent to the gate electrode 404-2, and has the source region 502 and the drain region 503 adjacent to the channel region 510a. A configuration including the gate electrode 404-2, the channel region 510a, the source region 502, and the drain region 503 constitutes the transistor 501-2. The source region 502 and the drain region 503 contain first conductivity type impurities at a concentration higher than that of second conductivity type impurities in the region of the semiconductor film except for the source region 502 and the drain region 503. If the first conductivity type is n-type, the first conductivity type impurity may be a donor such as phosphorus or arsenic.

The gate electrodes 404-1 and 504-2 each have a layer configuration similar to that of the gate electrode 4 of the first embodiment. Each gate electrode 404 has the tunnel insulating film 5, the current collector film 13, the electrode film 6, the ion conductor film 7, the electrode film 8, and the current collector film 9 stacked in order from the semiconductor film 510 side. The tunnel insulating film 5 covers the upper face of the semiconductor film 510. The battery structure EST is constituted of a stacked film of the electrode film 6, the ion conductor film 7, and the electrode film 8. The current collector films 9 of the gate electrode 404-1 and 504-2 are in contact with the lower faces of the semiconductor films 521 and 522, respectively.

The semiconductor films 521 and 522 are electrically insulated from each other via an interlayer insulating film. The semiconductor films 521 and 522 are each formed of a semiconductor to which conductivity is imparted. The semiconductor films 521 and 522 are each formed of, for example, a semiconductor (e.g., silicon), and each contain a second conductivity type impurity. If the second conductivity type is p-type, the second conductivity type impurity may be an acceptor such as boron. The semiconductor film 521 is supplied with a voltage corresponding to a weight w, and the semiconductor film 522 is supplied with a voltage corresponding to a weight $w^-$.

Figure 18:
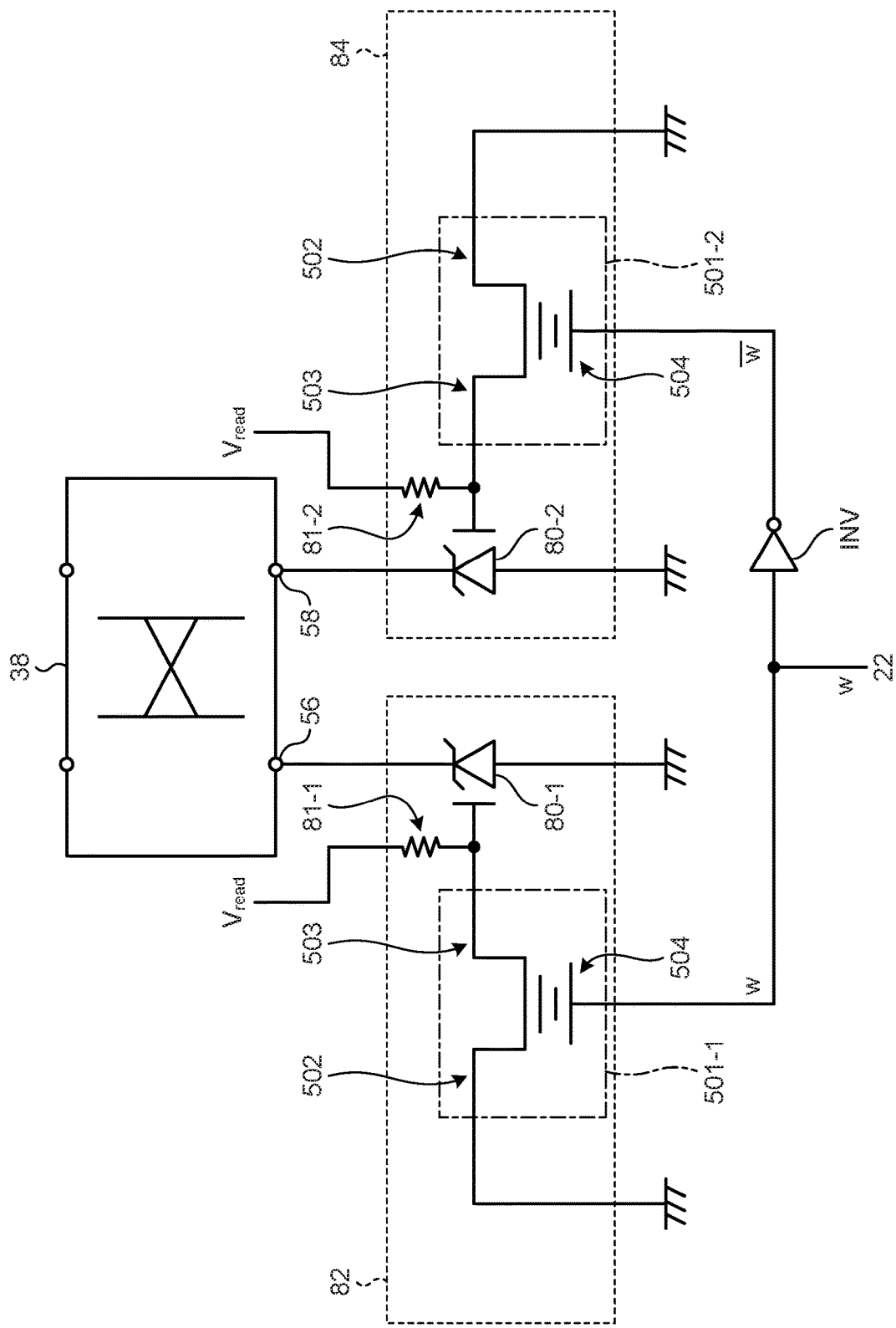
FIG. 18 is a circuit diagram of a nonvolatile memory device.

The equivalent circuit for the structure of FIG. 17 can be constituted as illustrated in FIG. 18. FIG. 18 is a circuit diagram illustrating the nonvolatile memory device 500. As illustrated in FIG. 18, the nonvolatile memory device 500 has a first constant current source 82, a second constant current source 84, and a cross switch 38. The first constant current source 82 has a transistor 501-1, a Schottky barrier diode 80-1, and a resistance element 81-1. The second constant current source 84 has a transistor 501-2, a Schottky barrier diode 80-2, and a resistance element 81-2.

The Schottky barrier diodes SD-1 and SD-4 illustrated in FIG. 17 are each applied with a forward bias and function equivalently as resistance elements 81-1 and 81-2. The Schottky barrier diodes SD-2 and SD-3 are each applied with a reverse bias and function equivalently as Schottky barrier diodes 80-1 and 80-2 which can be constant current sources.

Each Schottky barrier diode 80 is a diode utilizing a Schottky barrier generated by a junction between a metal and a semiconductor. The Schottky barrier diode 80-1 included in the first constant current source 82 is connected so that a reverse bias is applied between a positive output terminal 56 of the cross switch 38 and a reference potential (e.g., a ground potential). The Schottky barrier diode 80-2 included in the second constant current source 84 is connected so that a reverse bias is applied between a negative output terminal 58 of the cross switch 38 and a reference potential (e.g., a ground potential). For example, when the power supply voltage (Vdd) is higher than the reference potential, the Schottky barrier diode 80 has a cathode connected to the positive output terminal 56 or the negative output terminal 58, and an anode connected to the reference potential.

Figure 19:
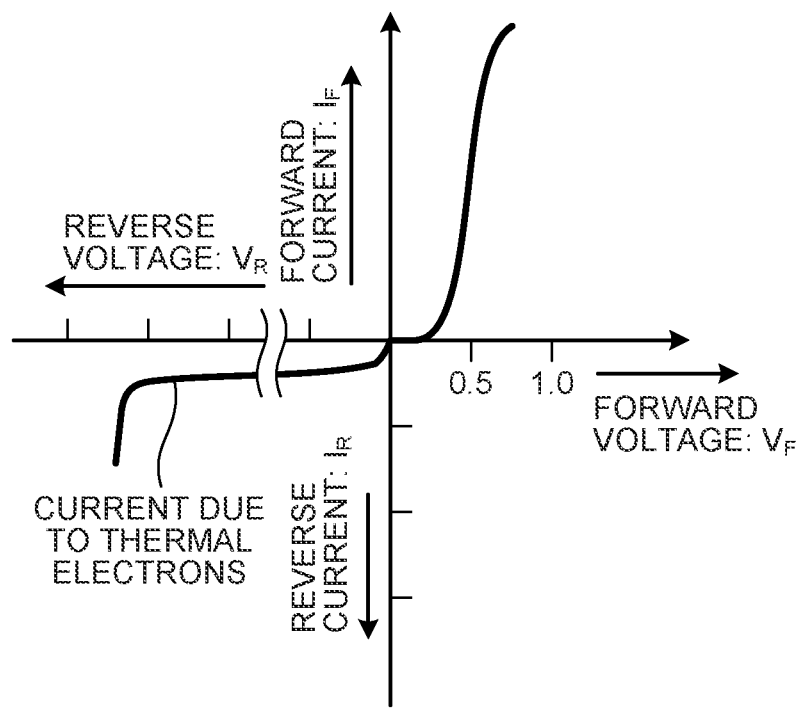
FIG. 19 is a diagram illustrating characteristics of a Schottky barrier diode.

The Schottky barrier diode 80 has, for example, voltage-current characteristics as illustrated in FIG. 19. In the Schottky barrier diode 80 illustrated in FIG. 18, when a reverse bias is applied, a current due to thermal electrons can flow from the cathode to the anode. The Schottky barrier diode 80 has a larger leakage current flowing in the reverse direction than the PN junction diode, but the variation of the leakage current with respect to the reverse voltage is relatively small. Therefore, the Schottky barrier diode 80 can pass a relatively small constant current by being connected so as to apply a reverse bias. In other words, the Schottky barrier diode 80 can be used as a constant current source for passing a constant current by being connected so as to apply a reverse bias.

In the present embodiment, the Schottky barrier diode 80 has a gate terminal. The gate terminal is a terminal for applying a back bias voltage to the substrate. In the Schottky harrier diode 80, the magnitude of the leakage current changes according to the height of the Schottky barrier between the metal and the semiconductor. In the Schottky barrier dodder 80, the height of the Schottky barrier changes according to the change in the back bias voltage applied to the gate terminal. Therefore, when the Schottky barrier diode 80 is used as a constant current source by being connected so as to apply a reverse bias, the Schottky barrier diode can change the amount of current flowing according to the change in the back bias voltage.

The transistor 501-1 is supplied with the weight w, and the transistor 501-2 is supplied with the weight $w^-$ where the weight w is logically inverted by an inverter INV.

In the transistor 501-1, a gate voltage $V_G$ corresponding to the weight w is applied to the gate electrode 404, and an on-resistance Ron corresponding to the gate voltage $V_G$ appears between the source electrode 502 and the drain electrode 503 (see FIG. 6). Accordingly, a voltage $V_D$ obtained by dividing the predetermined voltage Vread by the resistance value of the resistance element 81-1 and the on-resistance Ron of the transistor 501-1 is applied to the gate terminal of the Schottky barrier diode 80-1, whereby the amount of current as a constant current source of the Schottky barrier diode 80-1 is adjusted.

Similarly, in the transistor 501-2, a gate voltage $V_G$ corresponding to the weight $w^-$ is applied to the gate electrode 404, and an on-resistance Ron corresponding to the gate voltage $V_G$ appears between the source electrode 502 and the drain electrode 503 (see FIG. 6). Accordingly, a voltage $V_D$ obtained by dividing the predetermined voltage Vread by the resistance value of the resistance element 81-2 and the on-resistance Ron of the transistor 501-2 is applied to the gate terminal of the Schottky barrier diode 80-2, whereby the amount of current as a constant current source of the Schottky barrier diode 80-2 is adjusted.

For example, in the first constant current source 82, when $V_D$=a first voltage value ($V_1$) is applied to the gate terminal according to the weight w=$w_1$, the Schottky barrier diode 80 flows a current of a first current value ($I_1$). Therefore, when the first voltage value ($V_1$) is applied to the gate terminal, the Schottky barrier diode 80 can draw the current of the first current value ($I_1$) out from the positive output terminal 56 of the cross switch 38.

In such a case, in the second constant current source 62, when $V_D$=a second voltage value ($V_2$) is applied to the gate terminal according to the weight $w^-$=$w_2$, the Schottky barrier diode 80 flows a current of a second current value ($I_2$). It is assumed that $w_2$ is a logically inverted value for $w_1$. For example, $w_1$=0 and $w_2$=1. Therefore, when the second voltage value ($V_2$) is applied to the gate terminal, the Schottky barrier diode 80 can draw the current of the second current value ($I_2$) out from the negative output terminal 58 of the cross switch 38.

In the first constant current source 82, when $V_D$=a second voltage value ($V_2$) is applied to the gate terminal according to the weight w=$w_2$, the Schottky barrier diode 80 flows a current of a second current value ($I_2$). Therefore, when the second voltage value ($V_2$) is applied to the gate terminal, the Schottky barrier diode 80 can draw the current of the second current value ($I_2$) out from the negative output terminal 58 of the cross switch 38.

In such a case, in the second constant current source 62, when $V_D$=a first voltage value ($V_1$) is applied to the gate terminal according to the weight $w^-$=$w_1$, the Schottky barrier diode 80 flows a current of a first current value ($I_1$). Therefore, when the first voltage value ($V_1$) is applied to the gate terminal, the Schottky barrier diode 80 can draw the current of the first current value ($I_1$) out from the positive output terminal 56 of the cross switch 38.

In other words, the transistor 501-1 of the first constant current source 82 and the transistor 501-2 of the second constant current source 84 are operated in a logically inverted manner.

The first constant current source 82 and the second constant current source 84 can switch between a first state in which the first constant current source 82 flows the current of the first current value ($I_1$) and the second constant current source 84 flows the current of the second current value ($I_2$) and a second state in which the first constant current source 82 flows the current of the second current value ($I_2$) and the second constant current source 84 flows the current of the first current value ($I_1$) according to the value of the corresponding weight w. In other words, the circuit of FIG. 18 can store and hold the value of the weight w as the first state and the second state.

As described above, in the fifth embodiment, the nonvolatile memory device 500 is constituted by disposing the Schottky barrier diodes SD-1 to SD-4 on the side opposite to the gate electrodes 404 with respect to the channel regions 510a of the transistors 501-1 and 501-2. This configuration allows a circuit that stores and holds the value of the weight w as the first state and. the second state to be implemented.

Sixth Embodiment

A nonvolatile memory device according to a sixth embodiment will then be described. In the following, the description will be focused on parts different from the first to fifth embodiments.

The sixth embodiment illustrates, as a configuration example of the nonvolatile memory device 600, a configuration of a neural network using the transistor 1 of the first embodiment.

Figure 20:
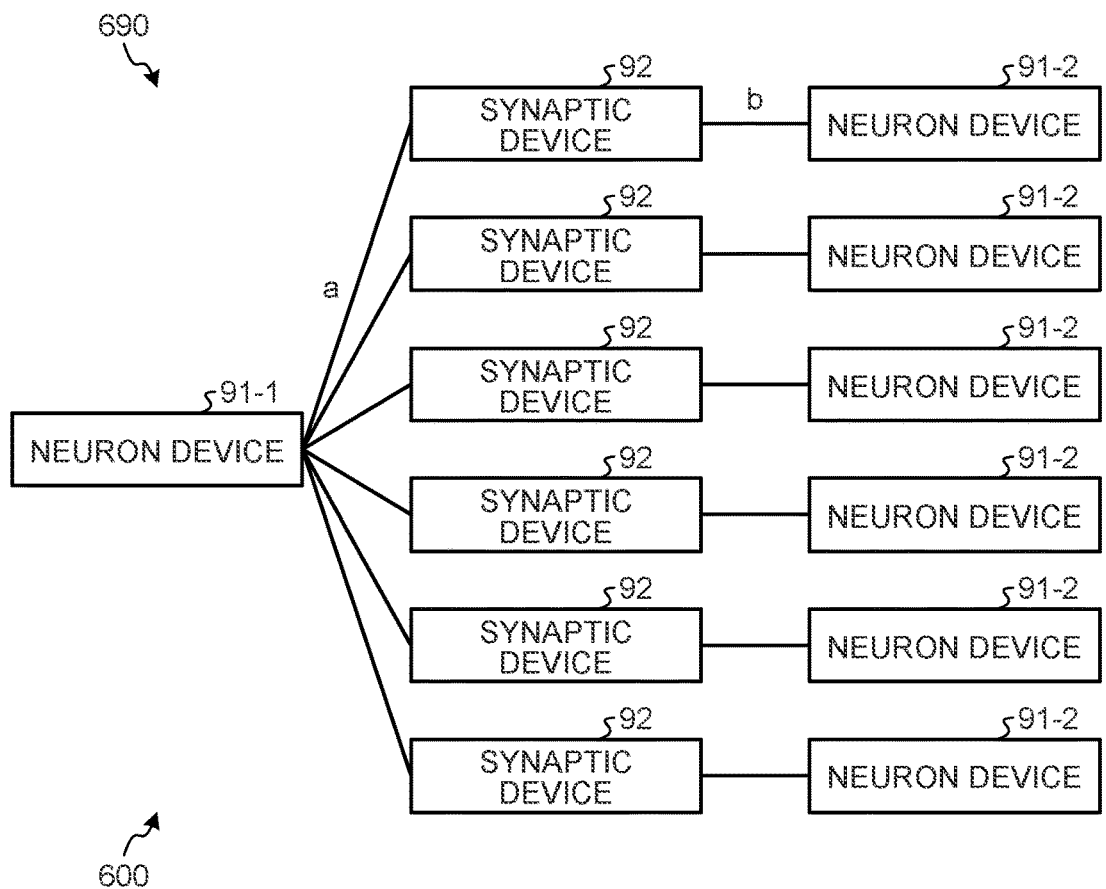
FIG. 20 is a diagram illustrating a nonvolatile memory device according to a sixth embodiment.

The nonvolatile memory device 600 can be configured in hardware as a neural network 690 as illustrated in FIG. 20. The neural network 690 is a brain-type neural network. The neural network 690 has a plurality of neuron devices 91 and a plurality of synaptic devices 92. The plurality of synaptic devices 92 is disposed between the plurality of neuron devices 91. Among the plurality of neuron devices 91, a neuron device at the preceding stage of each synaptic device 92 is denoted by 91-1, and a neuron device at the rear stage of each synaptic device 92 is denoted by 91-2. Each synaptic device 92 includes the transistor 1 (see FIG. 1), and stores a synaptic weight in the transistor 1 as analog information. The synaptic weight has a value matched to the strength of the relationship between the neuron device 91-1 and the neuron device 91-2.

When the internal potential of the neuron device 91-1 exceeds a predetermined constant value, the signal is transmitted to the synaptic device 92. The synaptic device 92 generates a signal obtained by applying a synaptic weight to a signal from the neuron device 91-1 and transmits the signal to the neuron device 91-2.

Figure 21:
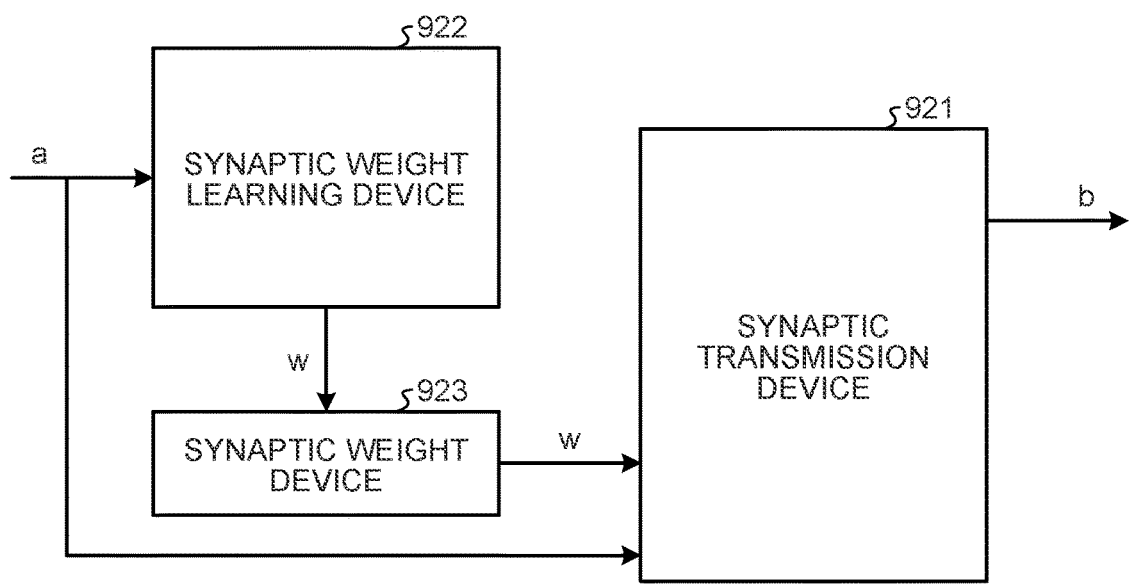
FIG. 21 is a diagram illustrating a synaptic device.

FIG. 21 is a configuration diagram of the synaptic device 92. The synaptic device 92 has a synaptic transmission device 921, a synaptic weight learning device 922, and a synaptic weight device 923. When a signal is generated by the neuron device 91-1, the signal a is sent to the synaptic transmission device 921 and the synaptic weight learning device 922. Upon receiving the signal a, the synaptic weight learning device 922 recalculates the synaptic weight W based on the information of the neuron device 91-1 or the neuron device 91-2, and sends the synaptic weight W to the synaptic weight device 923. The synaptic weight device 923 has the transistor 1. The synaptic weight device 923 stores and holds the synaptic weight W in the transistor 1 based on information from the synaptic weight learning device 922. Upon receiving the signal a, the synaptic transmission device 921 obtains the synaptic weight W from the synaptic weight device 923, applies the synaptic weight W to the signal a (e.g., by multiplying the synaptic weight W) to generate a signal b, and transmits the signal b to the neuron device 91-2.

Figure 22:
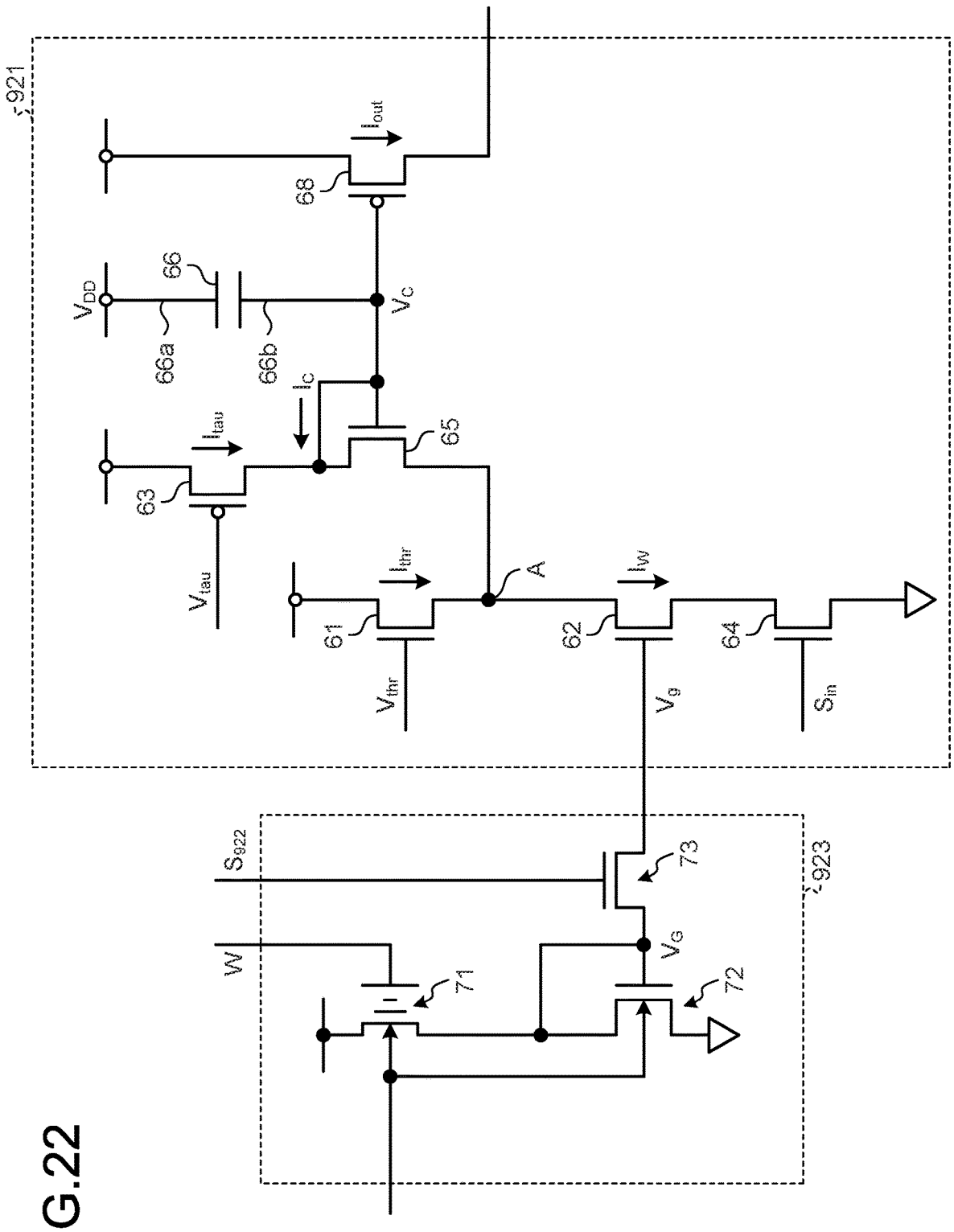
FIG. 22 is a circuit diagram illustrating a synaptic weight device and a synaptic transmission device.

FIG. 22 is a circuit diagram illustrating the synaptic weight device 923 and the synaptic transmission device 921. The synaptic weight device 923 uses the transistor 1 as a synaptic weight holding function. The synaptic transmission device 921 includes a weighting current element 62, an input switch 64, a capacitor 66, an output current element 68, a charge adjusting element 65, a first constant current element 63, and a second constant current element 61. The synaptic weight device 923 has a weight storage element 71, a switch 73, and a weighting Current setting element 72. In the weight storage element 71, the transistor 1 is used to store a synaptic weight W.

The weighting current element 62 flows a weighting current ($I_w$) of a current value according to the synaptic weight W corresponding to the resistance value held. by the weight storage element 71 of the synaptic weight device 923. For example, the weighting current element 62 flows a weighting current ($I_w$) proportional to the synaptic weight W. When the input switch 64 is in the ON state, the weighting current element 62 draws a weighting current ($I_w$) from a node A and flows the weighting current to the reference potential (e.g., the ground potential). When the input switch 64 is in the OFF state, the weighting current element 62 does not flow the weighting current ($I_w$) (the weighting current is set to 0).

In the present embodiment, the weighting current element 62 is a MOS-FET (Metal Oxide Semiconductor Field Effect Transistor). In the example of FIG. 22, the weighting current element 62 is an N-channel MOS-FET.

The weighting current element 62, which is a MOS-FET, has a gate to which a weighting voltage ($V_w$) is applied and a drain connected to the node A. The weighting current element 62, which is a MOS-FET, causes a weighting current ($I_w$) of a current amount corresponding to the weighting voltage ($V_w$) to flow between the drain and the source.

The input switch 64 switches whether to allow a weighting current ($I_w$) to flow to the weighting current element 62 according to a binary input signal (Sin) outputted from the neuron device 91-1 at the preceding stage. For example, if the input signal (Sin) is 1, the input switch 64 causes a weighting current ($I_w$) to flow. For example, if the input signal (Sin) is 0, the input switch 64 does not allow the weighting current ($I_w$)to flow (i.e., the weighting current ($I_w$) is set to 0).

In the present embodiment, the input switch 64 is a MOS-FET that performs a switching operation. In the example of FIG. 22, the input switch 64 is an N-channel MOS-FET. The input switch 64, which is a MOS-FET, has a gate to which the input signal (Sin) applied, a drain connected to a source of the weighting current element 62, and a source connected to the reference potential.

The input switch 64, which is a MOS-EFT, is turned on when the input signal (Sin) is 1, and causes the source of the weighting current element 62 to be connected to a ground, thereby causing the weighting current element 62 to flow the weighting current ($I_w$). The input switch 64, which is a MOS-FET, is turned off when the input signal (Sin) is 0, and causes the source of the weighting current element 62 to be cut off from the ground, thereby preventing the weighting current element 62 from flowing the weighting current ($I_w$).

The capacitor 66 has a first terminal 66a and a second terminal 66b. The first terminal 66a of the capacitor 66 is connected to a Tower supply potential (e.g., $V_{DD}$) at which a constant voltage is generated. In such a capacitor 66, a constant voltage is applied to the first terminal 66a. The capacitor 66 generates a capacitor voltage ($V_c$) at the second terminal 66b. The capacitor voltage ($V_c$) is a value obtained by subtracting the voltage generated by the capacitor 66 from the power supply potential. The voltage generated by the capacitor 66 is a voltage obtained by dividing the accumulated charge amount by the capacitance.

The output switch 68 supplies an output current ($I_{out}$) to the neuron device 91-2 at the rear stage according to a capacitor voltage ($V_c$) generated at the second terminal 66b of the capacitor 66.

The synaptic weight device 923 holds a synaptic weight W determined by the synaptic weight learning device 922 in the weight storage element 71. In the weight storage element 71, the transistor 1 is used to hold a synaptic weight W as a resistance value.

The operation method of the synaptic weight device 923 at the time of writing a resistance will be described. Since the transistor 1 applies a voltage of, for example, about 4 V as a substrate bias at the time of erasing (charging) (see FIG. 3B), the elements may be destroyed if the erasing (charging) is performed in this state.

Therefore, when the analog information corresponding to the learning result is erased (charged), the control signal $S_{922}$ and the synaptic weight W are first transmitted from the synaptic weight learning device 922 to the synaptic weight device 923. The control signal $S_{922}$ turns a non-active level when the weight storage element 71 updates the synaptic weight W, whereby the switch 73 is turned off. The control signal $S_{922}$ turns an active level when the weight storage element 71 does not update the synaptic weight W, whereby the switch 73 is turned on. Thus, the influence of the synaptic weight device 923 on the weighting current element 62 at the time of updating the synaptic weight W can be eliminated.

The substrate biases of the weight storage element 71 and the weighting current setting element 72 are then changed to specified voltages, and necessary values are written (discharged) or erased (charged) in the weight storage element 71.

After completion of writing or erasing, the substrate biases of the weight storage element 71 and the weighting current setting element 72 are changed again to the same value as the other substrate biases. The output of the synaptic weight device 923 can be supped to the gate of the weighting current element 62 of the synaptic transmission device 921.

If the threshold voltage of the switch. 73 is $V_{thre}$, a difference of $V_G + V_{thre} = Vg$ occurs between the gate voltage $V_G$ of the weighting current element 72 of the synaptic weight device 923 and the gate voltage Vg of the weighting current element 62 of the synaptic transmission device 921. Thus, the on-resistance value is set to the weight storage element 71 by the gate voltage $V_G$ in the range that satisfies $0<V_G<V_{DD}-V_{thre}$. The setting of the on-resistance value means that the weight storage element 71 can store and hold the synaptic weight W as continuous analog information using the transistor 1. Therefore, the synaptic weight device 923 using the weight storage element 71 operates in the weighting current $I_w$ in which the setting range of the synaptic weight W is determined by $V_{thre}<W<V_{DD}$.

As described above, in the sixth embodiment, the nonvolatile memory device 600 is configured as a neural network using the transistor 1. Thus, a neural network can be configured which stores and holds the synaptic weight W as continuous analog information in the transistor 1.

Seventh Embodiment

A nonvolatile memory device according to a seventh embodiment will then be described. In the following, the description will be focused on parts different from the first to sixth embodiments.

The seventh embodiment illustrates, as a configuration example of a nonvolatile memory device 700, a configuration of an arithmetic operation system for performing a nonlinear operation using the transistor 1 of the first embodiment.

Figure 23:
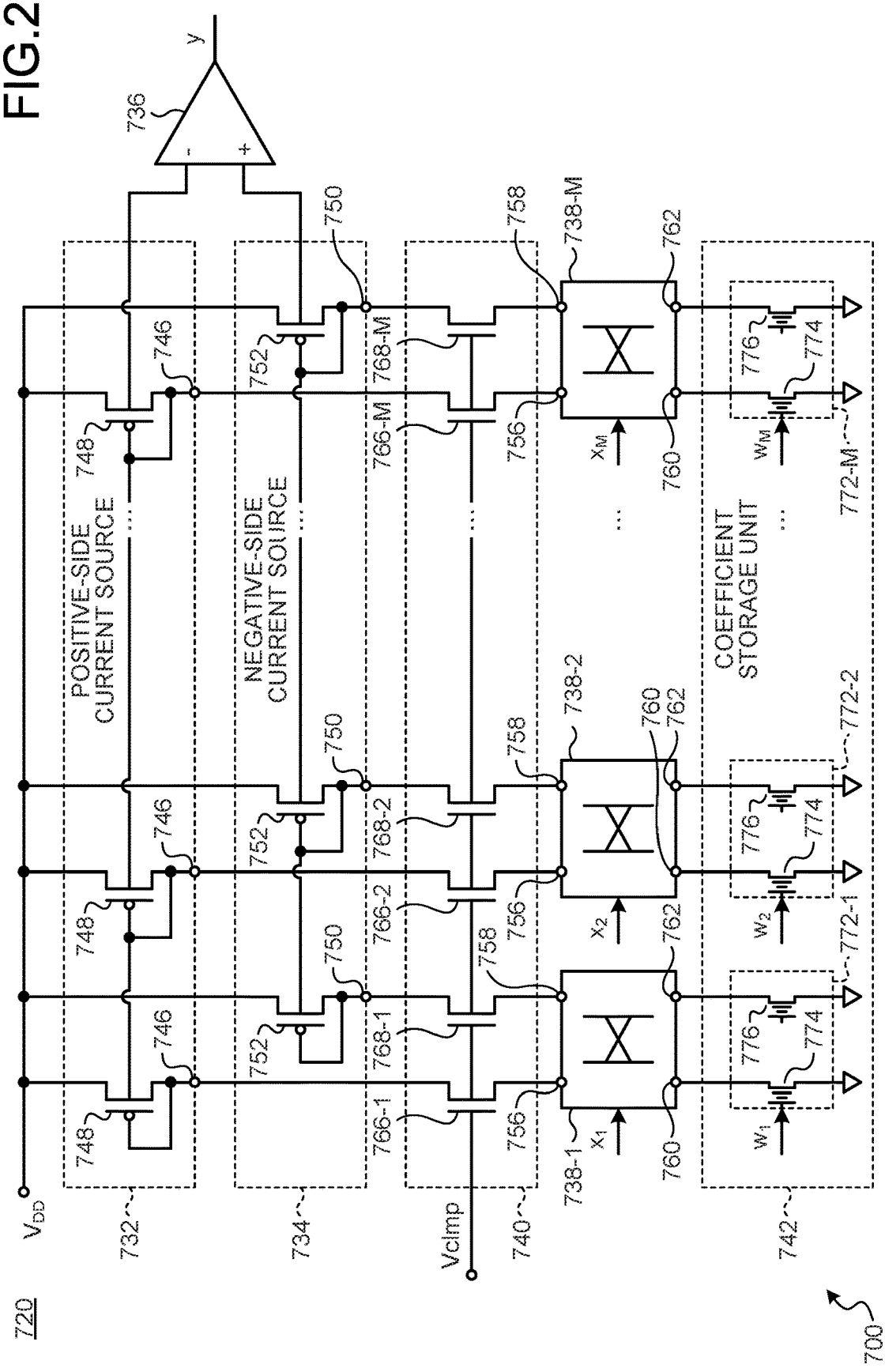
FIG. 23 is a circuit diagram illustrating a nonvolatile memory device according to a seventh embodiment.

The nonvolatile memory device 700 can be configured in hardware as an arithmetic operation system 720 as illustrated in FIG. 23. The arithmetic operation system 720 performs a nonlinear operation simulating a neuron in a simple configuration. The arithmetic operation system 720 includes a positive-side current source 732, a negative-side current source 734, a comparison unit 736, M cross switches 738, a clamp circuit 740, and a coefficient storage unit 742. The coefficient storage unit 742 includes the transistor 1 (see FIG. 1), and stores a coefficient in the transistor 1 as analog information.

The positive-side current source 732 has a positive-side terminal 746. The positive-side current source 732 outputs a current from the positive-side terminal 746. Further, the positive-side current source 732 outputs a first voltage corresponding to the value of 1/L (L is an integer of 2 or more) of the current outputted from the positive-side terminal 746. For example, the positive-side current source 732 outputs a first voltage proportional to the value of 1/L of the current outputted from the positive-side terminal 746. In the present embodiment, L=M. However, L need not be the same as M. Note that FIG. 23 illustrates a plurality of positive-side terminals 746. However, the plurality of positive side terminals 746 illustrated in FIG. 23 is electrically connected.

For example, the positive-side current source 732 has L first FETs 748. Each of the L first FETs 748 is a field effect transistor having the same characteristics. In the present embodiment, each of the L first FETs 748 is a pMOS transistor having the same characteristics.

The L first FETs 748 have gates connected in common, sources connected to second reference potentials, and drains connected to the gates and. the positive-side terminals 746. The second reference potential is, for example, a positive-side power supply voltage ($V_{DD}$). In other words, each of the L first FETs 748 is diode-connected, and has a source connected to the second reference potential (e.g., $V_{DD}$), and a gate and a drain connected to the positive-side terminal 746. The positive-side current source 732 then outputs the voltage of the positive-side terminal 746 (the voltage of the gate of the first FET 748) as the first voltage.

The negative-side current source 734 has a negative-side terminal 750. The negative-side current source 734 outputs a current from the negative-side terminal 750. Further, the negative-side current source 734 outputs a second voltage corresponding to the value of 1/L of the current outputted from the negative-side terminal 750. For example, the negative-side current source 734 outputs a second voltage proportional to the value of 1/L of the current outputted from the negative-side terminal 750. Note that FIG. 23 illustrates a plurality of negative-side terminals 750. However, the plurality of negative-side terminals 750 is electrically connected.

For example, the negative-side current source 734 has L second FETs 752. Each of the L second FETs 752 is a field effect transistor having the same characteristics as the first FET 748. In the present embodiment, each of the L second FETs 752 is a pMOS transistor having the same characteristics as the first FET 748.

The L second FETs 752 have gates connected in common, sources connected to the second reference potentials, and drains connected to the gates and the negative-side terminals 750. In other words, each of the L second FETs 752 is diode-connected, and has a source connected to the second reference potential (e.g., $V_{DD}$), and a gate and a drain connected to the negative-side terminal 750. The negative-side current source 734 then outputs the voltage of the negative-side terminal 750 (the voltage of the gate of the second FET 752) as the second voltage.

The comparison unit 736 compares the magnitude of the first voltage outputted from the positive-side current source 732 with the magnitude of the second voltage outputted from the negative-side current source 734. The comparison unit 736 then outputs an output signal (y) having a value corresponding to the comparison result between the first voltage and the second voltage. The comparison unit 736 outputs an output signal having a first value (e.g., −1) when the first voltage is smaller than the second voltage, and outputs an output signal having a second value (e.g., +1) when the first voltage is larger than or equal to the second voltage. Note that the comparison unit 736 may output an output signal having a second value (e.g., +1) when the first voltage is smaller than the second voltage, and may output an output signal having a first value (e.g., −1) when the first voltage is larger than or equal to the second voltage.

Each of the M cross switches 738 is provided. corresponding to each of M input signals. In the present embodiment, the arithmetic operation system 720 includes, as M cross switches 738, a first cross switch 738-1 to an M-th cross switch 738-M. For example, the first cross switch 738-1 corresponds to a first input signal (x1), the second cross switch 738-2 corresponds to a second input signal (x2), and the M-th cross switch 738-M corresponds to an M-th input signal (xM).

Each of the M cross switches 738 has a positive-side inflow terminal 756, a negative-side inflow terminal 758, a first terminal 760, and a second terminal 762.

Each of the M cross switches 738 connects the first terminal 760 to one of the positive-side inflow terminal 756 and the negative-side inflow terminal 758. Each of the M cross switches 738 connects the second terminal 762 to the other one of the positive-side in flow terminal 756 and the negative-side inflow terminal 758 to which the first terminal 760 is not connected. Each of the M cross switches 738 switches between connecting the first terminal 760 and the second terminal 762 to either the positive-side inflow terminal 756 or the negative-side inflow terminal 758 according to the value of the corresponding input signal.

The clamp circuit 740 has M positive-side FET switches 766 corresponding to each of the M cross switches 738. In the present embodiment, the clamp circuit 740 has, as M positive-side FET switches 766, a first positive-side FET switch 766-1 to an M-th positive-side FET switch 766-M. For example, the first positive-side FET switch 766-1 corresponds to the first cross switch 738-1, the second positive-side FET switch 766-2 corresponds to the second cross switch 738-2, and the M-th positive-side FET switch 766-M corresponds to the M-th cross switch 738-M.

Each of the M positive-side FET switches 766 has a gate connected to a clamp potential ($V_{clmp}$), a source connected to the positive-side terminal 746, and a drain connected to the positive-side inflow terminal 756 of the corresponding cross switch 738. Each of the M positive-side FET switches 766 is turned on between source and drain during the operation of the arithmetic operation system 720. Therefore, the positive-side inflow terminal 756 of each of the M cross switches 738 is connected to the positive-side terminal 746 of the positive-side current source 732 during the operation of the arithmetic operation system 720, whereby the voltage is fixed to the clamp potential ($V_{clmp}$).

Further, the clamp circuit 740 has M negative-side FET switches 768 corresponding to each of the M cross switches 738. In the present embodiment, the clamp circuit 740 has, as M negative-side FET switches 768, a first negative-side FET switch 768-1 to an M-th negative-side FET switch 768-M. For example, the first negative-side FET switch 768-1 corresponds to the first cross switch 738-1, the second negative-side FET switch 768-2 corresponds to the second cross switch 738-2, and the M-th negative-side FET switch 768-M corresponds to the M-th cross switch 738-M.

Each of the M negative-side FET switches 768 has a gate connected to the clamp potential ($V_{clmp}$), a source connected to the negative-side terminal 750, and a drain connected to the negative-side inflow terminal 758 of the corresponding cross switch 738. Each of the M negative-side FET switches 768 is turned on between source and drain. during the operation of the arithmetic operation system 720. Therefore, the negative-side inflow terminal 758 of each of the M cross switches 738 is connected to the negative-side terminal 750 of the negative-side current source 734 during the operation of the arithmetic operation system 720, whereby the voltage is fixed to the clamp potential ($V_{clmp}$).

The coefficient storage unit 742 has M cells 772 corresponding to each of M coefficients. In the present embodiment, the coefficient storage unit 742 has, as the M cells 772, a first cell 772-1 to an M-th cell 772-M. For example, the first cell 772-1 corresponds to a first coefficient ($w_1$), the second cell 772-2 corresponds to a second coefficient ($w_2$), and the M-th cell 772-M corresponds to an M-th coefficient ($w_M$). Note that the first coefficient ($w_1$) corresponds to the first input signal ($x_1$), the second coefficient ($w_2$) corresponds to the second input signal ($x_2$), and the M-th coefficient ($w_M$) corresponds to the M-th input signal ($x_M$). Therefore, for example, the first cell 772-1 corresponds to the first cross switch 738-1, the second cell 772-2 corresponds to the second cross switch 738-2, and the M-th cell 772-M corresponds to the M-th cross switch 738-M.

Each of the M cells 772 includes a first transistor 774 and a second transistor 776. The first transistor 774 has a drain connected to the first terminal 760 of the corresponding cross switch 738, and a source connected to a first reference potential. The first reference potential is, for example, ground. The second transistor 776 has a drain connected to the second terminal 762 of the corresponding cross switch 738, and a source connected to the first reference potential.

The transistor 1 (see FIG. 1) can be used for the first transistor 774 and the second transistor 776, respectively. The first transistor 774 and the second transistor 776 can each store a coefficient as continuous analog information.

In the first transistor 774 and the second transistor 776, the magnitude relationship of the resistance value is switched according to the value of the corresponding coefficient. For example, a setting unit (not illustrated) receives M coefficients prior to receiving M input signals. The setting unit then sets the magnitude relationship of the resistance values of the first transistor 774 and the second transistor 776 included in the corresponding cell 772 according to each of the M coefficients received.

For example, in each of the plurality of cells 772, if the corresponding coefficient is +1, the first transistor 774 is set to a first resistance value, and the second transistor 776 is set to a second resistance value different from the first resistance value. In each of the plurality of cells 772, if the corresponding coefficient is −1, the first transistor 774 is set to the second resistance value, and the second transistor 776 is set to the first resistance value.

Each of the M cross switches 738 then switches between a straight connection or a reverse connection of the first terminal 760 and the second terminal 762 to the positive-side terminal 746 (the positive-side inflow terminal 756) and the negative-side terminal 750 (the negative-side inflow terminal 758) according on the value of the corresponding input signal.

For example, in the case of straight connection, each of the M cross switches 738 connects the first terminal 760 and the positive-side terminal 746 (the positive-side inflow terminal 756), and connects the second terminal 762 and the negative-side terminal 750 (the negative-side inflow terminal 758). In the case of reverse connection, each of the M cross switches 738 connects the first terminal 760 and the negative-side terminal 750 (the negative-side inflow terminal 758), and connects the second terminal 762 and the positive-side terminal 746 (the positive-side inflow terminal 756).

For example, each of the M cross switches 738 is straight connected if the value of the corresponding input signal is +1, and is reverse connected if the value of the corresponding input signal is −1.

Alternatively, each of the M cross switches 738 may he reverse connected if the value of the corresponding input signal is +1 and straight connected if the value of the corresponding input signal is −1.

As described above, in the seventh embodiment, the nonvolatile memory device 700 is configured as an arithmetic operation system that performs a nonlinear operation simulating a neuron using the transistor 1 of the first embodiment. Thus, an arithmetic operation system can be constituted which is capable of storing coefficients as continuous analog information with high accuracy.

Eighth Embodiment

A nonvolatile memory device according to an eighth embodiment will then be described. In the following, the description will be focused on parts different from the first to seventh embodiments.

In the eighth embodiment illustrates, as a nonvolatile memory device 800, a configuration of an arithmetic operation system for performing a product-sum operation using the transistor 1 of the first embodiment.

The nonvolatile memory device 800 can be configured in hardware as an arithmetic operation system 820 as illustrated in FIG. 24. The arithmetic operation system 820 calculates a plurality of neurons of a certain layer in a neural network in parallel by a product-sum operation. The arithmetic operation system 820 realizes the configuration of the product-sum operation by a crossbar array configuration of the plurality of transistors 1 (see FIG. 1). In the arithmetic operation system 820, operations other than the product-sum operation can be performed by a digital circuit.

The arithmetic operation system 820 has a plurality of DA converters (DAG) 821-0 to 821-4, a crossbar array configuration 822, and a plurality of AD converters (ADC) 823-0 to 823-4. The crossbar array configuration 822 has a plurality of word lines WL0 to WL4, a plurality of bit lines BL0 to BL4, a plurality of source lines SL0 to SL4, and a plurality of transistors 801 (0, 0) to 801 (4, 4). Each of the word lines WL0 to WL4 extends in the row direction and is arranged in the column direction. Each of the lines BL0 to BL4 extends in the column direction and is arranged in the row direction. Each of the source lines SL0 to SL4 is disposed on the side opposite to the corresponding bit line BL with the transistor 801 therebetween, extends in the column direction, and is arranged in the row direction. The transistor 1 (see FIG. 1) is used for each of the transistors 801. Each of the transistors 801 (0, 0) to 801 (4, 4) corresponds to the plurality of word lines WL0 to WL4, the plurality of bit lines BL0 to BL4, and the plurality of source lines SL0 to SL4, respectively.

In the crossbar array configuration 822, the plurality of transistors 801 (0, 0) to 801 (4, 4) is disposed. at a position where the plurality of word lines WL0 to WL4 and the plurality of bit lines BL0 to BL4 intersect. Each of the transistors 801 has a source electrode connected. to a corresponding source line SL, a gate electrode connected too a corresponding word line WL, and a drain electrode connected to a corresponding bit line BL. Each of the transistors 801 (0, 0) to 801 (4, 4) functions as a multiplication element that multiplies a received signal by weights $W_{0,0}$ to $W_{4,4}$ to generate a signal of the multiplication result. For each transistor 801 (0, 0) to 801 (4, 4), the state of charge of the battery structure included in the gate electrode can be set to a state of charge corresponding to the weights $W_{0,0}$ to $W_{4,4}$, and the on-resistance value can be set to a value corresponding to the state of charge. Each of the bit lines BL0 to BL4 functions as an addition element that adds signals of the plurality of transistors 801 arranged in the column direction.

The plurality of DA converters 821-0 to 821-4 DA-converts a plurality of digital values $D_0$ to $D_4$ to generate a plurality of word line voltages $X_0$ to $X_4$, and supplies the plurality of word line voltages $X_0$ to $X_4$ to the plurality of word lines WL0 to WL4. The plurality of word line voltages $X_0$ to $X_4$ is applied in parallel to the plurality of transistors 801 (0, 0) to 801 (4, 4). The plurality of word line voltages $X_0$ to $X_4$ is multiplied by the plurality of weights $W_{0,0}$ to $W_{4,4}$ and summed for each column to generate a plurality of bit line currents $Y_0$ to $Y_4$. The plurality of AD converters 823-0 to 823-4 AD-converts a plurality of bit line voltages corresponding to the plurality of hit line currents $Y_0$ to $Y_4$ to generate a plurality of digital values $D_0'$ to $D_4'$, and outputs the plurality of digital values.

In the plurality of transistors 801 (0, 0) to 801 (4, 4) , a predetermined bias voltage is previously applied to the gate electrode and the well region according to the values of the weights $W_{0,0}$ to $W_{4,4}$. Thus, the state of charge of the battery structure included in the gate electrode can be set to a state of charge corresponding to the weights $W_{0,0}$ to $W_{4,4}$, and the on-resistance value can be set to a value corresponding to the state of charge. The weights $W_{0,0}$ to $W_{4,4}$ can be set as continuous analog information by depending on the state of charge of the battery structure preset for the transistors 801 (0,0) to 801 (4,4). In other words, the arithmetic operation system 820 can be configured as a product-sum operation system capable of learning the values of the weights $W_{0,0}$ to $W_{4,4}$ with high accuracy.

As described above, in the eighth embodiment, the nonvolatile memory device 800 is configured as an arithmetic operation system for performing a product-sum operation using the transistor 1 of the first embodiment. Thus, a product-sum operation system can be constituted which is capable of learning weight values as continuous analog information with high accuracy.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes is the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile memory device comprising:
   a plurality of transistors, each of the plurality of transistors being of a field effect type and having a gate electrode and a channel region,
   wherein the gate electrode includes:
      a tunnel insulating film covering the channel region, the tunnel insulating film being configured to enable tunneling of electrons;
      a first current collector film disposed on a side opposite to the channel region with respect to the tunnel insulating film;
      an ion conductor film disposed between the tunnel insulating film and the first current collector film;
      a first electrode film disposed between the tunnel insulating film and the ion conductor film, the first electrode film being in contact with the ion conductor film;
      a second electrode film disposed between the ion conductor film and the first current collector film, the second electrode film being in contact with the ion conductor film; and
      a second current collector film disposed between the tunnel insulating film and the first electrode film, the second current collector film being
   configured to enable transferring of electrons, and
   wherein the gate electrode is chargeable or dischargeable with using the tunneling of electrons by the tunnel insulating film and the transferring of electrons by the second current collector film.

2. The nonvolatile memory device according to claim 1, wherein
   the first electrode film functions as a positive electrode to the ion conductor film, and
   the second electrode film functions as a negative electrode to the ion conductor film.

3. The nonvolatile memory device according to claim 1, wherein
   the first electrode film functions as a negative electrode to the ion conductor film, and
   the second electrode film functions as a positive electrode to the ion conductor film.

4. The nonvolatile memory device according to claim 1, wherein the first electrode film is thinner than the ion conductor film, and the second electrode film is thinner than the ion conductor film.

5. The nonvolatile memory device according to claim 1, wherein the first electrode film and the second electrode film each comprise at least one of an electron-ion mixed conductor, an alkali metal, and an alkaline earth metal.

6. The nonvolatile memory device according to claim 1, wherein the first electrode film, the ion conductor film, and the second electrode film constitute a secondary battery.

7. The nonvolatile memory device according to claim 6, wherein the secondary battery is a lithium battery or a magnesium battery.

8. The nonvolatile memory device according to claim 6, wherein
the nonvolatile memory device stores analog information in the transistor as an electromotive force of the secondary battery.

9. The nonvolatile memory device according to claim 8, wherein
the nonvolatile memory device accumulates charges in the second electrode film from the channel region through the tunnel insulating film, and stores the analog information in the transistor.

10. The nonvolatile memory device according to claim 9, wherein
the transistor further has a source electrode and a drain electrode adjacent to both sides of the channel region along the tunnel insulating film, and
the nonvolatile memory device observes a drain current flowing between the drain electrode and the source electrode and reads the analog information from the transistor.

11. The nonvolatile memory device according to claim 1, wherein the tunnel insulating film has a thickness that enables tunneling of electrons through the tunnel insulating film.

12. The nonvolatile memory device according to claim 1, wherein the tunnel insulating film has a thickness of 8 nm.

13. A nonvolatile memory device, comprising:
a plurality of transistors, each of the plurality of transistors being of a field effect type and having a gate electrode and a channel region, wherein
the gate electrode includes:
a tunnel insulating film covering the channel region;
a first current collector film disposed on a side opposite to the channel region with respect to the tunnel insulating film;
an ion conductor film disposed between the tunnel insulating film and the first current collector film;
a first electrode film disposed between the tunnel insulating film and the ion conductor film, the first electrode film being in contact with the ion conductor film;
a second electrode film disposed between the ion conductor film and the first current collector film, the second electrode film being in contact with the ion conductor film;
a second current collector film disposed between the tunnel insulating film and the first electrode film;
a second ion conductor film disposed between the second current collector film and the tunnel insulating film;
a third electrode film disposed between the second current collector-electrode film and the second ion conductor film, the third electrode film being in contact with the second ion conductor film; and
a fourth electrode film disposed between the second ion conductor film and the tunnel insulating film, the fourth electrode film being in contact with the second ion conductor film.

14. A nonvolatile memory device comprising:
a plurality of transistors, each of the plurality of transistors being of a field effect type and having a gate electrode and a channel region,
wherein the gate electrode includes:
a tunnel insulating film covering the channel region, the tunnel insulating film being configured to enable tunneling of electrons;
a first current collector film disposed on a side opposite to the channel region with respect to the tunnel insulating film;
an ion conductor film disposed between the tunnel insulating film and the first current collector film;
a first electrode film disposed between the tunnel insulating film and the ion conductor film, the first electrode film being in contact with the ion conductor film;
a second electrode film disposed between the ion conductor film and the first current collector film, the second electrode film being in contact with the ion conductor film; and
a second current collector film disposed between the tunnel insulating film and the first electrode film, the second current collector film being configured to enable transferring of electrons,
wherein:
the first electrode film, the ion conductor film, and the second electrode film constitute a secondary battery,
the nonvolatile memory device stores analog information in the transistor as an electromotive force of the secondary battery,
the gate electrode of the transistor is chargeable or dischargeable with using the tunneling of electrons by the tunnel insulating film and the transferring of electrons by the second current collector film, and stores the electromotive force in accordance with electrons in the second electrode film,
the transistor further has a source electrode and a drain electrode adjacent to both sides of the channel region along the tunnel insulating film, and
the nonvolatile memory device observes a drain current flowing between the drain electrode and the source electrode and reads the analog information from the transistor; and
a diode disposed on a side opposite to the gate electrode with respect to the channel region of the transistor.

15. A nonvolatile memory device comprising:
a plurality of transistors, each of the plurality of transistors being of a field effect type and having a gate electrode and a channel region,
wherein the gate electrode includes:
a tunnel insulating film covering the channel region, the tunnel insulating film being configured to enable tunneling of electrons;
a current collector film disposed on a side opposite to the channel region with respect to the tunnel insulating film;
an ion conductor film disposed between the tunnel insulating film and the current collector film;

a first electrode film disposed between the tunnel insulating film and the ion conductor film, the first electrode film being in contact with the ion conductor film; and a second electrode film disposed between the ion conductor film and the current collector film, the second electrode film being in contact with the ion conductor film, and wherein the gate electrode is chargeable or dischargeable with using the tunneling of electrons by the tunnel insulating film.

16. The nonvolatile memory device according to claim 15, wherein the tunnel insulating film has a thickness that enables tunneling of electrons through the tunnel insulating film.

17. The nonvolatile memory device according to claim 15, wherein the tunnel insulating film has a thickness of 8 nm.

\* \* \* \* \*

UNITED STATES PATENT AND TRADEMARK OFFICE
CERTIFICATE OF CORRECTION

PATENT NO. : 11,777,006 B2
APPLICATION NO. : 17/446441
DATED : October 3, 2023
INVENTOR(S) : Koichi Mizushima et al.

It is certified that error appears in the above-identified patent and that said Letters Patent is hereby corrected as shown below:

On the Title Page

Item (57), Line 3 of ABSTRACT, "A first current collector file" should read --A first current collector film--.

In the Claims

Claim 13, Column 33, Lines 66-67, "a third electrode film disposed between the second current collector-electrode film" should read --a third electrode film disposed between the second current collector film--.

Signed and Sealed this
Thirtieth Day of April, 2024

Katherine Kelly Vidal
*Director of the United States Patent and Trademark Office*